US008987106B2

(12) United States Patent
Shima

(10) Patent No.: US 8,987,106 B2
(45) Date of Patent: Mar. 24, 2015

(54) SEMICONDUCTOR DEVICE MANUFACTURING METHOD

(75) Inventor: Masashi Shima, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 1022 days.

(21) Appl. No.: 13/044,875

(22) Filed: Mar. 10, 2011

(65) Prior Publication Data

US 2011/0233687 A1 Sep. 29, 2011

(30) Foreign Application Priority Data

Mar. 23, 2010 (JP) ................................ 2010-066443

(51) Int. Cl.
*H01L 29/78* (2006.01)
*H01L 21/336* (2006.01)
*H01L 27/092* (2006.01)
(Continued)

(52) U.S. Cl.
CPC .... *H01L 27/0922* (2013.01); *H01L 21/823412* (2013.01); *H01L 21/823418* (2013.01); *H01L 21/823456* (2013.01); *H01L 21/823493* (2013.01); *H01L 21/823807* (2013.01); *H01L 21/823814* (2013.01); *H01L 21/82385* (2013.01); *H01L 21/823892* (2013.01)
USPC ........................... 438/306; 438/586; 438/621

(58) Field of Classification Search
CPC .................... H01L 29/7835; H01L 29/66659; H01L 29/1083; H01L 29/7833; H01L 21/823892
USPC ......... 438/299–306, 586–598, 621, 637, 674, 438/E29
See application file for complete search history.

(56) References Cited

U.S. PATENT DOCUMENTS 5,451,807 A 9/1995 Fujita
6,492,234 B1 * 12/2002 Moroni et al. ................ 438/305
6,800,901 B2 * 10/2004 Moroni et al. ................ 438/305
(Continued)

FOREIGN PATENT DOCUMENTS

JP 6-310717 A 11/1994
JP 2002-270825 A 9/2002
(Continued)

OTHER PUBLICATIONS

Japanese Office Action dated Jan. 21, 2014, issued in corresponding Japanese Patent Application No. 2010-066443, w/English translation, (8 pages).

*Primary Examiner* — Cuong Q Nguyen
(74) *Attorney, Agent, or Firm* — Westerman, Hattori, Daniels & Adrian, LLP

(57) ABSTRACT

A semiconductor device manufacturing method includes forming a channel dope layer having a first electric conductive-type inside of a semiconductor substrate, the channel dope layer being formed in a region except for a drain impurity region where dopant impurities for forming a low-concentration drain region are introduced, and the channel dope layer being separated from the drain impurity region; forming a gate electrode on the semiconductor substrate via a gate insulating film; and forming a low-concentration source region inside of the semiconductor substrate on a first side of the gate electrode, and forming a low-concentration drain region in the drain impurity region of the semiconductor substrate on a second side of the gate electrode, by introducing second electric conductive dopant impurities inside of the semiconductor substrate with the gate electrode as a mask.

7 Claims, 57 Drawing Sheets

(51) Int. Cl.
*H01L 21/8234* (2006.01)
*H01L 21/8238* (2006.01)

(56) References Cited

U.S. PATENT DOCUMENTS

2002/0125510 A1 9/2002 Ohyanagi et al.
2007/0212838 A1 9/2007 Ivanov et al.

FOREIGN PATENT DOCUMENTS

| | | | |
|---|---|---|---|
| JP | 2009-124085 | A | 6/2009 |
| JP | 2009-245998 | A | 10/2009 |
| JP | 2009-272407 | A | 11/2009 |
| WO | 2008/118271 | A1 | 10/2008 |

* cited by examiner

SEMICONDUCTOR DEVICE MANUFACTURING METHOD

CROSS-REFERENCE TO RELATED APPLICATIONS

This application is based upon and claims the benefit of priority of the prior Japanese Patent Application No. 2010-066443, filed on Mar. 23, 2010 the entire contents of which are incorporated herein by reference.

FIELD

The present invention relates to a semiconductor device and a manufacturing method thereof.

BACKGROUND

Recently, there has been demand for further integration and reduction in size and cost of cellular phones, terminal devices for wireless communication or the like, and so forth.

In accordance with this, semiconductor devices in which a core portion, an input/output circuit, a power amplifier circuit, and so forth are mounted on the same semiconductor substrate have been brought to attention.

A transistor of the core portion or input/output circuit portion may be formed by a common CMOS process.

On the other hand, voltage which is triple that of gate bias voltage or so may be applied to a transistor used for the final stage of a power amplifier circuit, or the like. Therefore, it is desirable for a transistor used for the final stage of the power amplifier circuit, or the like to have secured sufficient withstand voltage.

However, there has been a problem wherein, in the event that transistors having markedly different withstand voltage are to be mounted on the same substrate, this causes increase in number of processes.

Related art is disclosed in Japanese Laid-open Patent Publication No. hei6-310717, Japanese Laid-open Patent Publication No. 2002-270825, US Laid-open Patent Publication No. 2007/0212838, and so on.

SUMMARY

According to one aspect of the invention, a semiconductor device manufacturing method includes forming a channel dope layer having a first electric conductive-type inside of a semiconductor substrate, the channel dope layer being formed in a region except for a drain impurity region where dopant impurities for forming a low-concentration drain region are introduced, and the channel dope layer being separated from the drain impurity region; forming a gate electrode on the semiconductor substrate via a gate insulating film; and forming a low-concentration source region inside of the semiconductor substrate on a first side of the gate electrode, and forming a low-concentration drain region in the drain impurity region of the semiconductor substrate on a second side of the gate electrode, by introducing second electric conductive dopant impurities inside of the semiconductor substrate with the gate electrode as a mask.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 3A to 16B are process cross-sectional views illustrating a manufacturing method of the semiconductor device according to the first embodiment.

DETAILED DESCRIPTION OF THE EMBODIMENTS

A semiconductor device manufacturing method according to a reference example will be described with reference to FIGS. 44A to 57B. FIGS. 44A to 57B are process cross-sectional views illustrating the semiconductor device manufacturing method according to a reference example. Of FIGS. 44A to 57B, the left-hand sides of drawings of A (FIG. 44A, FIG. 45A, FIG. 46A, and so on) illustrate a region (core transistor formation region) 202 where the transistor of a core portion is formed. Of FIGS. 44A to 57B, the space right-hand sides of the drawings of A illustrate a region (input/output transistor formation region) 204 where the transistor of an input/output circuit is formed. Of FIGS. 44A to 57B, the drawings of B (FIG. 44B, FIG. 45B, FIG. 46B, and so on) illustrate a region (power amplifier circuit formation region) 206 where a power amplifier circuit is formed. Of FIGS. 44A to 57B, the space left-hand sides of the drawings of B illustrate a region (previous stage transistor formation region) 206A where a transistor of the previous stage of the power amplifier circuit (previous stage transistor) is formed. Of FIGS. 44A to 57B, the space right-hand sides of the drawings of B illustrate a region (high withstand voltage transistor formation region) 206B where a high withstand voltage transistor, used for the final stage of the power amplifier circuit, is formed.

Figure 44A:
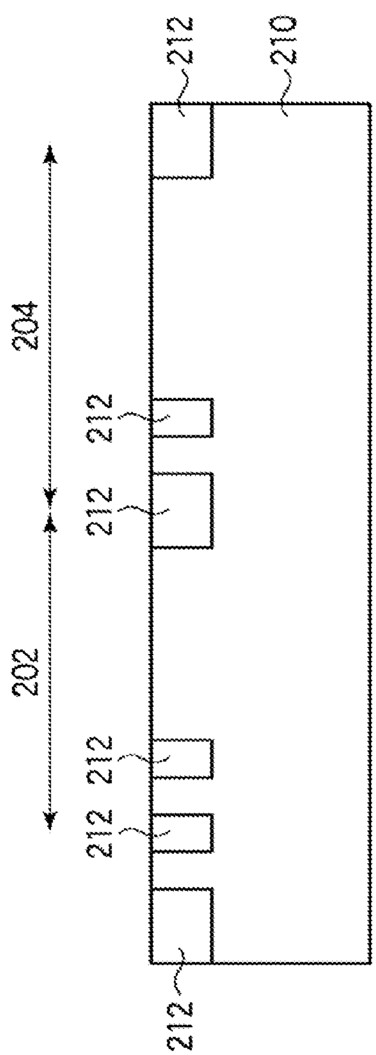
FIGS. 44A to 57B are process cross-sectional views illustrating a manufacturing method of the semiconductor device according to a reference example.
Figure 44B:
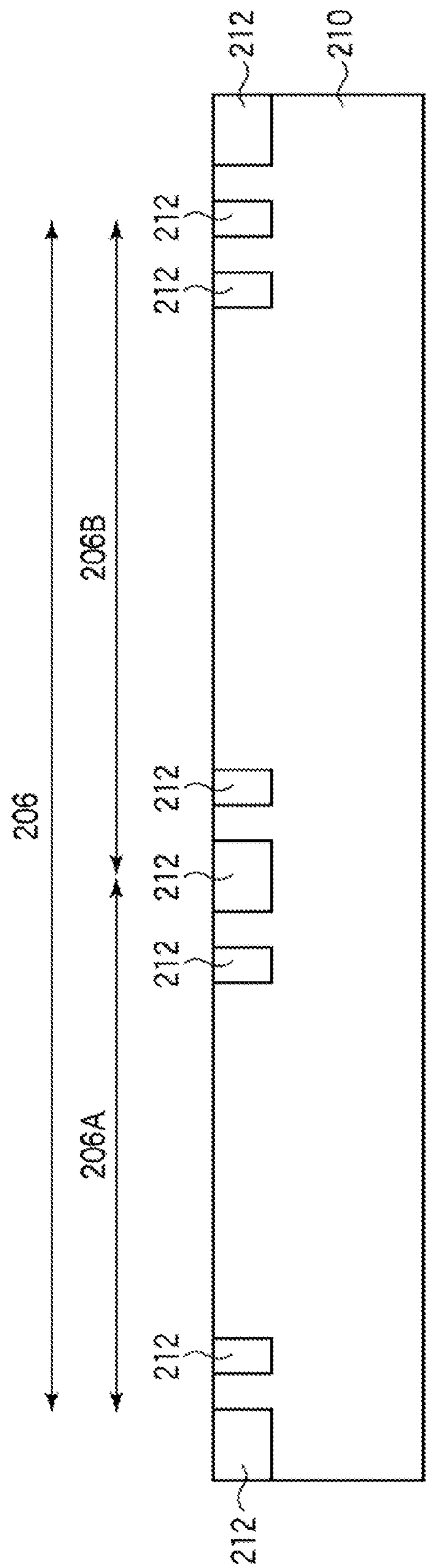

First, as illustrated in FIGS. 44A and 44B, a chip separation region 212 for determining a chip region is formed, for example, by the STI (Shallow Trench Isolation) method.

Figure 45A:
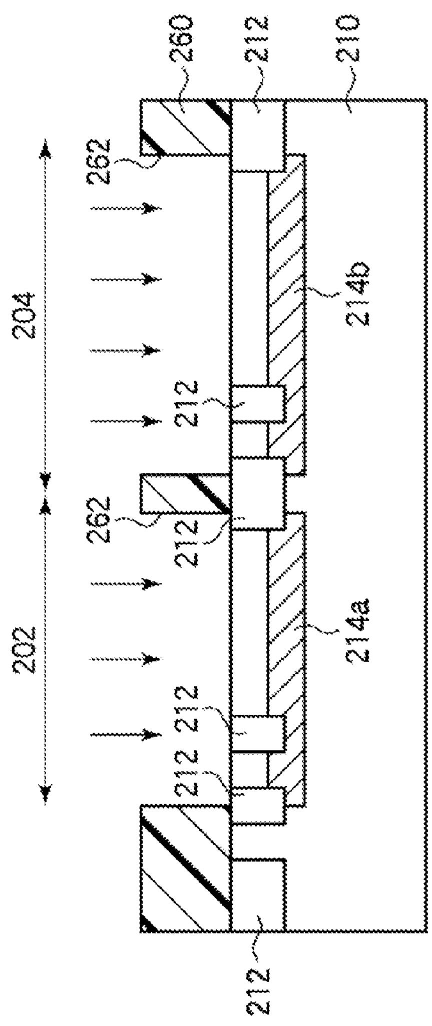
Figure 45B:
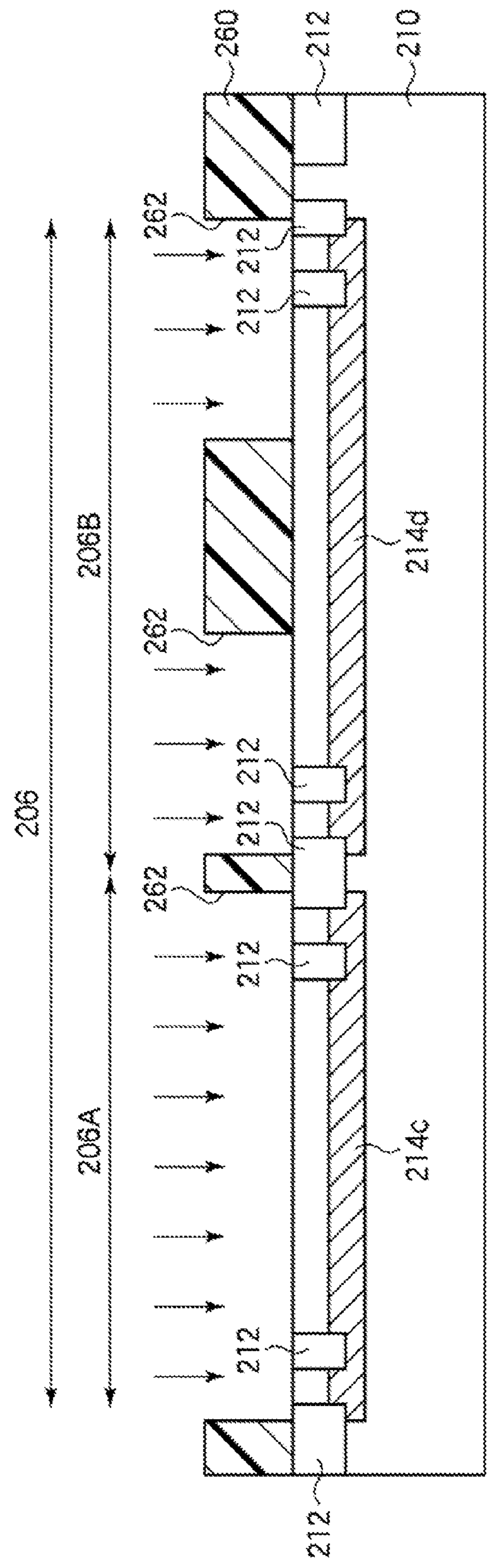

Next, as illustrated in FIGS. 45A and 45B, P-type dopant impurities are introduced into a semiconductor substrate 210 by the ion-implantation technique with a photoresist film 260 where an opening portion 262 is formed, as a mask, thereby forming P-type wells 214*a* to 214*d*. Subsequently, the photoresist film 260 is peeled off by ashing.

Figure 46A:
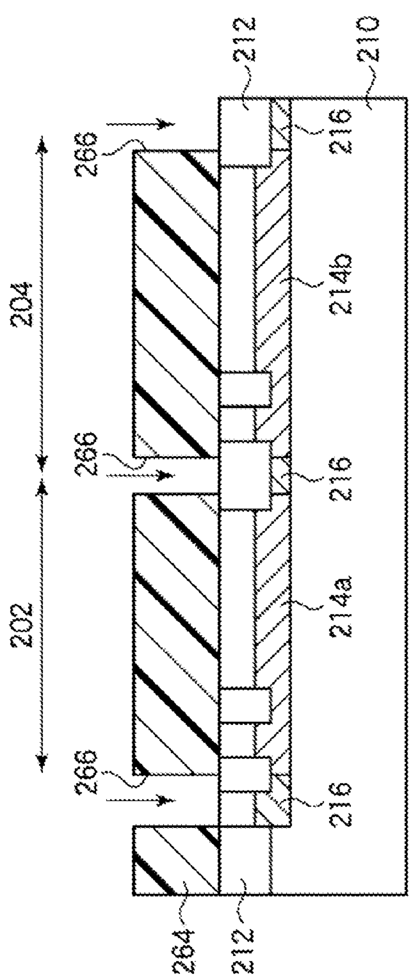
Figure 46B:
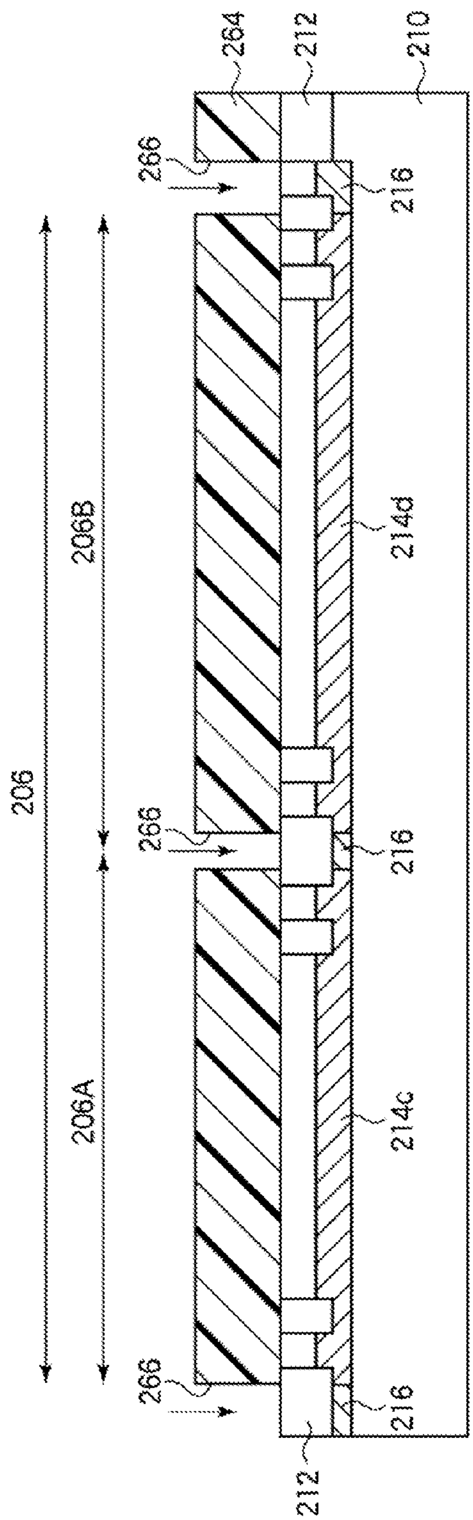

Next, as illustrated in FIGS. 46A and 46B, N-type dopant impurities are introduced into the semiconductor substrate 210 by the ion-implantation technique with a photoresist film 264 where an opening portion 266 is formed, as a mask, thereby forming an N-type diffusion layer 216. Thus, the N-type diffusion layer 216 is formed so as to surround the side portions of the P-type wells 214*a* to 214*d*. Subsequently, the photoresist film 264 is peeled off by ashing.

Figure 47A:
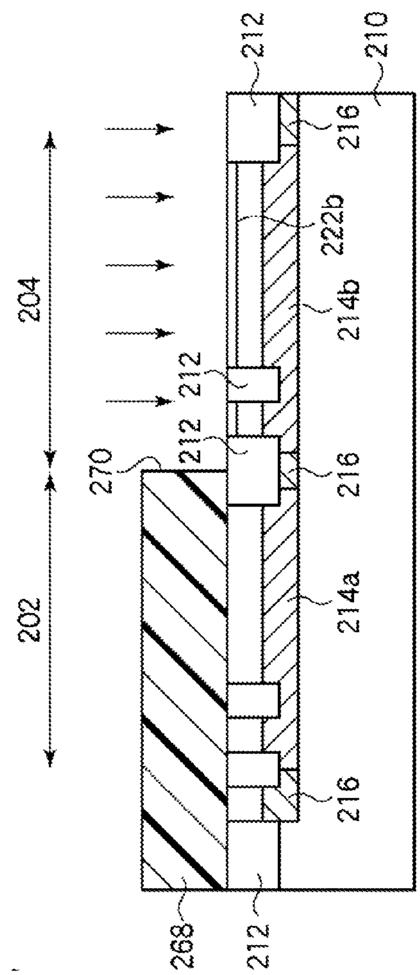
Figure 47B:
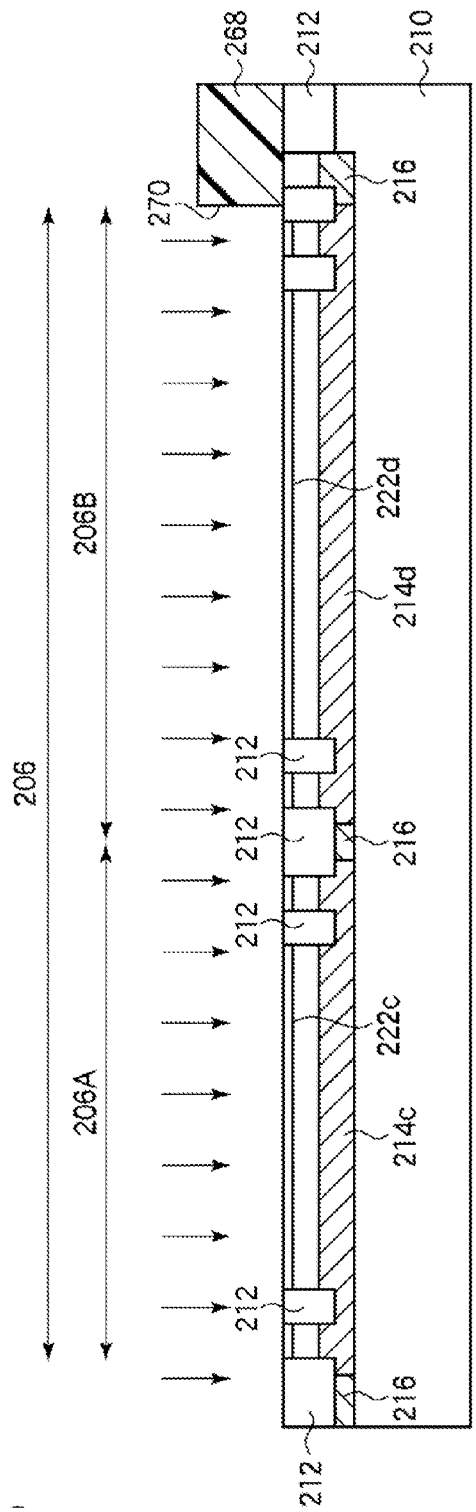

Next, as illustrated in FIGS. 47A and 47B, P-type dopant impurities are introduced into the semiconductor substrate 210 by the ion-implantation technique with a photoresist film 268 where an opening portion 270 is formed, as a mask, thereby forming channel dope layers 222*b* to 222*d*. Subsequently, the photoresist film 268 is peeled off by ashing.

Figure 48A:
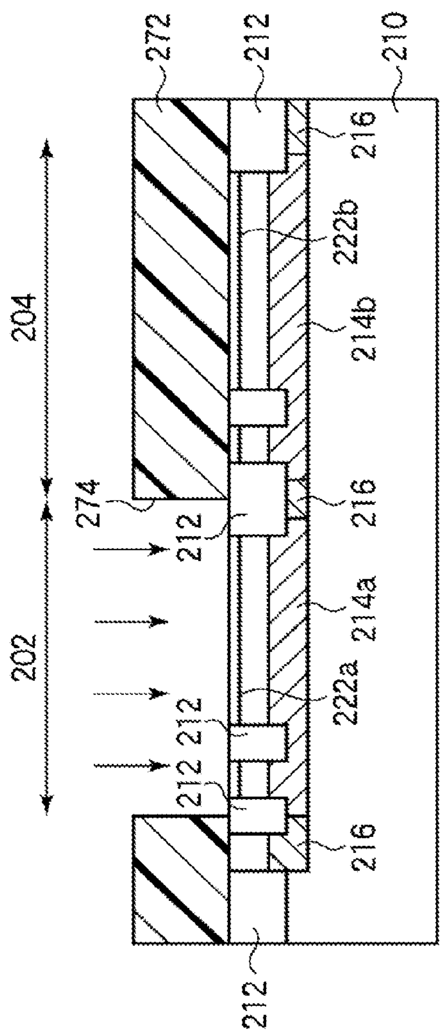
Figure 48B:
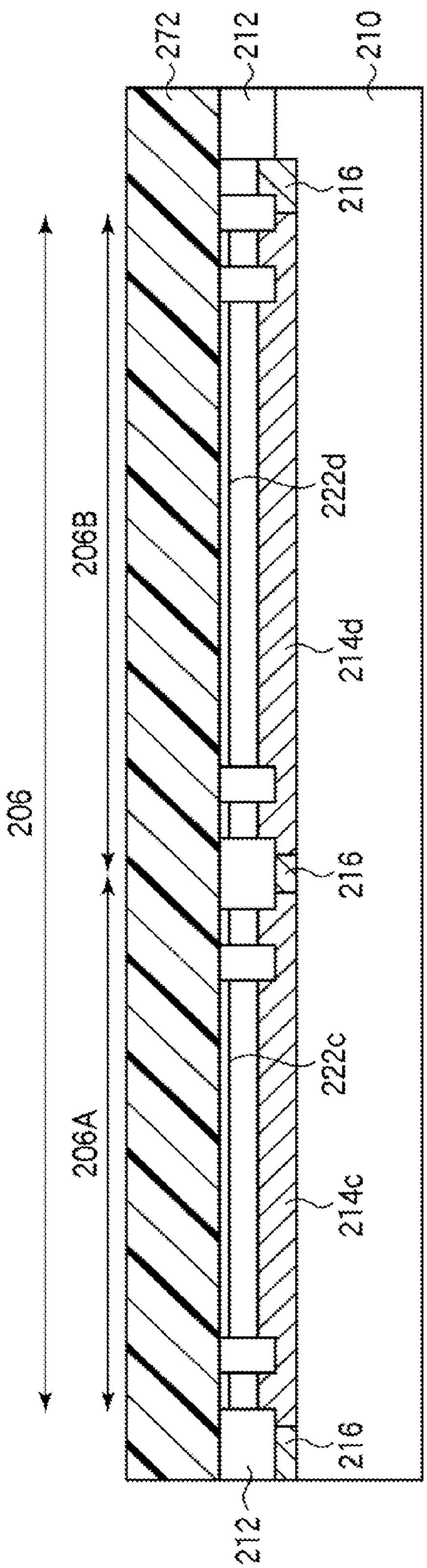

Next, as illustrated in FIGS. 48A and 48B, P-type dopant impurities are introduced into the semiconductor substrate 210 by the ion-implantation technique with a photoresist film 272 where an opening portion 274 is formed, as a mask, thereby forming a channel dope layers 222*a*. Subsequently, the photoresist film 272 is peeled off by ashing.

Next, a photoresist film 273 is formed on the entire surface, for example, by the spin coat method.

Next, the photoresist film 273 is subjected to patterning using the photolithographic technique. Thus, an opening portion 275 for forming a low-concentration drain region 229 of a high-withstand-voltage transistor 240*d* is formed on the photoresist film 273 (see FIGS. 49A and 49B).

Next, N-type dopant impurities are introduced into the semiconductor device 210 with the photoresist film 273 as a mask, for example, by the ion-implantation technique, thereby forming the N-type low-concentration drain region 229. When forming the low-concentration drain region 229, the low-concentration drain region 229 is formed so as to secure a sufficiently greater distance between the edge portion of the low-concentration drain region 229 and the edge portion of a high-concentration drain region 232*h* (see FIGS. 55A and 55B). The reason why the distance between the edge portion of the low-concentration drain region 229 and the edge portion of the high-concentration drain region 232*h* is set sufficiently greater is to moderate the impurity profile on the drain side of the high-withstand-voltage transistor 240, and to moderate concentration of electric fields at the time of high voltage being applied, and consequently to improve the withstand voltage.

Figure 50A:
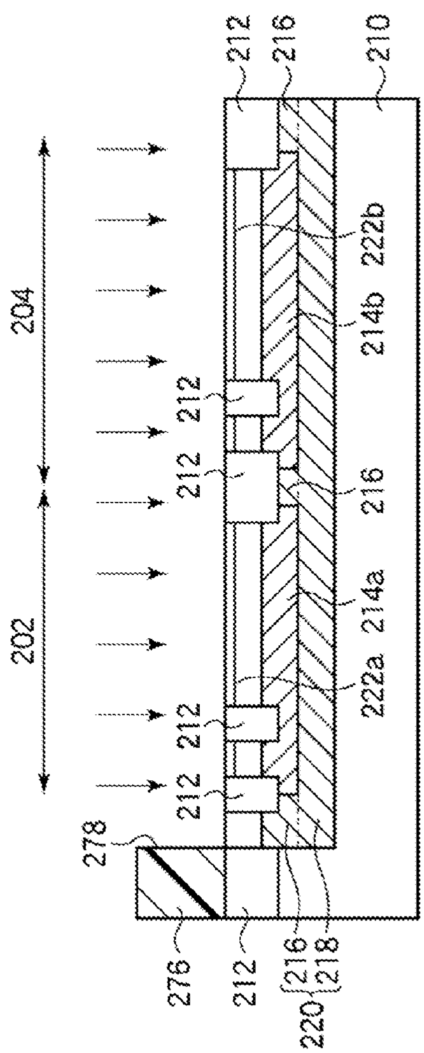
Figure 50B:
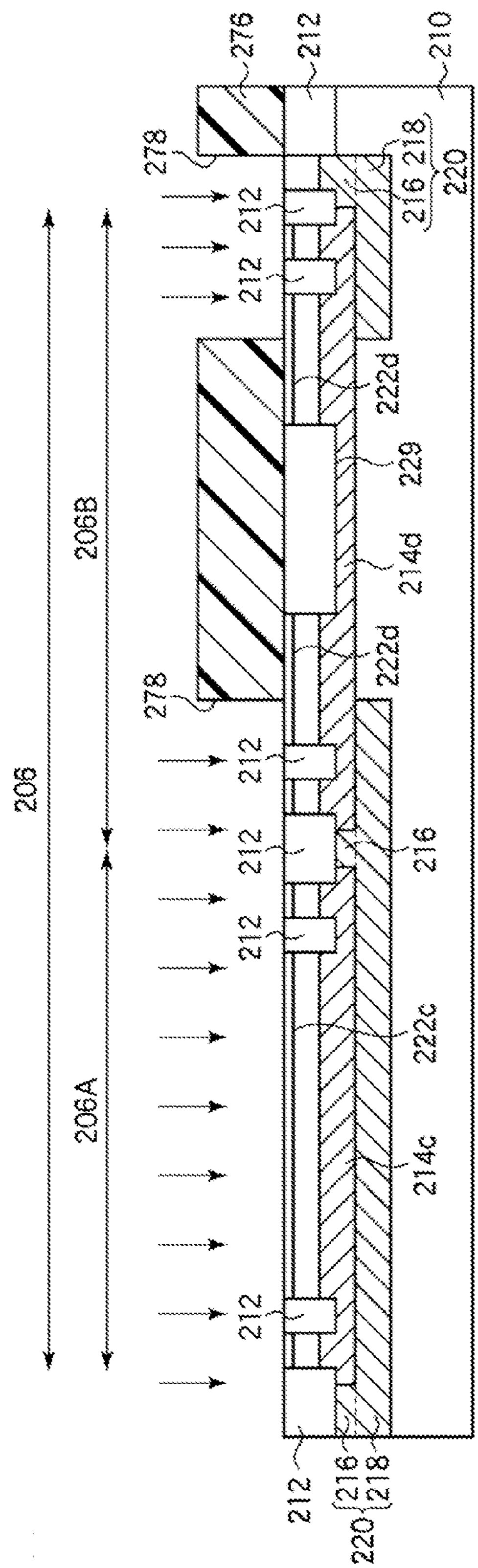

Next, as illustrated in FIGS. 50A and 50B, N-type dopant impurities are introduced into the semiconductor substrate 210 by the ion-implantation technique with a photoresist film 276 where an opening portion 278 is formed, as a mask, thereby forming an N-type embedded diffusion layer 218. The N-type embedded diffusion layer 218 and the N-type diffusion layer 216 are mutually connected. An N-type well 220 is formed by the N-type diffusion layer 216 and the N-type embedded diffusion layer 218. With the high-withstand-voltage transistor formation region 206B, the N-type embedded diffusion layer 218 is formed so that the edge portion of the low-concentration drain region 229 side of the N-type embedded diffusion layer 218 is sufficiently separated from the edge portion of the low-concentration drain region 229. Subsequently, the photoresist film 276 is peeled off by ashing. The reason why the low-concentration drain region 229 and the embedded diffusion layer 218 are sufficiently separated is to prevent the low-concentration drain region 229 and the embedded diffusion layer 218 from being electrically connected.

Next, annealing for activating the dopant impurities introduced into the semiconductor substrate 210 is performed.

Next, a gate insulating film 224 is formed on the surface of the semiconductor substrate 210 by the thermal oxidation method.

Next, a polysilicon film is formed by the CVD (Chemical Vapor Deposition) method.

Figure 51A:
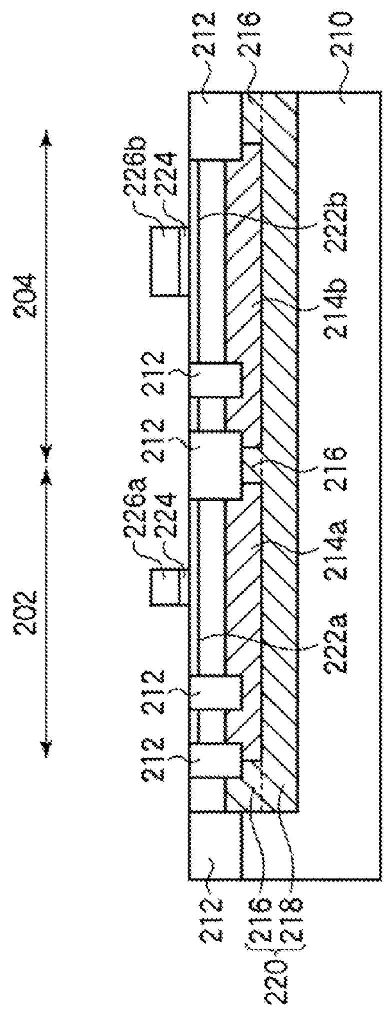
Figure 51B:
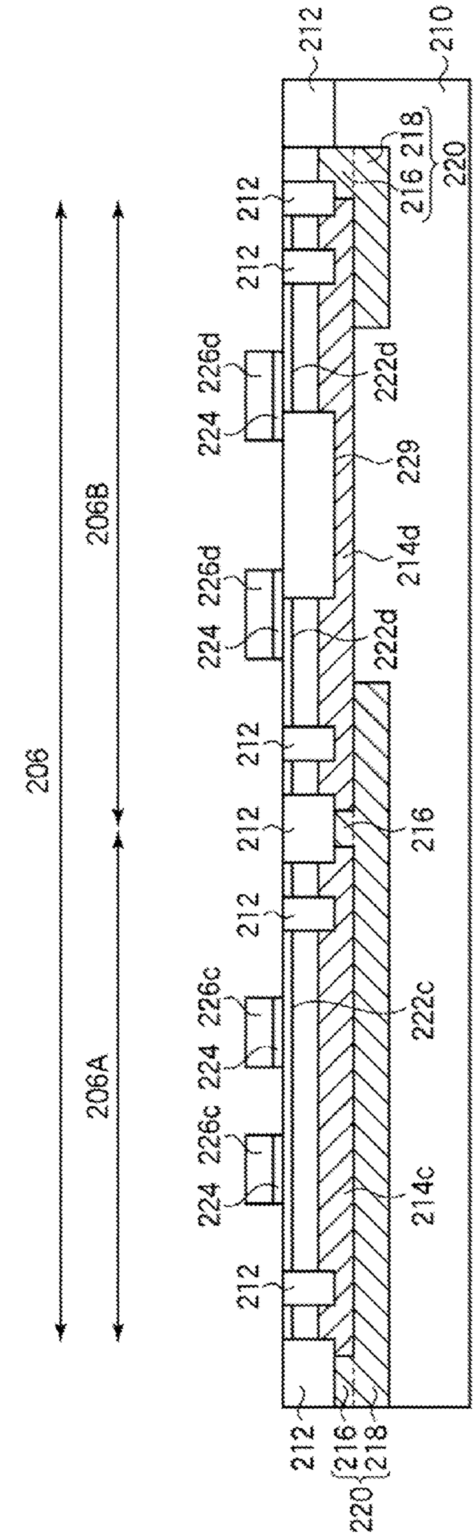

Next, the polysilicon film is subjected to patterning using the photolithographic technique, thereby forming polysilicon gate electrodes 26*a* to 26*d* (see FIGS. 51A and 51B)

Figure 52A:
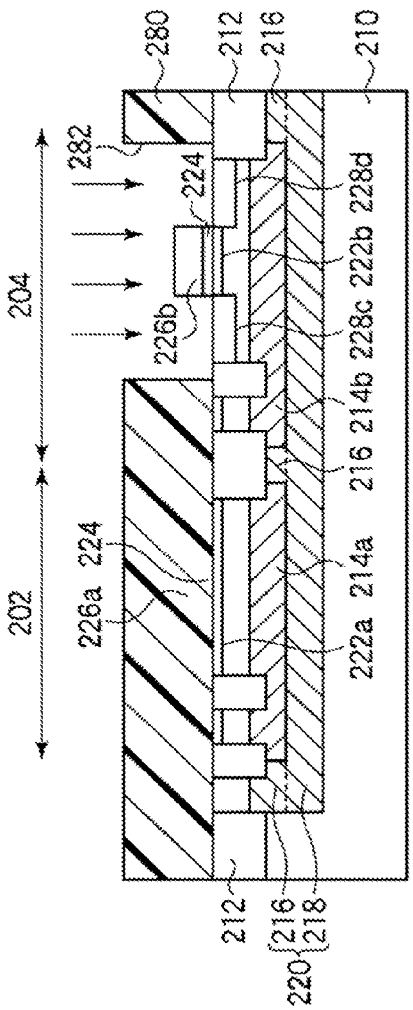
Figure 52B:
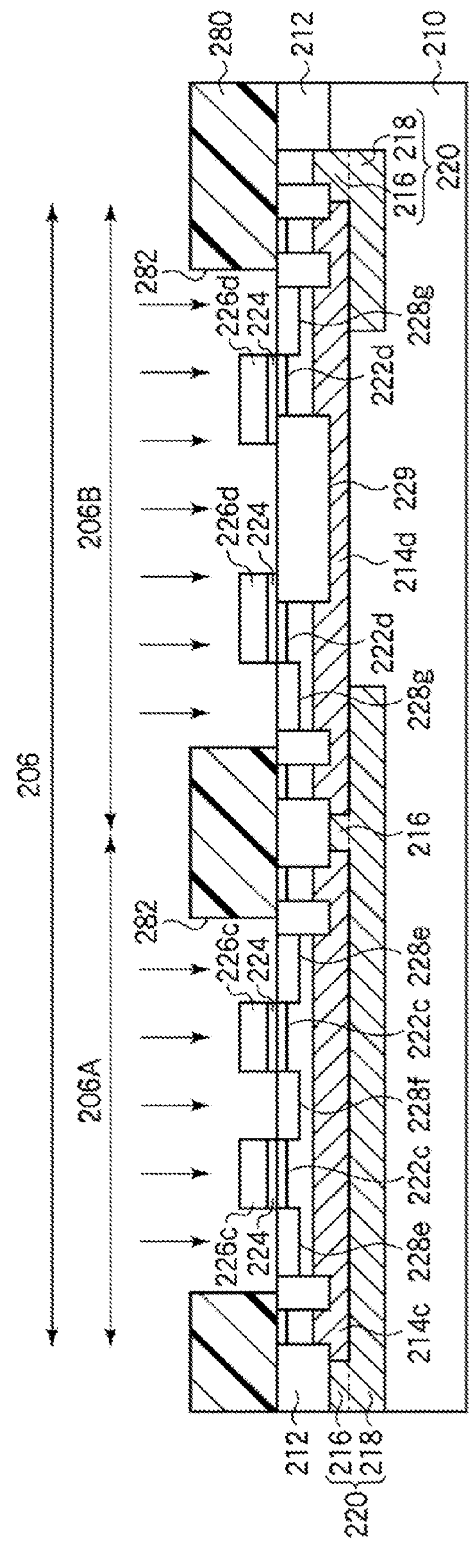

Next, as illustrated in FIGS. 52A and 52B, dopant impurities are introduced into the semiconductor substrate 210 by the ion-implantation technique with a photoresist film 280 where an opening portion 282 is formed, as a mask, thereby forming N-type low-concentration diffusion layers 228*c* to 228*g*. Subsequently, the photoresist film 280 is peeled off by ashing.

Figure 53A:
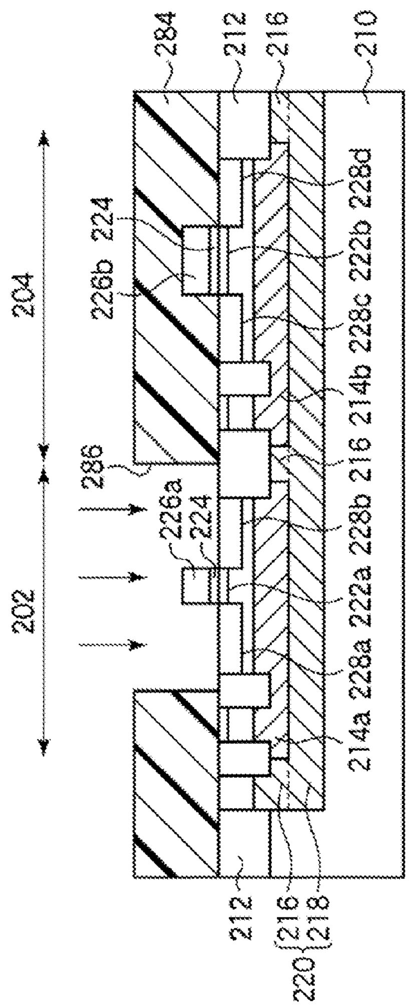
Figure 53B:
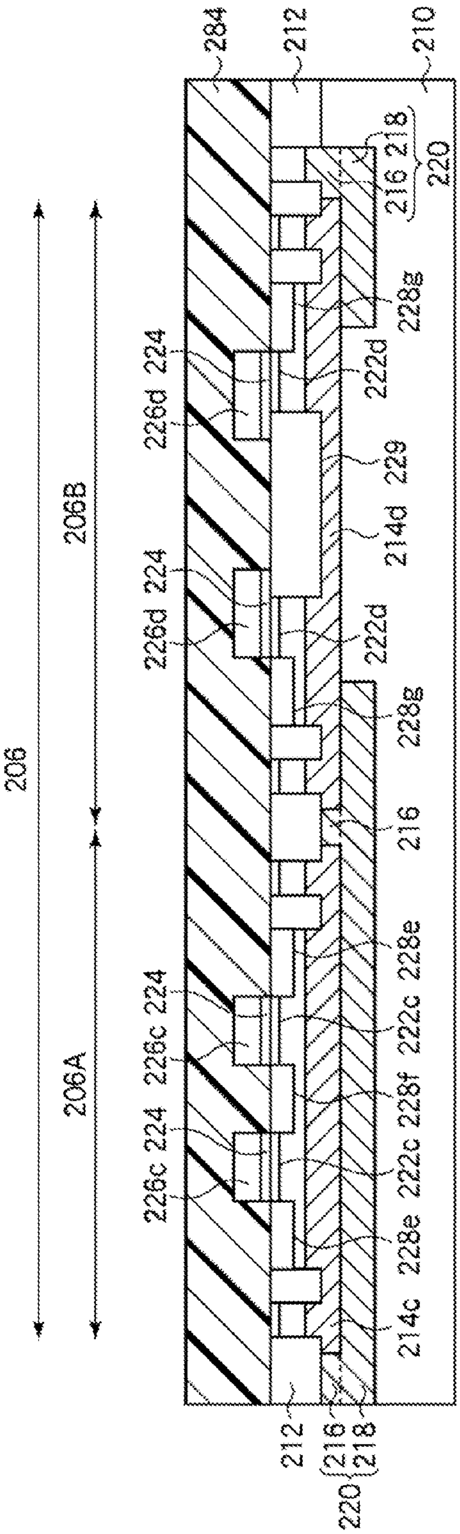

Next, as illustrated in FIGS. 53A and 53B, dopant impurities are introduced into the semiconductor substrate 210 by the ion-implantation technique with a photoresist film 284 where an opening portion 286 is formed, as a mask, thereby forming N-type low-concentration diffusion layers 228*a* and 228*b*. Subsequently, the photoresist film 284 is peeled off by ashing.

Next, an insulating film is formed on the entire surface by the CVD method.

Figure 54A:
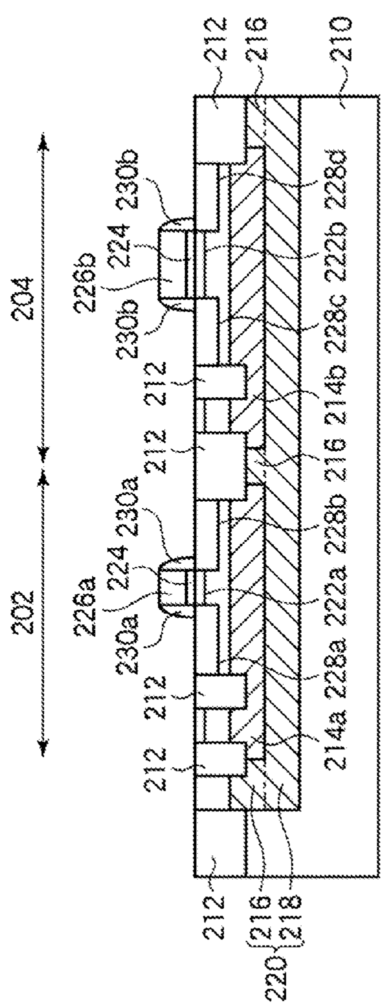
Figure 54B:
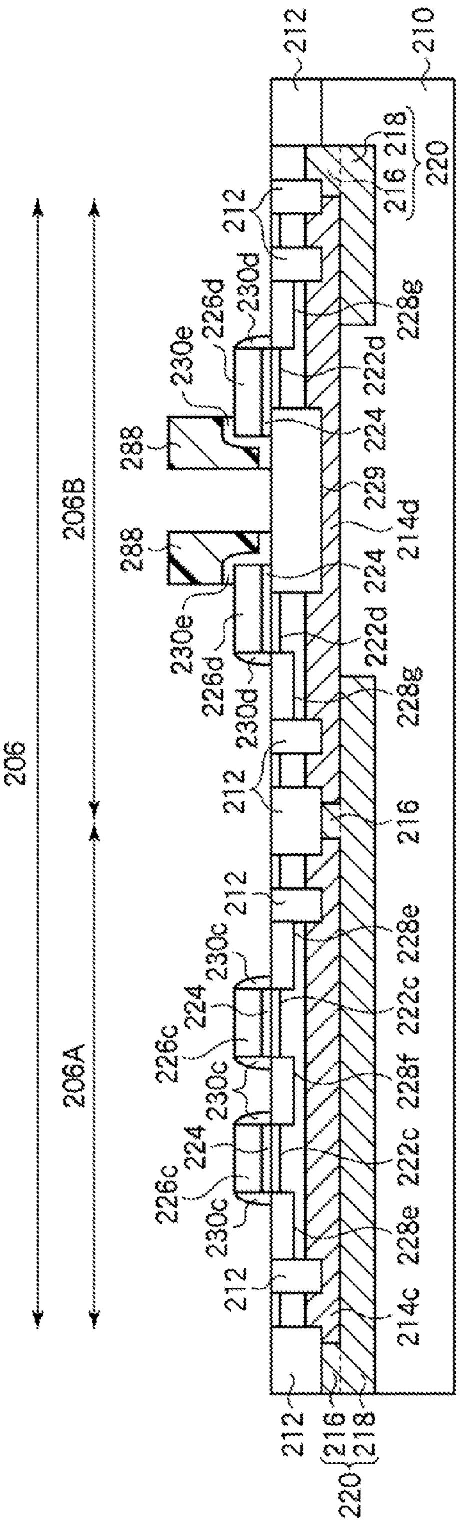

Next, as illustrated in FIGS. 54A and 54B, the insulating film is subjected to etching with a photoresist film 288 subjected to patterning in the shape of a spacer 30*e* as a mask. Thus, side wall insulating films 230*a* to 230*c* are formed on the side wall portions of the gate electrodes 226*a* to 226*c*. Also, a side wall insulating film 230*d* is formed on the side wall portion on the low-concentration source region 228*g* side of the gate electrode 226*d*. The spacer 230*e* is formed on the portion including the side wall of the low-concentration drain region 229 side of the gate electrode 226*d*.

Figure 55A:
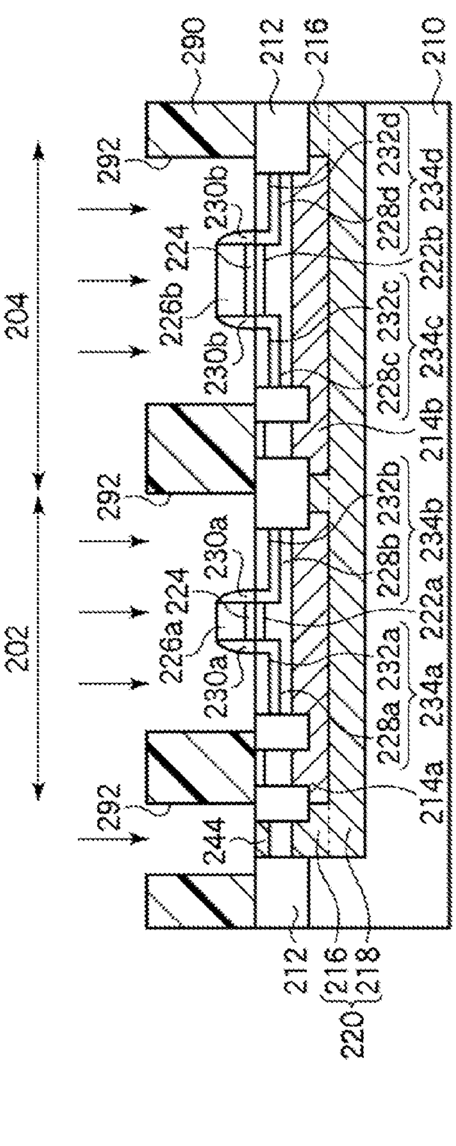
Figure 55B:
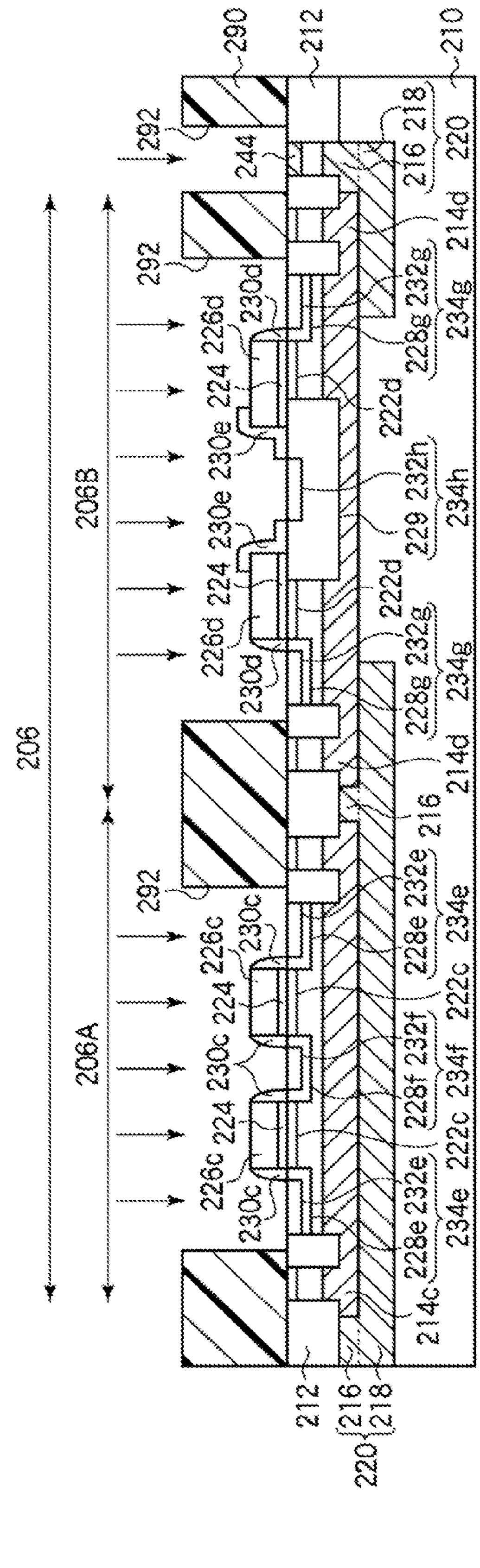

Next, as illustrated in FIGS. 55A and 55B, dopant impurities are introduced by the ion-implantation technique with a photoresist film 290 where an opening portion 292 is formed, as a mask, thereby forming N-type high-concentration diffusion layers 232*a* to 232*h* and an N-type contact region 244. According to the low-concentration diffusion layers 228*a* to 228*g*, and 229, and the high-concentration diffusion layers 232*a* to 232*h*, source/drain diffusion layers 234*a* to 234*h* of the extension source/drain configuration or LDD configuration are formed. Note that the N-type contact layer 244 is electrically connected to the N-type well 220 by thermal processing to be performed in a later process, or the like. Subsequently, the photoresist film 290 is peeled off by ashing.

Figure 56A:
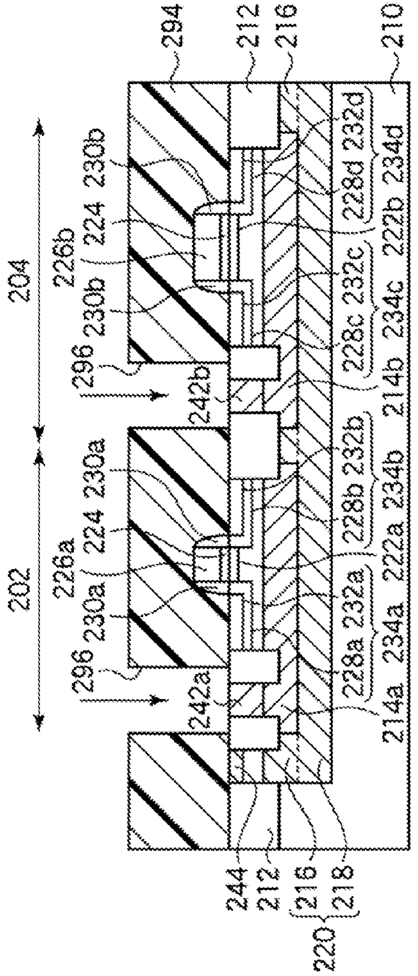
Figure 56B:
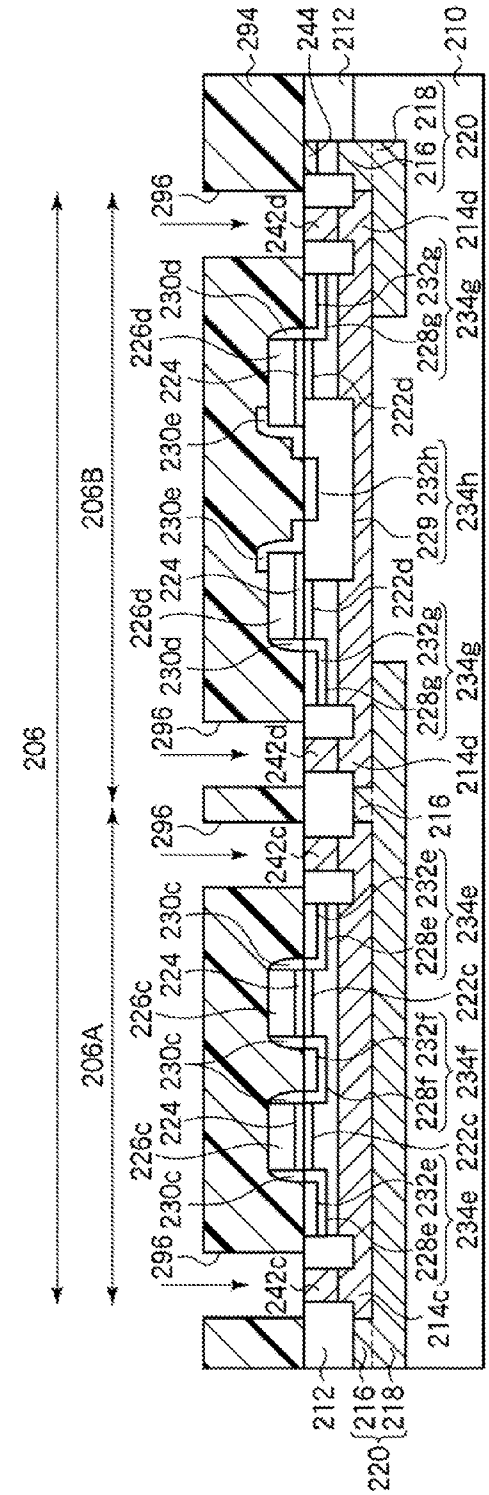

Next, as illustrated in FIGS. 56A and 56B, dopant impurities are introduced into the semiconductor substrate 210 by the ion-implantation technique with a photoresist film 294 where an opening portion 296 is formed, as a mask, thereby forming P-type contact regions 242*a* to 242*d*. Subsequently, the photoresist film 294 is peeled off by ashing.

Next, a silicide film 238 is formed on the source/drain diffusion layers 234*a* to 234*h*, on the gate electrodes 226*a* to 226*d*, and on the contact regions 242*a* to 242*d*, and 244.

In this way, a transistor 240*a* including the gate electrode 226*a*, and source/drain diffusion layers 234*a* and 234*b* is formed inside of a core transistor formation region 202. Also, a transistor 240*b* including the gate electrode 226*b*, and source/drain diffusion layers 234*c* and 234*d* is formed inside of an input/output transistor formation region 204. Also, a transistor 240*c* including the gate electrode 234*c*, and source/drain diffusion layers 234*e* and 234*f* is formed inside of a previous stage transistor formation region 206A. Also, a high-withstand-voltage transistor 240*d* including the gate electrode 234*d*, and source/drain diffusion layers 234*g* and 234*h* is formed inside of a high-withstand-voltage transistor formation region 206B (see FIGS. 57A and 57B).

Figures 49A, 49B:
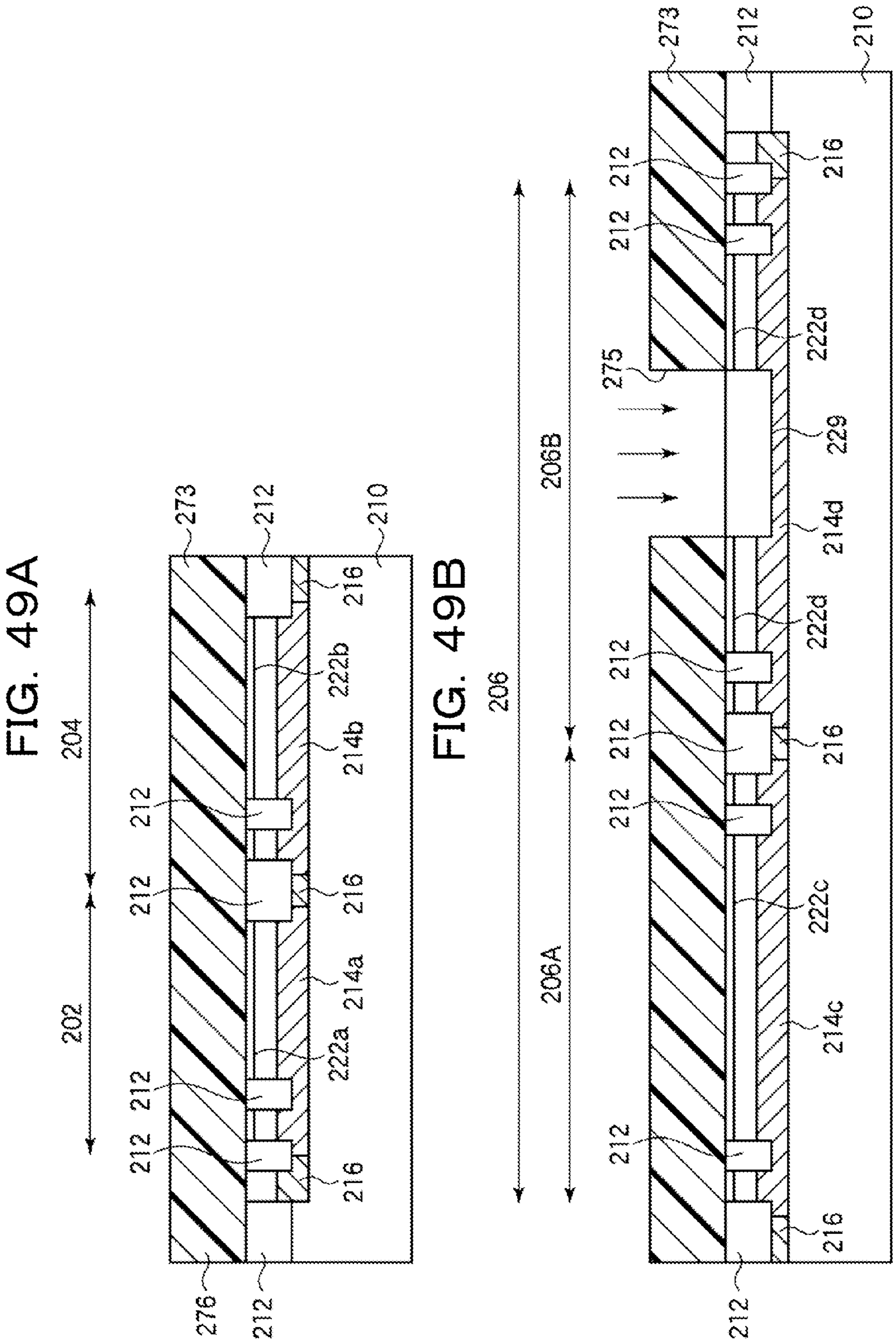

In this way, with the semiconductor device manufacturing method according a reference example, the low-concentration drain region 229 of the high-withstand-voltage transistor 240*d* is formed in a process separately from the low-concentration drain regions 228*a* to 228*g* (see FIGS. 49A and 49B). The reason why the low-concentration drain region 229 is formed separately from the low-concentration drain regions 228*a* to 228*g* is to secure a sufficient distance between the edge portion of the high-concentration drain region 232*h*, and the edge portion of the low-concentration drain region 229, and to sufficiently moderate the impurity profile. Thus, the electric field to be applied to the drain side is moderated at the time of high voltage being applied, and a transistor 240*d* having high withstand voltage may be obtained.

However, with the semiconductor device manufacturing method according to a reference example, the process for forming the low-concentration drain region 229 is performed separately from the process for forming the low-concentration drain regions 228*a* to 228*g*, which causes increase in manufacturing processes. Increase in manufacturing processes becomes a hindrance factor as to reduction in cost of the semiconductor device.

First Embodiment

A semiconductor device according to a first embodiment and a manufacturing method thereof will be described with reference to FIGS. 1A to 19.

(Semiconductor Device)

Figures 1A, 1B:
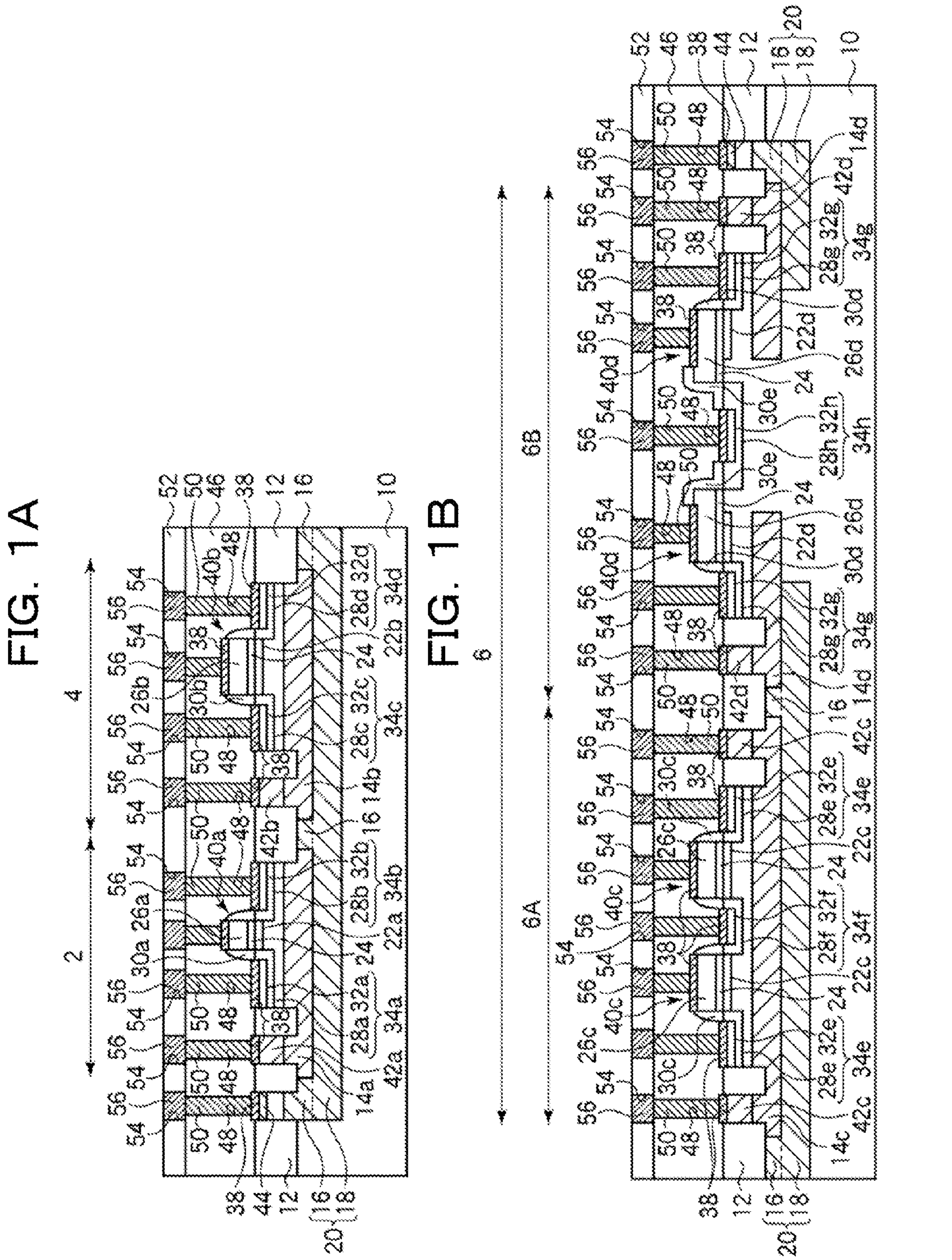
FIGS. 1A and 1B are cross-sectional views illustrating a semiconductor device according to a first embodiment.
Figure 2A:
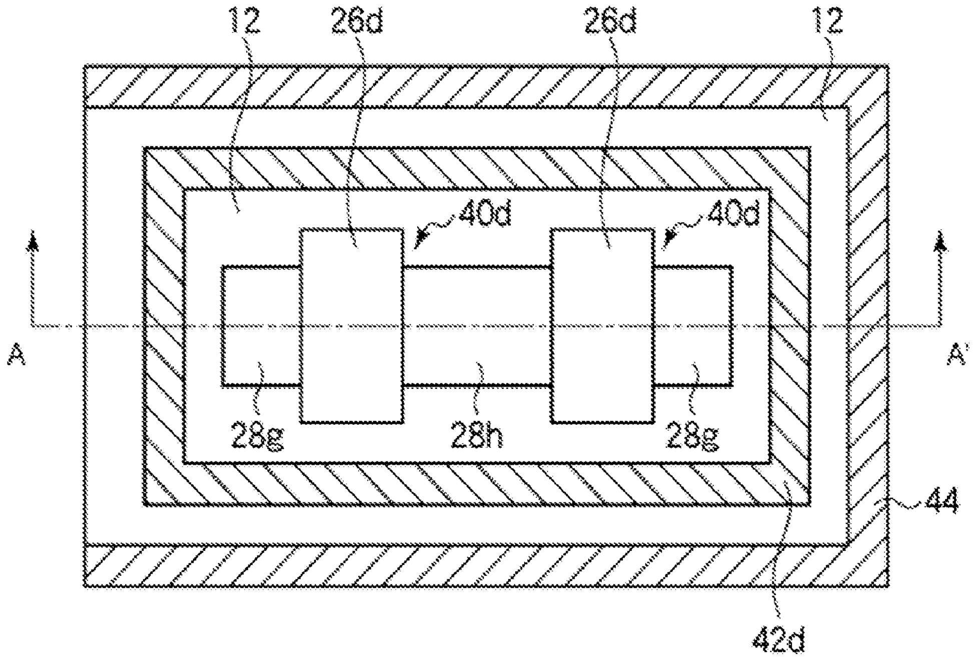
FIGS. 2A and 2B are a plane view and a cross-sectional view illustrating a high-withstand-voltage transistor formation region, respectively.
Figure 2B:
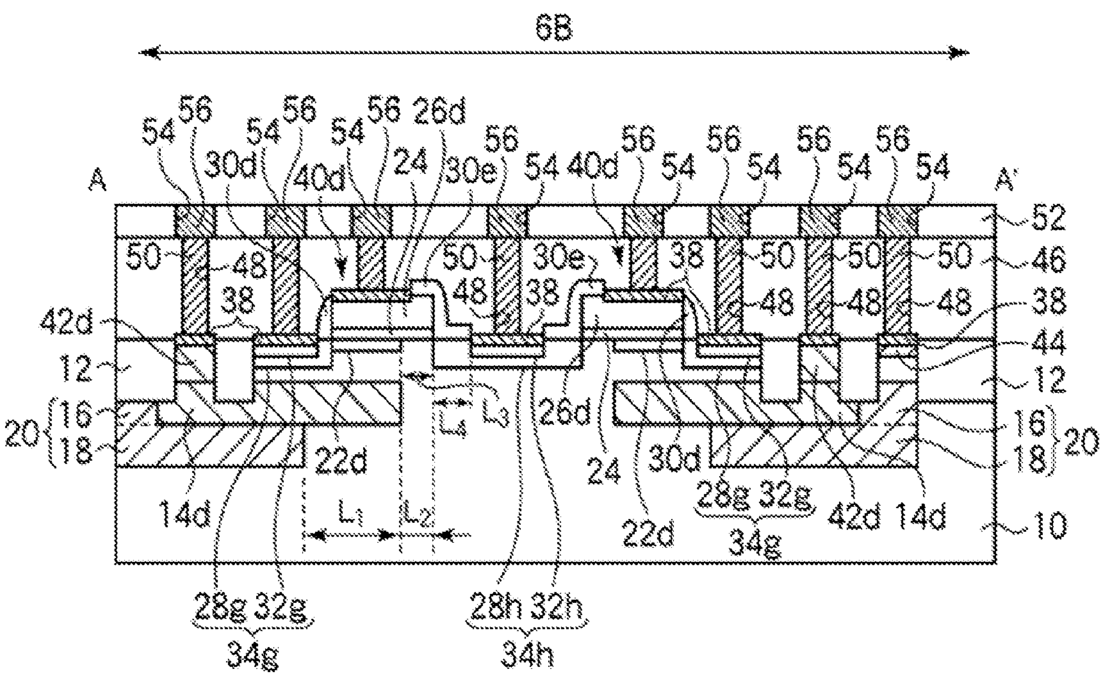

First, description will be made regarding the semiconductor device according to the present embodiment with reference to FIGS. 1A and 1B, and FIGS. 2A and 2B. FIGS. 1A and 1B are cross-sectional views illustrating the semiconductor device according to the present embodiment. The space left-hand side in FIG. 1A illustrates a region (core transistor formation region) 2 where the transistor of the core portion is formed, and the space right-hand side in FIG. 1A illustrates a region (input/output transistor formation region) 4 where the transistor of the input/output circuit is formed. FIG. 1B illustrates a region (power amplifier circuit formation region) 6 where the power amplifier circuit is formed. The space left-hand side in FIG. 1B illustrates a region (previous stage transistor formation region) 6A where the transistor of the previous stage of the power amplifier circuit is formed, and the space right-hand side in FIG. 1B illustrates a region (high-withstand-voltage transistor formation region) 6B where a high-withstand-voltage transistor (previous stage transistor) used for the final stage of the power amplifier circuit is formed. FIGS. 2A and 2B are a plane view and a cross-sectional view illustrating the high-withstand-voltage transistor formation region. FIG. 2A is a plane view, and FIG. 2B is a cross-sectional view. FIG. 2B corresponds to an A-A' line cross-section in FIG. 2A.

As illustrated in FIGS. 1A and 1B, a chip separation region 12 for determining a chip region is formed on a semiconductor substrate 10. As for the semiconductor substrate 10, for example, a P-type silicon substrate is employed.

First, the core transistor formation region 2 where the transistor of the core portion is formed will be described.

Voltage to be applied to a transistor 40*a* of the core portion is relatively low. Accordingly, as for the transistor 40*a* of the core portion, a transistor having lower withstand voltage than the high-withstand-voltage transistor 40*d* is employed.

A P-type well 14*a* is formed inside of the semiconductor substrate 10 in the core transistor formation region 2. Also, an N-type diffusion layer 16 is formed inside of the semiconductor substrate 10 in the core transistor formation region 2 so as to surround the side portion of the P-type well 14*a*. Also, an N-type embedded diffusion layer 18 is formed in a deeper region than the P-type well 14*a* inside of the semiconductor substrate 10 in the core transistor formation region 2. The N-type diffusion layer 16 and the N-type embedded diffusion layer 18 are mutually connected. An N-type well 20 is formed by the N-type diffusion layer 16 and the N-type embedded diffusion layer 18. The P-type well 14*a* is surrounded by the N-type well 20. The P-type well 14*a* is electrically separated from the semiconductor substrate 10 by the N-type well 20. Such a configuration is referred to as a triple well configuration. The core transistor formation region 2 has such a triple well configuration, whereby noise that occurs at the high-withstand-voltage transistor 40*d* may be prevented from having an adverse affect on the core portion.

A channel dope layer 22*a* is formed inside of the semiconductor substrate 10 in the core transistor formation region 2. With the core transistor formation region 2, the channel dope layer 22*a* is formed by introducing dopant impurities into the entire chip region determined by the chip separation region 12.

A gate electrode 26*a* is formed on the semiconductor substrate 10 in the core transistor formation region 2 via a gate insulating film 24.

N-type low-concentration diffusion layers (extension regions) 28*a* and 28*b* are formed inside of the semiconductor substrate 10 on both sides of the gate electrode 26*a*.

A side wall insulating film (side wall spacer) 30*a* is formed on the side wall portion of the gate electrode 26*a*.

N-type high-concentration diffusion layers 32*a* and 32*b* are formed inside of the semiconductor substrate 10 on both sides of the gate electrode 26*a* where the side wall insulating film 30*a* is formed. Source/drain diffusion layers 34*a* and 34*b* having an extension source/drain configuration or LDD (Lightly Doped Drain) configuration are formed by the N-type low-concentration diffusion layers 28*a* and 28*b*, and the N-type high-concentration diffusion layers 32*a* and 32*b*.

In this way, the transistor 40*a* including the gate electrode 26*a* and the source/drain diffusion layers 34*a* and 34*b* is formed.

A P-type contact region (well tap region) 42*a* electrically connected to the P-type well 14*a* is formed in the core transistor formation region 2. The P-type contact region 42*a* is for applying prescribed bias voltage to the P-type well 14*a*.

A silicide film 38 is formed on the source/drain regions 34*a* and 34*b*, on the gate electrode 26*a*, and on the contact region 42*a*. The silicide films 38 on the source/drain regions 34*a* and 34*b* serve as source/drain electrodes.

Note that, though the transistor 40*a* illustrated in FIG. 1A is an NMOS transistor, a PMOS transistor which is not illustrated in the drawing is also formed in the core transistor formation region 2.

Next, description will be made regarding the input/output transistor formation region 4 where an input/output transistor is formed.

Voltage applied to the input/output circuit is relatively low. Therefore, as for a transistor 40*b* of the input/output circuit, a transistor having lower withstand voltage than the high-withstand-voltage transistor 40*d* is employed.

A P-type well 14*b* is formed inside of the semiconductor substrate 10 in the input/output transistor formation region 4. Also, the N-type diffusion layer 16 is formed inside of the semiconductor substrate 10 in the input/output transistor region 4 so as to surround the side portion of the P-type well 14*b*. Also, the N-type embedded diffusion layer 18 is formed in a region deeper than the P-type well 14*b* inside of the semiconductor substrate 10 in the input/output transistor formation region 4. The N-type diffusion layer 16 and the N-type embedded diffusion layer 18 are mutually connected. The N-type well 20 is formed by the N-type diffusion layer 16 and the N-type embedded diffusion layer 18. The P-type well 14*b* is surrounded by the N-type well 20. The P-type well 14*b* is electrically separated from the semiconductor substrate 10 by the N-type well 20. The input/output transistor formation region 4 has such a triple well configuration, and accordingly, noise that occurs at the high-withstand-voltage transistor 40*d* may be prevented from having an adverse affect on the input/output circuit.

A channel dope layer 22*b* is formed inside of the semiconductor substrate 10 in the input/output transistor formation region 4. With the input/output transistor formation region 4, the channel dope layer 22*b* is formed by introducing dopant impurities into the entire chip region determined by the chip separation region 12.

A gate electrode 26*b* is formed on the semiconductor substrate 10 in the input/output transistor formation region 4 via the gate insulating film 24.

N-type low-concentration diffusion layers 28*c* and 28*d* are formed inside of the semiconductor substrate 10 on both sides of the gate electrode 26*b*.

A side wall insulating film 30*b* is formed on the side wall portion of the gate electrode 26*b*.

N-type high-concentration diffusion layers 32*c* and 32*d* are formed inside of the semiconductor substrate 10 on both sides of the gate electrode 26*b* where the side wall insulating film 30*b* is formed. Source/drain diffusion layers 34*c* and 34*d* having an extension source drain configuration or LDD configuration are formed by the N-type low-concentration diffusion layers 28*c* and 28*d* and the N-type high-concentration diffusion layers 32*c* and 32*d*.

In this way, the transistor 40*b* including the gate electrode 26*b*, and source/drain diffusion layers 34*c* and 34*d* is formed.

Also, a P-type contact region 42*b* electrically connected to the P-type well 14*b* is formed in the input/output transistor formation region 4. The P-type contact region 42*b* is for applying prescribed bias voltage to the P-type well 14*b*.

The silicide film 38 is formed on the source/drain regions 34*c* and 34*d*, on the gate electrode 26*b*, and on the contact region 42*b*. The silicide films 38 on the source/drain regions 34*c* and 34*d* serve as source/drain electrodes.

Note that, though the input/output transistor 40*b* illustrated in FIG. 1 is an NMOS transistor, a PMOS transistor which is not illustrated in the drawing is also formed in the input/output transistor formation region 4.

Next, description will be made regarding the previous stage transistor formation region 6A where a transistor of the previous stage of the power amplifier circuit is formed.

In general, high voltage such as the final stage of the power amplifier circuit is not applied to a transistor 40*c* of the previous stage of the power amplifier circuit. Accordingly, as for the transistor 40*c* of the previous stage of the power amplifier circuit, a transistor having lower withstand voltage than the high-withstand-voltage transistor 40*d* may be employed. Here, the transistor 40*d* similar to the input/output transistor 40*c* is formed as the transistor 40*d* of the previous stage of the power amplifier circuit.

A P-type well 14*c* is formed inside of the semiconductor substrate 10 in the previous stage transistor formation region 6A. Also, the N-type diffusion layer 16 is formed inside of the semiconductor substrate 10 in the previous stage transistor formation region 6A so as to surround the side portion of the P-type well 14*c*. Also, the N-type embedded diffusion layer 18 is formed in a region deeper than the P-type well 14*c*, inside of the semiconductor substrate 10 in the previous stage transistor formation region 6A. The N-type diffusion layer 16 and the N-type embedded diffusion layer 18 are mutually connected. The N-type well 20 is formed by the N-type diffusion layer 16 and the N-type embedded diffusion layer 18. The P-type well 14*c* is surrounded by the N-type well 20. The P-type well 14*c* is electrically separated from the semiconductor substrate 10 by the N-type well 20. The previous stage transistor formation region 6A has such a triple well configuration, and accordingly, noise that occurs at the high-speed transistor 40*d* of the final stage of the power amplifier circuit may be prevented from having an adverse affect on the previous stage of the power amplifier circuit.

A channel dope layer 22*c* is formed inside of the semiconductor substrate 10 in the previous stage transistor formation region 6A. With the previous stage transistor formation region 6A, the channel dope layer 22*c* is formed by introducing dopant impurities into the entire chip region determined by the chip separation region 12.

A gate electrode 26*c* is formed on the semiconductor substrate 10 in the previous stage transistor formation region 6A via the gate insulating film 24.

N-type low-concentration diffusion layers 28*e* and 28*f* are formed inside of the semiconductor substrate 10 on both sides of the gate electrode 26*c*.

A side wall insulating film 30*c* is formed on the side wall portion of the gate electrode 26*c*.

N-type high-concentration diffusion layers 32*e* and 32*f* are formed inside of the semiconductor substrate 10 on both sides of the gate electrode 26*c* where the side wall insulating film 30*c* is formed. Source/drain diffusion layers 34*c* and 34*f* having an extension source/drain configuration or LDD configuration are formed by the N-type low-concentration diffusion layers 28*e* and 28*f*, and the N-type high-concentration diffusion layers 32*e* and 32*f*.

In this way, the transistor 40*c* including the gate electrode 26*c* and the source/drain diffusion layers 34*e* and 34*f* is formed.

The drain diffusion layers 34*f* of the mutually adjacent two transistors 40*c* are formed by the common drain diffusion layer 34*f*.

Also, a P-type contact region 42*c* electrically connected to the P-type well 14*c* is formed in the previous stage transistor formation region 6A. The P-type contact region 42*c* is for applying prescribed bias voltage to the P-type well 14*c*.

The silicide film 38 is formed on the source/drain regions 34*e* and 34*f*, on the gate electrode 26*c*, and on the contact region 42*c*. The silicide films 38 on the source/drain regions 34*c* serve as source/drain electrodes.

Note that, though the transistor 40*c* illustrated in FIG. 1B is an NMOS transistor, a PMOS transistor which is not illustrated in the drawing is also formed in the previous stage transistor formation region 6.

Next, a high-withstand-voltage transistor formation region 6B will be described.

Voltage to be applied to the drain of the transistor of the final stage of the power amplifier circuit may become around triple of gate bias voltage, and for example, high voltage of around 10 V may be applied thereto. Therefore, it is desirable to employ the high-withstand-voltage transistor 40*d* at the final stage of the power amplifier circuit.

A P-type well 14*d* is formed inside of the semiconductor substrate 10 in the high-withstand-voltage transistor formation region 6B. The P-type well 14*d* is formed in a region except for a region where the low-concentration drain region 28*h* is formed so as to be separated from the low-concentration drain region 28*h*. Specifically, dopant impurities for forming the P-type well 14*d* are introduced in a region separated from a region where dopant impurities for forming the low-concentration drain region 28*h* are introduced. In other words, on design data or reticle, the region where the low-concentration drain region 28*h* is formed, and the region where the P-type well 14*d* is formed are mutually separated. Distance $L_2$ between the region where the low-concentration drain region 28*h* is formed, and the P-type well 14*d* is 180 nm or so, for example.

The reason why the P-type well 14*d* is formed so as to be separated from the region where the low-concentration drain region 28*h* is formed is to obtain moderate the impurity profile between the low-concentration drain region 28*h* and the P-type well 14*d*. Thus, even in the event that high voltage is applied to the drain of the transistor 40*d*, concentration electric fields on the drain side of the transistor 40*d* may sufficiently be moderated, and accordingly, sufficient withstand voltage may be obtained.

Note that thermal processing for activating dopant impurities is performed after introduction of dopant impurities for forming the P-type well 14*d* or low-concentration drain region 28*h* is completed. According to this thermal processing, P-type dopant impurities introduced for forming the P-type well 14*d* are diffused. Also, N-type dopant impurities introduced for forming the low-concentration drain region 28*h* are also diffused. There is a concentration gradient in the portion on the low-concentration drain region 28*h* side of the P-type well 14*d* wherein the concentration of P-type dopant impurities decreases from the P-type well 14*d* toward the low-concentration drain region 28*h*. Also, there is a concentration gradient in the portion on the channel dope layer 22*d* side of the low-concentration drain region 28*h* wherein the concentration of N-type dopant impurities decreases from the low-concentration drain region 28*h* toward the P-type well 14*d*. According to diffusion of such dopant impurities, there may be a state in which the P-type well 14*d* and the low-concentration drain region 28*h* are not separated. However, even in the event that dopant impurities are diffused by such thermal processing, it is unchanged that a moderate impurity profile is obtained between the low-concentration drain region 28*h* and the P-type well 14*d*. According to diffusion of dopant impurities, even in the event that the P-type well 14*d* and the low-concentration drain region 28*h* are in an unseparated state, concentration of electric fields is sufficiently moderated between the low-concentration drain region 28*h* and the P-type well 14*d*, and sufficient withstand voltage is obtained. Accordingly, the P-type well 14*d* and the low-concentration drain region 28*h* are not mutually separated, there may be a concentration gradient wherein the concentration of N-type dopant impurities decreases from the low-concentration drain region 28*h* toward the P-type well 14*d*.

The N-type diffusion layer 16 is formed inside of the semiconductor substrate 10 in the high-withstand-voltage transistor formation region 6B surrounding the sides of the P-type well 14*d*. Note that the N-type diffusion layer 16 is not formed in the portion on the drain diffusion layer 34*h* side of the P-type well 14*d*. Also, the N-type embedded diffusion layer 18 is formed in a region deeper than the P-type well 14*d*, inside of the semiconductor substrate 10 in the high-withstand-voltage transistor formation region 6B. The N-type diffusion layer 16 and the N-type embedded diffusion 18 are mutually connected. The N-type well 20 is formed by the N-type diffusion layer 16 and the N-type embedded diffusion 18.

With the high-withstand-voltage transistor formation region 6B, the edge portion on the drain diffusion layer 34*h* side of the N-type embedded diffusion layer 18 is separated from the edge portion on the drain diffusion layer 34*h* side of the P-type well 14. Let us say that distance $L_1$ (see FIGS. 2A and 2B) between the edge portion on the drain diffusion layer 34*h* side of the N-type embedded diffusion layer 18, and the edge portion on the drain diffusion layer 34*h* side of the P-type well 14 is around 1 μm, for example. The reason why the distance $L_1$ between the drain side edge portion of the embedded diffusion layer 18 and the drain diffusion side edge portion of the P-type well 14 is set sufficiently greatly is to prevent the embedded diffusion layer 18 and the drain diffusion layer 34*h* from being electrically connected by the thermal diffusion of dopant impurities. Distance $(L_1+L_2)$ between the region where the low-concentration drain region 28*h* is formed, and the N-type embedded diffusion layer 18 is greater than distance $L_2$ between the region where the low-concentration drain region 28*h* is formed, and the P-type well 14*d*.

The channel dope layer 22*d* is formed inside of the semiconductor substrate 10 in the high-withstand-voltage transistor formation region 6B. With the high-withstand-voltage transistor formation region 6B, the channel dope layer 22*d* is formed in a region except for the region where the low-concentration drain region 28*h* is formed so as to be separated from the region where the low-concentration drain region 28*h* is formed. That is to say, dopant impurities for forming the channel dope layer 22*d* are introduced to a region separately from the region where dopant impurities for forming the low-concentration drain region 28*h* are introduced. In other words, the region where the low-concentration drain region 28*h* is formed, and the region where the channel dope layer 22*d* is formed are mutually separated on design data or reticle. Let us say that distance $L_3$ between the region where the low-concentration drain region 28*h* is formed and the channel dope layer 22*d* is 200 nm or so, for example.

The reason why the channel dope layer 22*d* is formed so as to be separated from the low-concentration drain region 28*h* is to obtain a moderate impurity profile between the low-concentration drain region 28*h* and the channel dope layer 22*d*. Thus, even in the event that high voltage is applied to the drain of the transistor 40*d*, concentration of electric fields may sufficiently be moderated between the low-concentration drain region 28*h* and the channel dope layer 22*d*, and sufficient withstand voltage may be obtained.

Note that thermal processing for activating dopant impurities is performed after the channel dope layer 22*d* and the low-concentration drain region 28*h* are formed. According to this thermal processing, the P-type dopant impurities introduced for forming the channel dope layer 22*d* are diffused. Also, the N-type dopant impurities introduced for forming the low-concentration drain region 28*h* are also diffused. At the portion on the low-concentration drain region 28*h* side of the channel dope layer 22*d*, there is a concentration gradient wherein the concentration of the P-type dopant impurities decreases from the channel dope layer 22*d* toward the low-concentration drain region 28*h*. Also, at the portion on the channel dope layer 22*d* side of the low-concentration drain region 28*h*, there is a concentration gradient wherein the concentration of the N-type dopant impurities decreases from the low-concentration drain region 28*h* toward the channel dope layer 22*d*. According to diffusion of such dopant impurities, the channel dope layer 22*d* and the low-concentration drain region 28*h* may be in an unseparated state. However, even when the dopant impurities are diffused by such thermal processing, it is unchanged that a moderate impurity profile is obtained between the low-concentration drain region 28*h* and the channel dope layer 22*d*. Accordingly, even in the event that high voltage is applied to the drain of the transistor 40*d*, concentration of electric fields may sufficiently be moderated between the low-concentration drain region 28*h* and the channel dope layer 22*d*, and sufficient withstand voltage may be obtained. Accordingly, there may be a concentration gradient wherein the channel dope layer 22*d* and the low-concentration drain region 28*h* are not mutually separated, and the concentration of the N-type dopant impurities decreases from the channel dope layer 22*d* toward the low-concentration drain region 28*h*.

A gate electrode 26*d* is formed on the semiconductor substrate 10 in the previous stage transistor formation region 6B via the gate insulating film 24.

N-type low-concentration diffusion layers (extension regions) 28*g* and 28*h* are formed inside of the semiconductor substrate 10 on both sides of the gate electrode 26*d*.

A side wall insulating film (spacer) 30*d* is formed on the side wall portion on the source diffusion layer 34*g* of the gate electrode 26*d*. On the other hand, the spacer 30*e* is formed on a portion including the side wall on the drain diffusion layer 34*h* side of the gate electrode 26*d*. The spacer 30*e* is formed so as to cover not only the side wall portion of the gate electrode 26*d* but also a portion of the low-concentration drain region 28*h*. The spacer 30*e* serves as a mask (injection block) for preventing injection of dopant impurities at the time of forming the high-concentration drain region 32*h*. Also, the spacer 30*e* serves as a mask (silicide block) for preventing being subjected to silicide at the time of forming the silicide film 38.

N-type high-concentration diffusion layers 32*g* and 32*h* are formed inside of the semiconductor substrate 10 on both sides of the gate electrode 26*d* where the side wall insulating film 30*c* and the spacer 30*e* are formed. Let us say that distance $L_4$ between the gate electrode 26*d* and the N-type high-concentration drain region 32*h* (see FIG. 2B) is 180 nm or so, for example. Source/drain diffusion layers 34*g* and 34*h* having an extension source/drain configuration or LDD configuration are formed by the N-type low-concentration diffusion layers 28*g* and 28*h* and the N-type high-concentration diffusion layers 32*g* and 32*h*. With the present embodiment, the distance $L_4$ between the gate electrode 26*d* and the high-concentration drain region 32*h* is set so as to be greater than the distance between the gate electrode 26*d* and the high-concentration source region 32*g*. The reason why the distance $L_4$ between the gate electrode 26*d* and the high-concentration drain region 32*h* is set relatively great is to sufficiently moderate the impurity profile on the drain side, and to secure sufficient withstand voltage.

In this way, the high-withstand-voltage transistor 40*d* including the gate electrode 26*d* and the source/drain diffusion layers 34*g* and 34*h* is formed.

The drain diffusion layers 34*h* of two mutually adjacent high-withstand-voltage transistors 40*d* are formed by the common drain diffusion layer 34*h*.

Also, with the high-withstand-voltage transistor formation region 6B, the P-type contact region 42*d* electrically connected to the P-type well 14*d* is formed. The P-type contact region 42*d* is for applying prescribed bias voltage to the P-type well 14*d*. The P-type contact region 42*d* is, as illustrated in FIG. 2A, formed so as to surround the high-withstand-voltage transistor formation region 6B.

The silicide film 38 is formed on the source/drain regions 34*g* and 34*h*, on the gate electrode 26*d*, and on the contact region 42*d*. The silicide films 38 on the source/drain regions 34*g* and 34*h* serve as source/drain electrodes.

The N-type embedded diffusion layers 18 formed in the core transistor formation region 2, input/output transistor formation region 4, previous stage transistor formation region 6, and high-withstand-voltage transistor formation region 6B are formed by the common embedded diffusion layer 18.

An N-type contact region (well tap region) 44 electrically connected to the N-type well 20 is formed in the circumference of the core transistor formation region 2, input/output transistor formation region 4, and power amplifier circuit formation region 6. The N-type contact region 44 is formed so as to surround the core transistor formation region 2, input/output transistor formation region 4, and power amplifier circuit 6 (see FIG. 2A).

The silicide film 38 is formed on the N-type contact region 44.

An inter-layer insulating film 46 is formed on the semiconductor substrate 10 where the transistors 40*a* to 40*d* are formed. A contact hole 48 which reaches the silicide film 38 is formed in the inter-layer insulating film 46. A conductor plug 50 is embedded in the contact hole 48.

An inter-layer insulating film 52 is formed on the inter-layer insulating film 46 in which the conductor plug 50 is embedded. A groove 54 for embedding a wiring is formed on the inter-layer insulating film 52. A wiring 56 connected to the conductor plug 50 is embedded in the groove 54.

In this way, the semiconductor device according to the present embodiment is formed.

As described above, according to the present embodiment, with the high-withstand-voltage transistor 40*d*, the channel dope layer 22*d* is formed in a region separately from the region where the low-concentration drain region 28*h*. That is to say, dopant impurities for forming the channel dope layer 22*d* are introduced in a region separately from the region where dopant impurities for forming the low-concentration drain region 28*h*. In other words, the low-concentration drain region 28*h* and channel dope layer 22*d* are mutually separated on design data or reticle. Therefore, with the present embodiment, a moderate impurity profile may be obtained between the channel dope layer 22*d* and the low-concentration drain region 28*h*. Therefore, according to the present embodiment, even in the event that high voltage is applied to the drain of the transistor 40*d*, concentration of electric fields may sufficiently be moderated between the low-concentration drain region 28*h* and the channel dope layer 22*d*, and sufficient withstand voltage may be obtained.

Also, according to the present embodiment, with the high-withstand-voltage transistor 40*d*, the P-type well 14*d* is formed in a region separately from the region where the low-concentration drain region 28*h*. That is to say, dopant impurities for forming the P-type well 14*d* are introduced in a region separately from the region where dopant impurities for forming the low-concentration drain region 28*h*. In other words, the low-concentration drain region 28*h* and P-type well 14*d* are mutually separated on design data or reticle. Therefore, with the present embodiment, a moderate impurity profile may be obtained between the channel dope layer 22*d* and the P-type well 14*d*. Therefore, according to the present embodiment, even in the event that high voltage is applied to the drain of the transistor 40*d*, concentration of electric fields may sufficiently be moderated between the low-concentration drain region 28*h* and the P-type well 14*d*, and sufficient withstand voltage may be obtained.

Also, according to the present embodiment, with the high-withstand-voltage transistor 40*d*, the channel dope layer 22*d* is formed in a region separately from the region where the low-concentration drain region 28*h*, and accordingly, a high-withstand-voltage transistor 40*d* having lower on resistance may be obtained. Therefore, according to the present embodiment, a semiconductor device with excellent electrical property may be provided.

(Semiconductor Device Manufacturing Method)

Next, a semiconductor device manufacturing method according to the present embodiment will be described with reference to FIGS. 3A to 16B. FIGS. 3A to 16B are process cross-sectional views illustrating the semiconductor device manufacturing method according to the present embodiment.

Figure 3A:
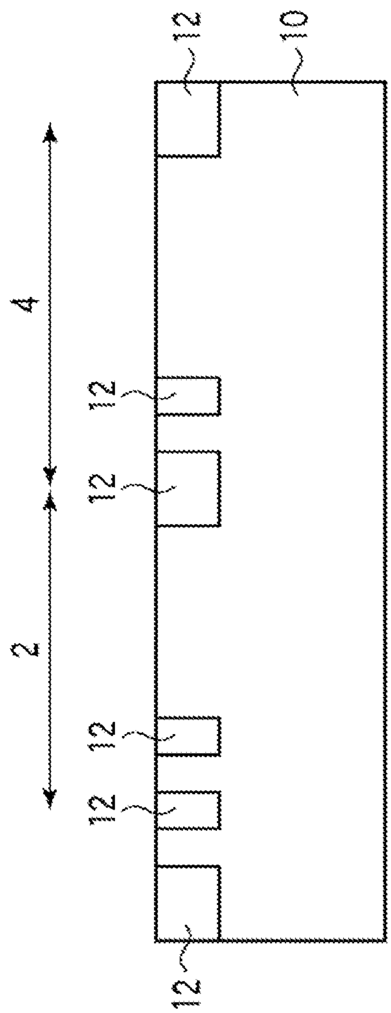
Figure 3B:
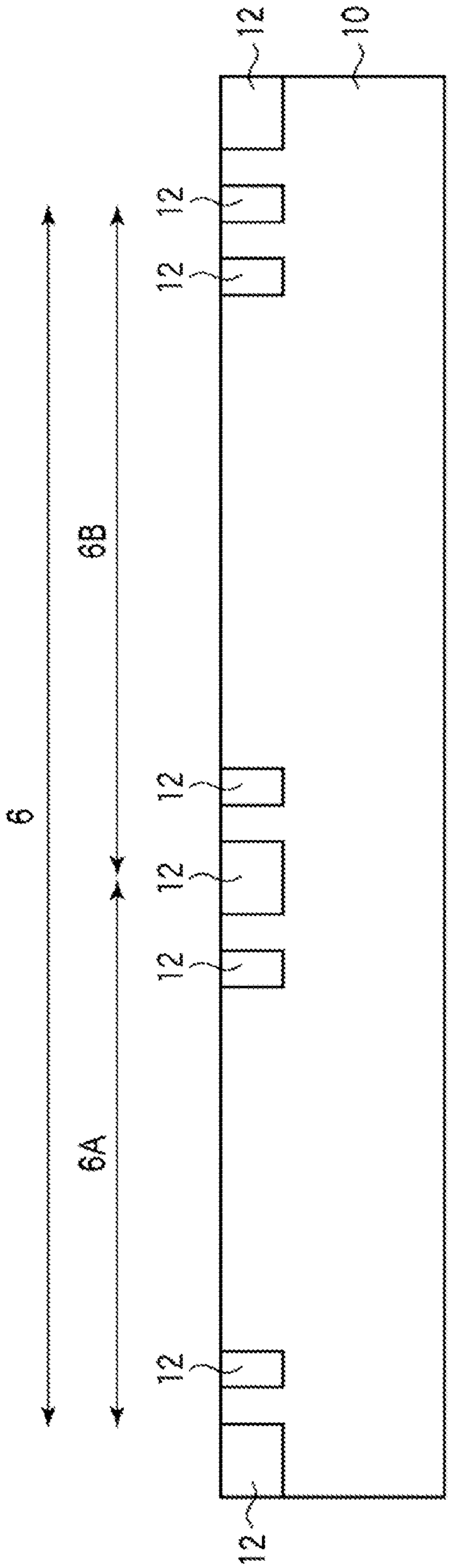
Figure 4A:
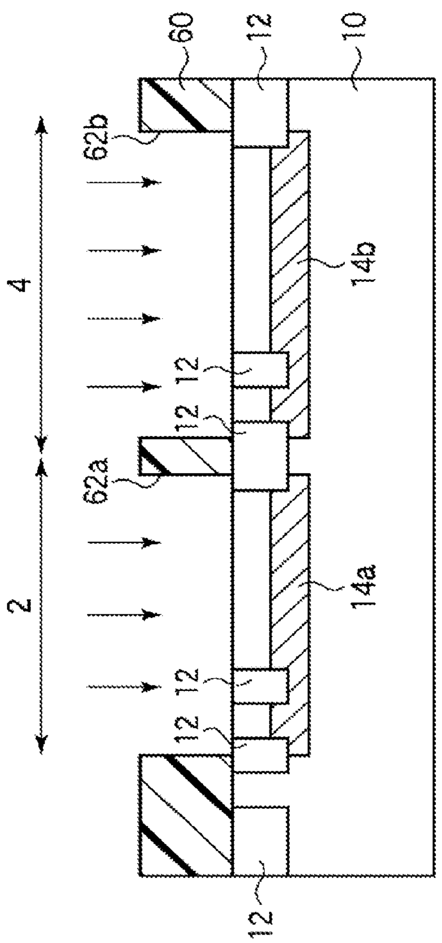
Figure 4B:
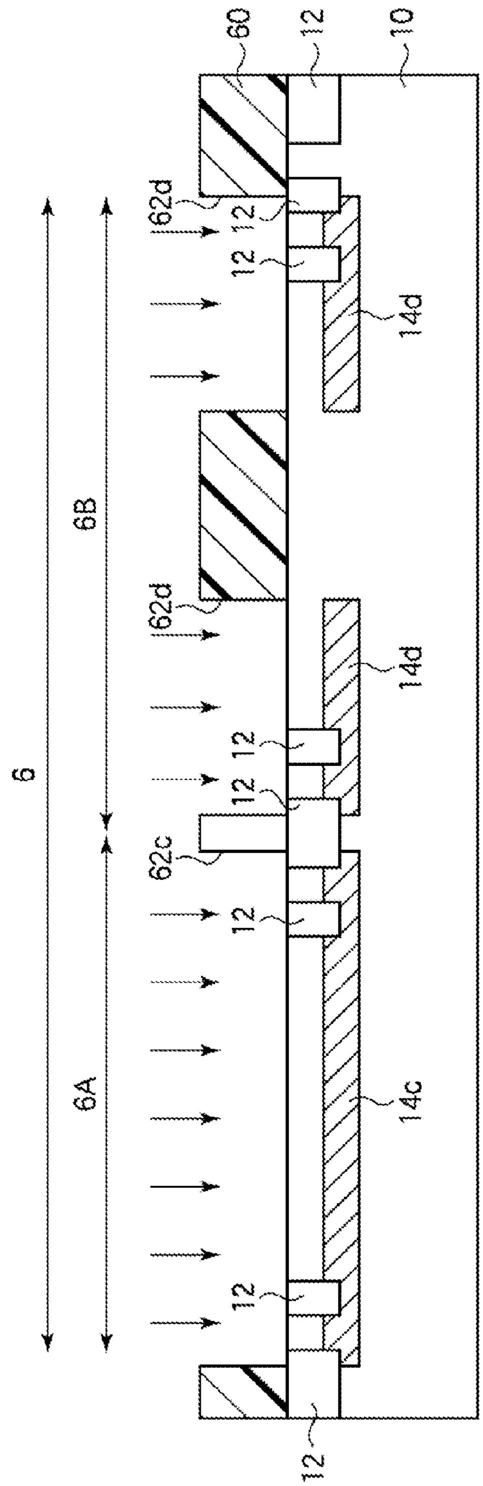
Figure 5A:
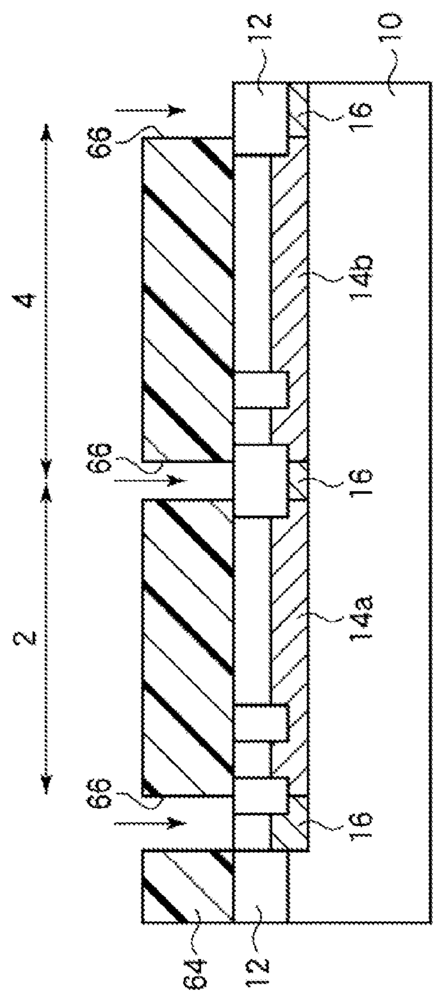
Figure 5B:
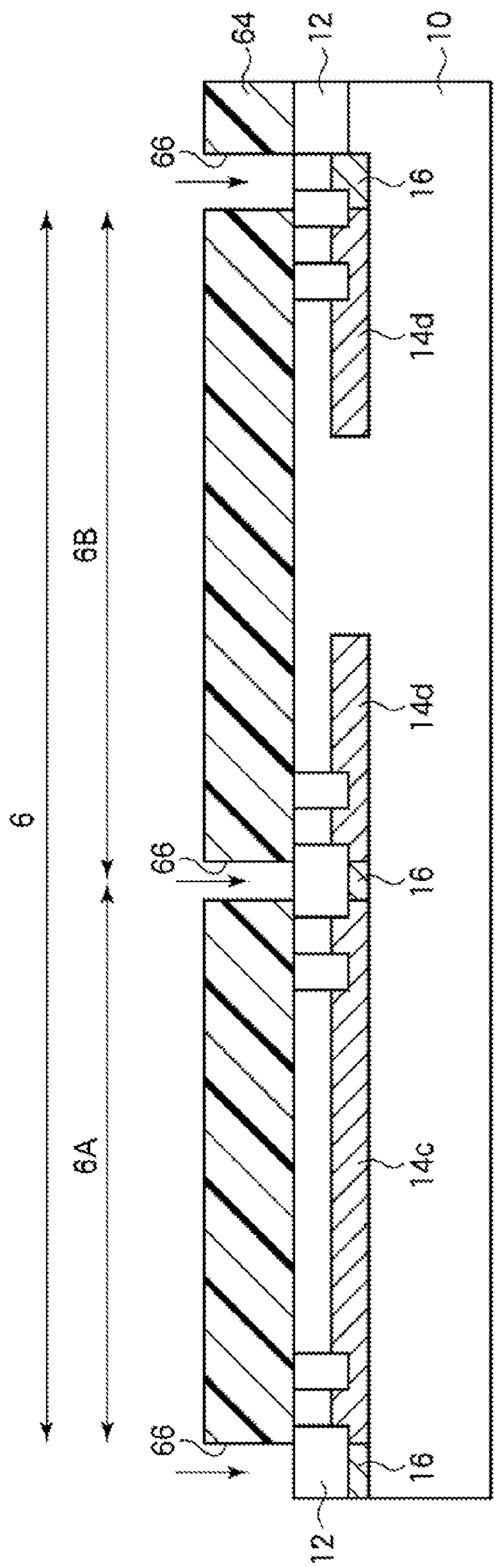
Figure 6A:
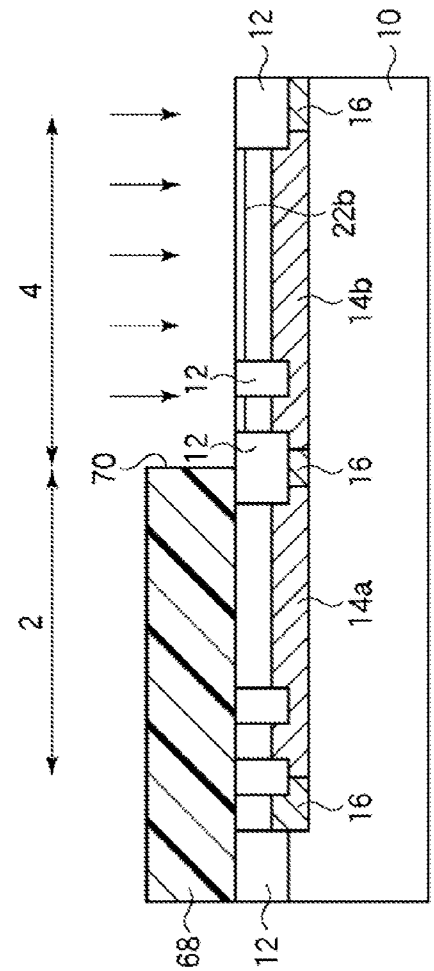
Figure 6B:
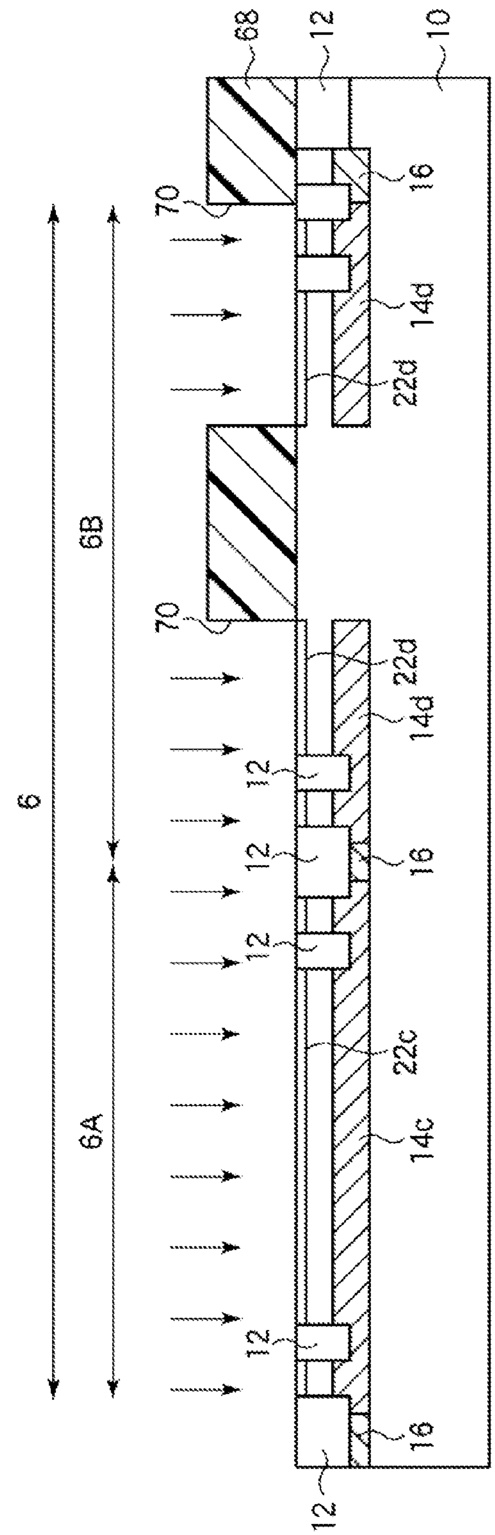
Figure 7A:
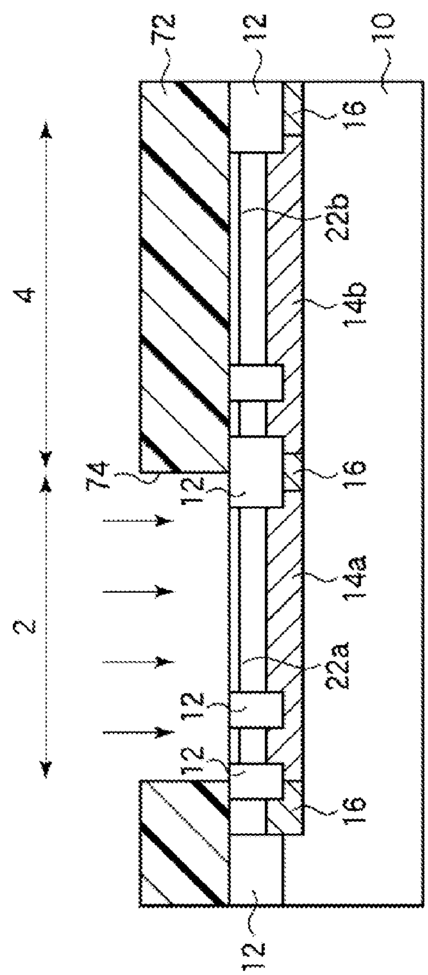
Figure 7B:
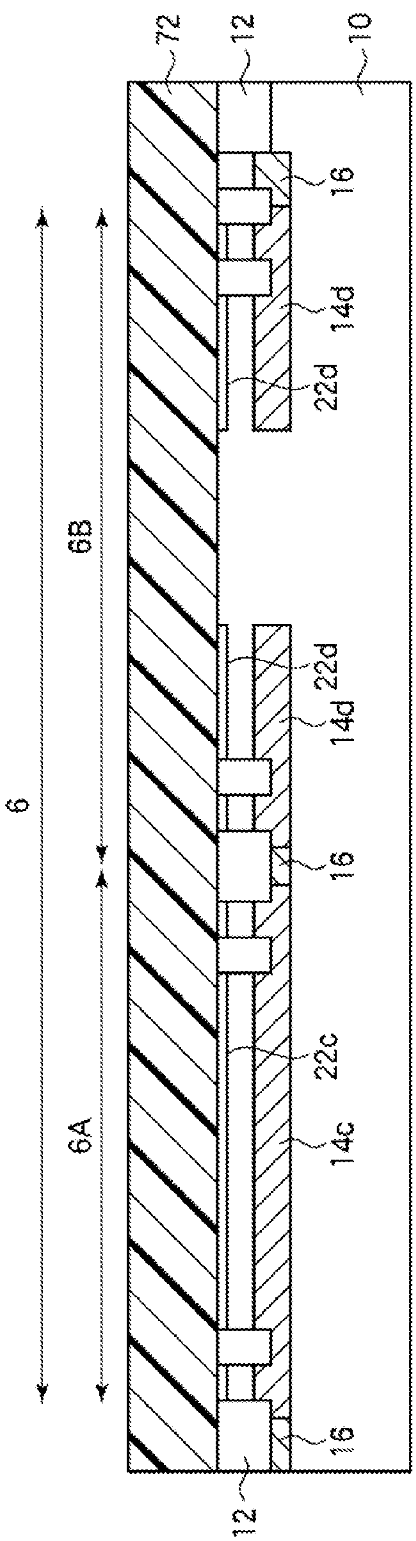
Figure 8A:
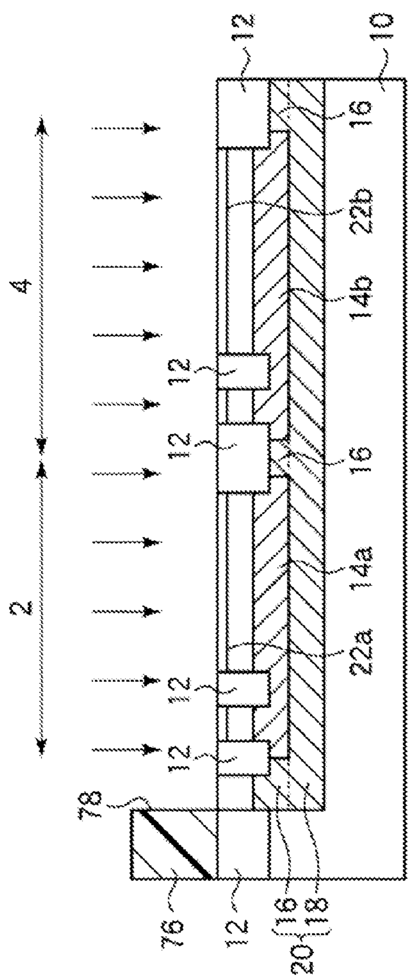
Figure 8B:
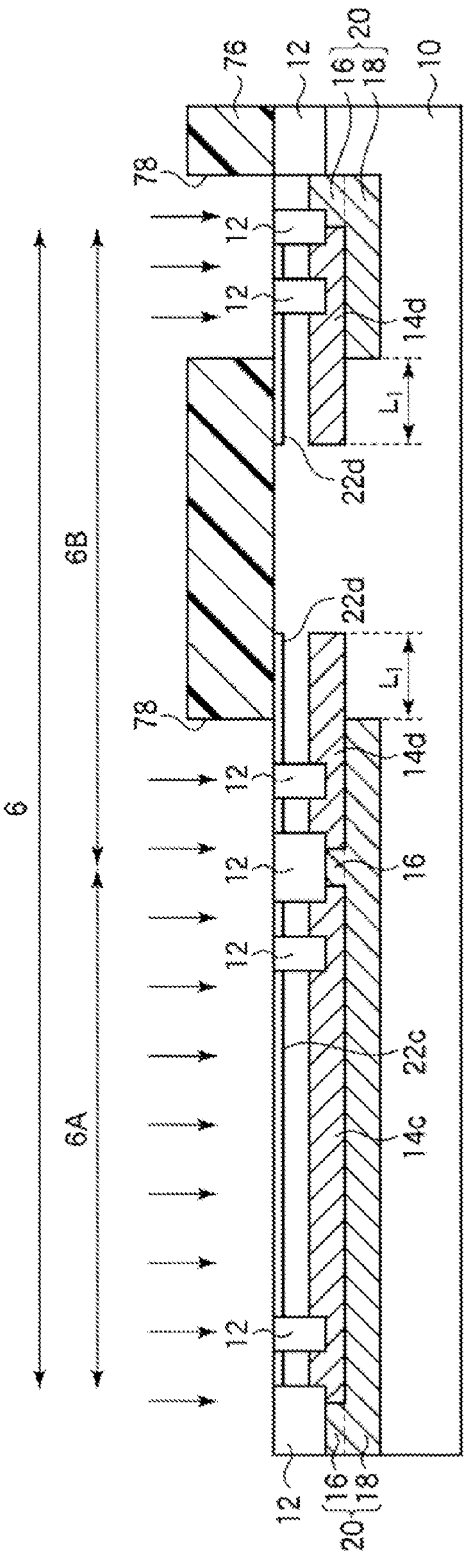

First, as illustrated in FIGS. 3A and 3B, the chip separation region 12 for determining a chip region is formed, for example, by the STI method.

Next, a photoresist film 60 is formed on the entire surface, for example, by the spin coat method.

Next, the photoresist film 60 is subjected to patterning using the photolithographic technique. Thus, opening portions 62*a* to 62*d* for forming P-type wells 14*a* to 14*d* are formed on the photoresist film 60 (see FIGS. 4A and 4B). The opening portion 62*d* for forming the P-type well 14*d*, and the region where dopant impurities for forming the low-concentration drain region 28*h* are introduced (see FIGS. 10A and 10B) are mutually separated on design data or reticle.

Next, P-type dopant impurities are introduced into the semiconductor substrate 10, for example, by the ion-implantation technique with the photoresist film 60 as a mask, thereby forming P-type wells 14*a* to 14*d*. As for the P-type dopant impurities, boron (B) is employed, for example. Let us say that the acceleration energy is, for example, 100 to 200 keV, and the doze amount is, for example, $2\times10^{13}$ to $5\times10^{13}$ $cm^{-2}$ or so. The P-type well 14*d* is formed in a region except for the region where the low-concentration drain region 28*h* is formed so as to be separated from the region where the low-concentration drain region 28*h* is formed. That is to say, the P-type well 14*d* is formed so as to be separated from the region where dopant impurities for forming the low-concentration drain region 28*h* are introduced.

Subsequently, the photoresist film 60 is peeled off, for example, by ashing.

Next, a photoresist film 64 is formed on the entire surface, for example, by the spin coat method.

Next, the photoresist film 64 is subjected to patterning using the photolithographic technique. Thus, an opening portion 66 for forming the N-type diffusion layer 16 is formed on the photoresist film 64 (see FIGS. 5A and 5B). Also, an opening portion (not illustrated in the drawing) for forming an N-type well (not illustrated in the drawing) in a region where the PMOS transistor is formed (not illustrated in the drawing) is also formed on the photoresist film 64.

Next, N-type dopant impurities are introduced into the semiconductor substrate 10, for example, by the ion-implantation technique with the photoresist film 64 as a mask, thereby forming the N-type diffusion layer 16. At this time, an N-type well (not illustrated in the drawing) is formed in a region where the PMOS transistor is formed (not illustrated in the drawing). As for the N-type dopant impurities, phosphorus (P) is employed, for example. Let us say that the acceleration energy is, for example, 300 to 400 keV, and the doze amount is, for example, $2\times10^{13}$ to $5\times10^{13}$ $cm^{-2}$ or so. In this way, the N-type diffusion layer 16 is formed so as to surround the side portions of the P-type wells 14*a* to 14*d*. Note that the N-type diffusion layer 16 is not formed in the portion on the drain diffusion layer 34*h* (see FIGS. 1A and 1B) side of the P-type well 14*d* formed inside of the high-withstand-voltage transistor formation region 6B.

Subsequently, the photoresist film 64 is peeled off, for example, by ashing.

Next, a photoresist film 68 is formed on the entire surface, for example, by the spin coat method.

Next, the photoresist film 68 is subjected to patterning using the photolithographic technique. Thus, an opening portion 70 for forming the channel dope layers 22*b* to 22*d* is formed on the photoresist film 68 (see FIGS. 6A and 6B). The channel dope layer 22*a* of the core transistor formation region 2 is separately formed, and accordingly, the photoresist film 68 is formed so as to cover the core transistor formation region 2. The opening portion 70 for forming the channel dope layer 22*d*, and the region where dopant impurities for forming the low-concentration drain region 28*h* are introduced (see FIGS. 10A and 10B) are mutually separated on design data or reticle.

Next, P-type dopant impurities are introduced into the semiconductor substrate 10, for example, by the ion-implantation technique with the photoresist film 68 as a mask, thereby forming the channel dope layers 22*b* to 22*d*. As for the P-type dopant impurities, B is employed, for example. Let us say that the acceleration energy is, for example, 30 to 40 key, and the doze amount is, for example, $3\times10^{12}$ to $6\times10^{12}$ $cm^{-2}$ or so. In this way, the channel dope layers 22*b* to 22*d* are formed. The channel dope layer 22*d* of the high-withstand-voltage transistor formation region 6B is formed in a region except for the region where the low-concentration drain region 28*h* is formed so as to be separated from the region where the low-concentration drain region 28*h* is formed. That is to say, the channel dope layer 22*d* is formed so as to be separated from the region where dopant impurities for forming the low-concentration drain region 28*h* are introduced.

Subsequently, the photoresist film 68 is peeled off, for example, by ashing.

Next, a photoresist film 72 is formed on the entire surface, for example, by the spin coat method.

Next, the photoresist film 72 is subjected to patterning using the photolithographic technique. Thus, an opening portion 74 for forming the channel dope layer 22*a* is formed on the photoresist film 72 (see FIGS. 7A and 7B).

Next, P-type dopant impurities are introduced into the semiconductor substrate 10, for example, by the ion-implantation technique with the photoresist film 72 as a mask, thereby forming the channel dope layers 22*a*. As for the P-type dopant impurities, B is employed, for example. Let us say that the acceleration energy is, for example, 10 keV or so, and the doze amount is, for example, $1\times10^{13}$ to $2\times10^{13}$ $cm^{-2}$ or so. In this way, the channel dope layer 22*a* is formed.

Subsequently, the photoresist film 72 is peeled off, for example, by ashing.

Next, a photoresist film 76 is formed on the entire surface, for example, by the spin coat method.

Next, the photoresist film 76 is subjected to patterning using the photolithographic technique. Thus, an opening portion 78 for forming the N-type embedded diffusion layer 18 is formed on the photoresist film 76 (see FIGS. 8A and 8B).

Next, N-type dopant impurities are introduced into the semiconductor substrate 10, for example, by the ion-implantation technique with the photoresist film 76 as a mask, thereby forming the N-type embedded diffusion layer 18. As for the N-type dopant impurities, P is employed, for example. Let us say that the acceleration energy is, for example, 600 to 700 keV or so, and the doze amount is, for example, $1\times10^{13}$ to $3\times10^{13}$ $cm^{-2}$ or so. In this way, the N-type embedded diffusion layer 18 is formed. The N-type embedded diffusion layer 18 and the N-type diffusion layer 16 are mutually connected. The N-type well 20 is formed by the N-type diffusion layer 16 and the N-type embedded diffusion layer 18. With the high-withstand-voltage transistor region 6B, the N-type embedded diffusion layer 18 is formed so that the edge portion on the drain diffusion layer 34*h* side of the N-type embedded diffusion layer 18 is separated from the edge portion on the drain diffusion layer 34*h* side of the P-type well 14. Let us say that distance $L_1$ between the edge portion on the drain diffusion layer 34*h* side of the N-type embedded diffusion layer 18, and the edge portion on the drain diffusion layer 34*h* side of the P-type well 14 is around 1 μm, for example.

Subsequently, the photoresist film 76 is peeled off, for example, by ashing.

Next, annealing (thermal processing) for activating the dopant impurities introduced into the semiconductor substrate 10 is performed. Let us say that the thermal processing temperature is, for example, 1000° C. or so, and the thermal processing time is, for example, 10 seconds or so.

Next, a gate insulating film 24 which is a silicon oxide film of, for example, film thickness 7 nm is formed on the surface of the semiconductor substrate 10, for example, by the thermal oxidation method.

Next, a polysilicon film of, for example, film thickness 100 nm is formed, for example, by the CVD method.

Figure 9A:
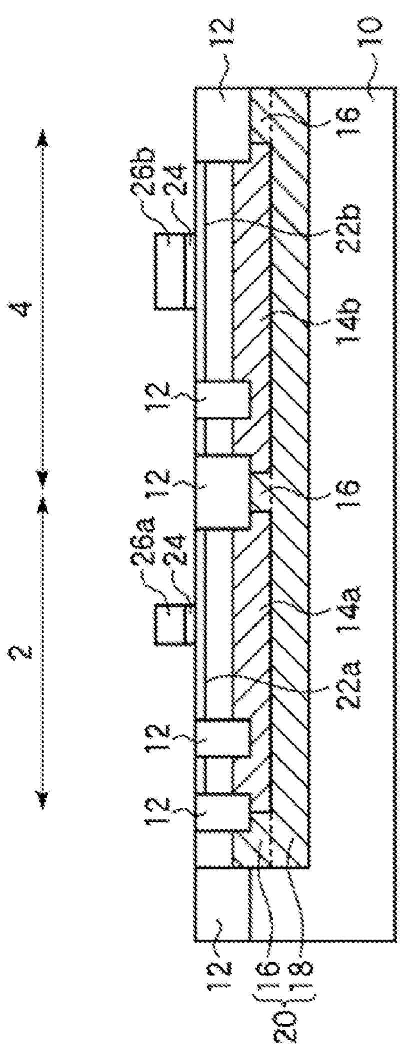
Figure 9B:
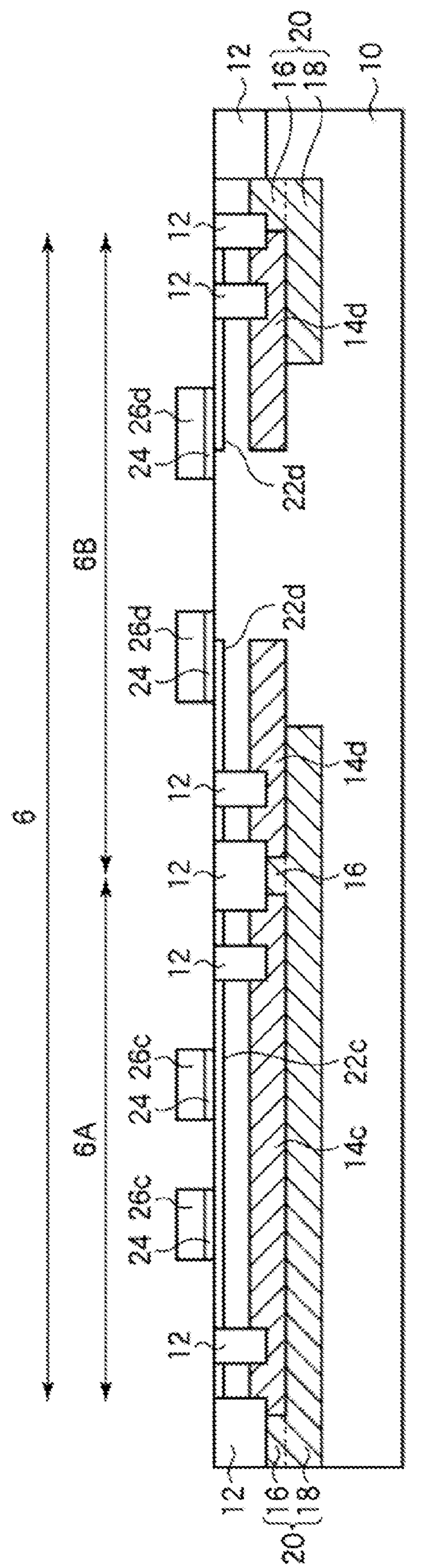
Figure 10A:
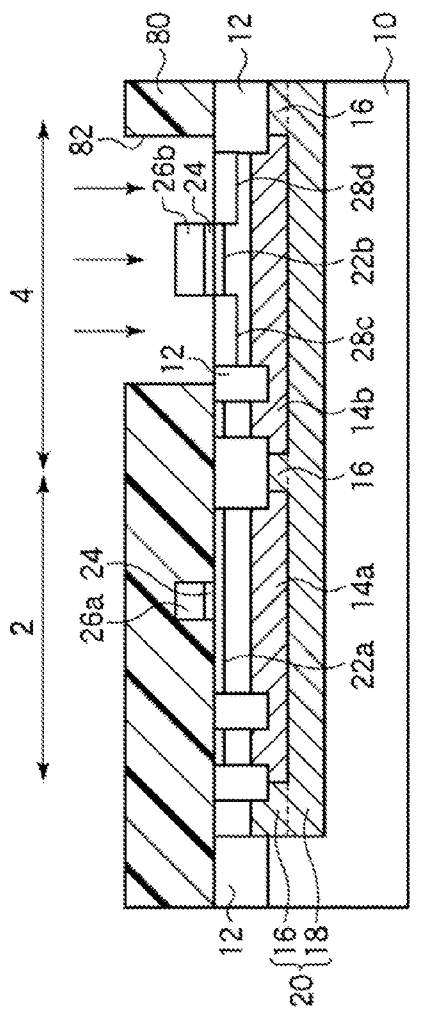
Figure 10B:
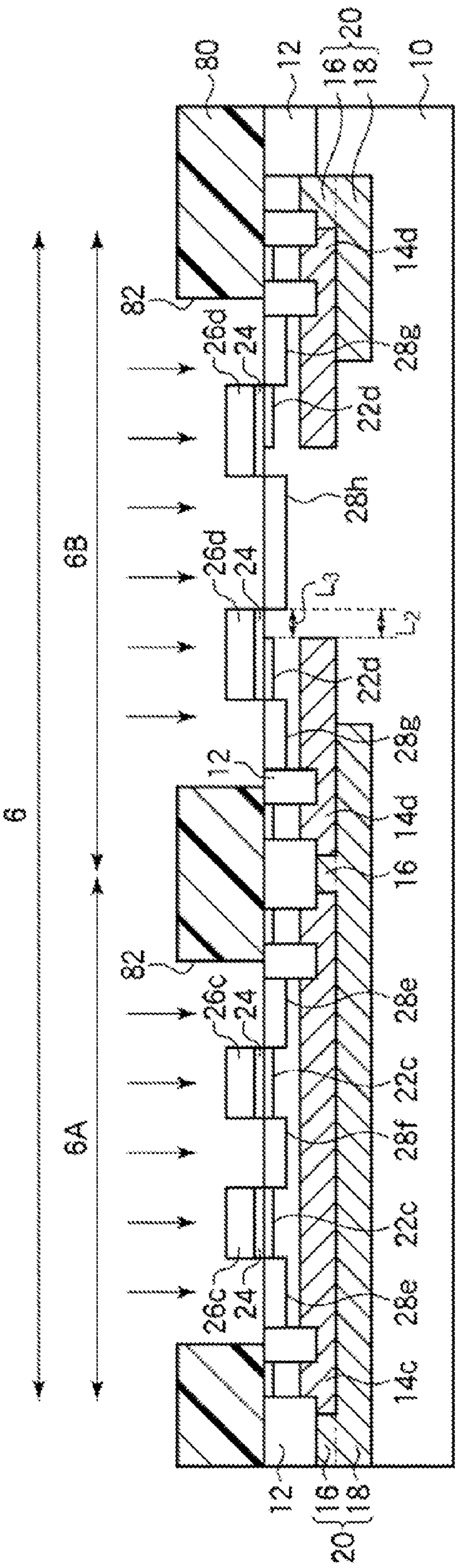
Figure 11A:
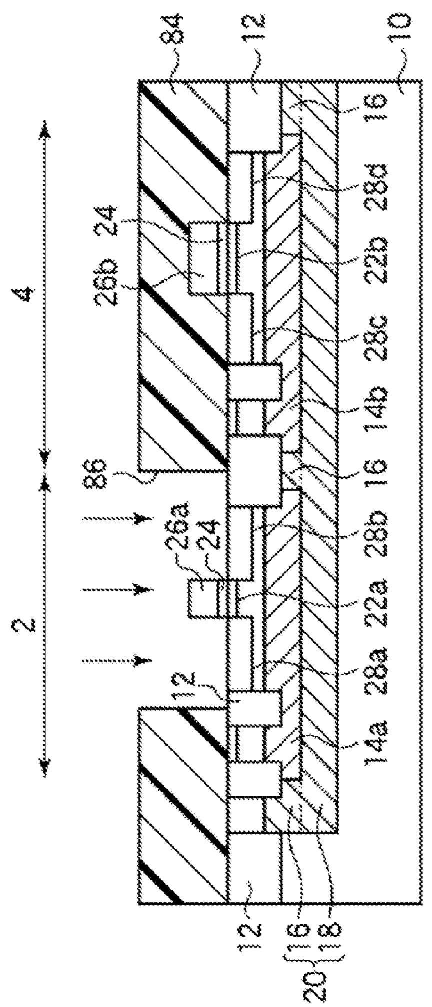
Figure 11B:
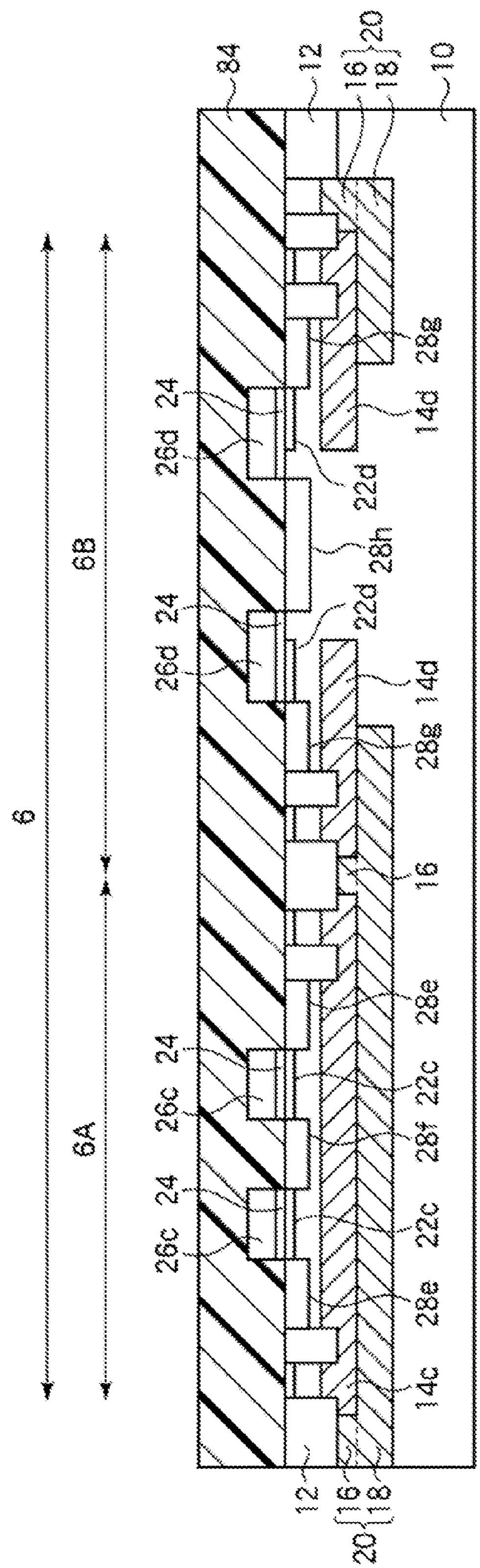
Figure 12A:
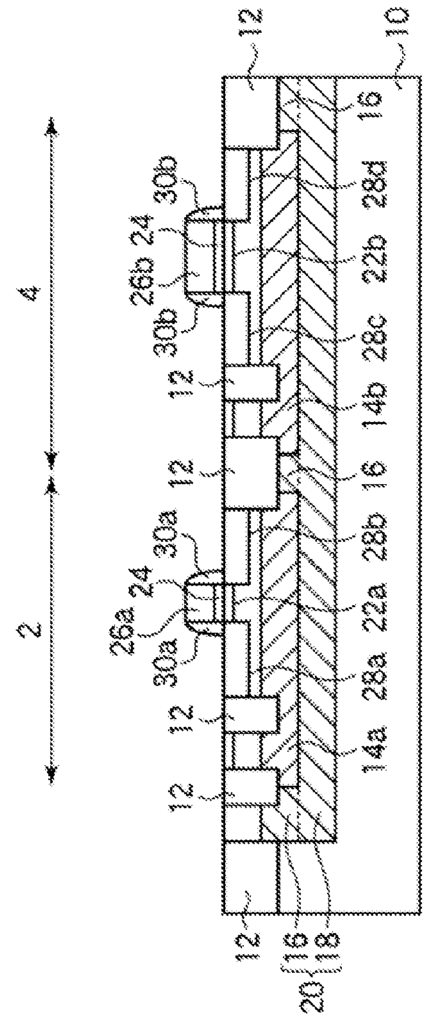
Figure 12B:
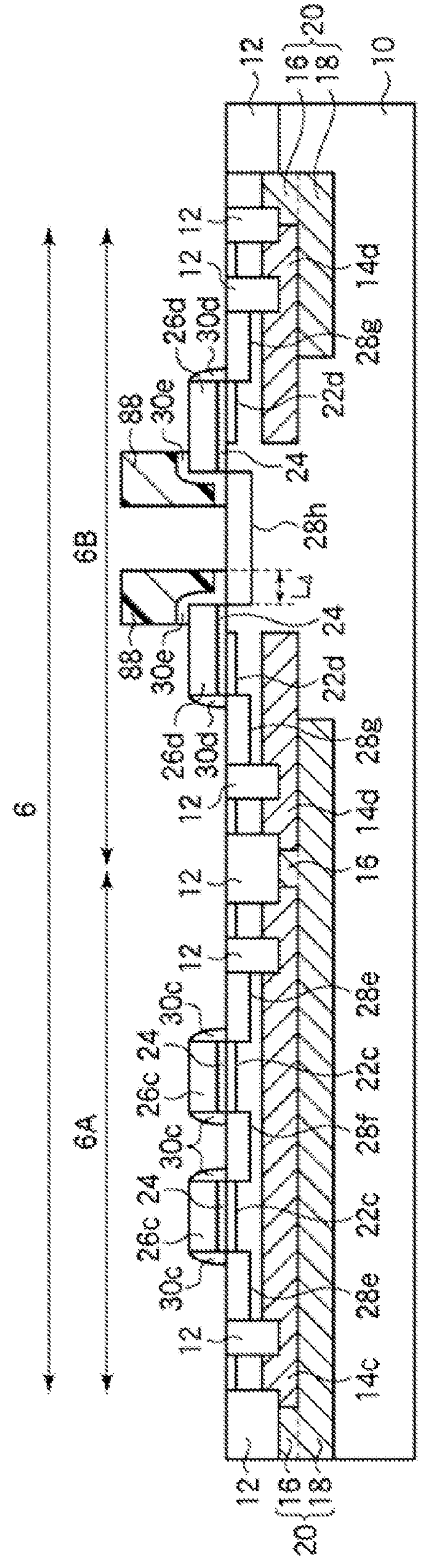
Figure 13A:
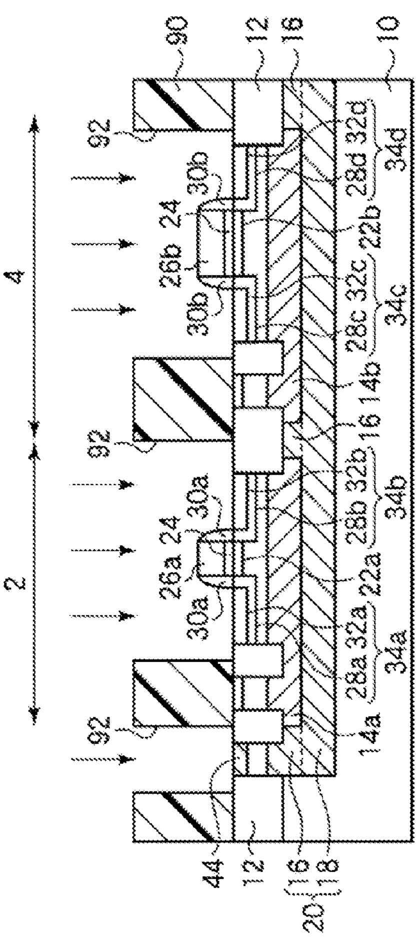
Figure 13B:
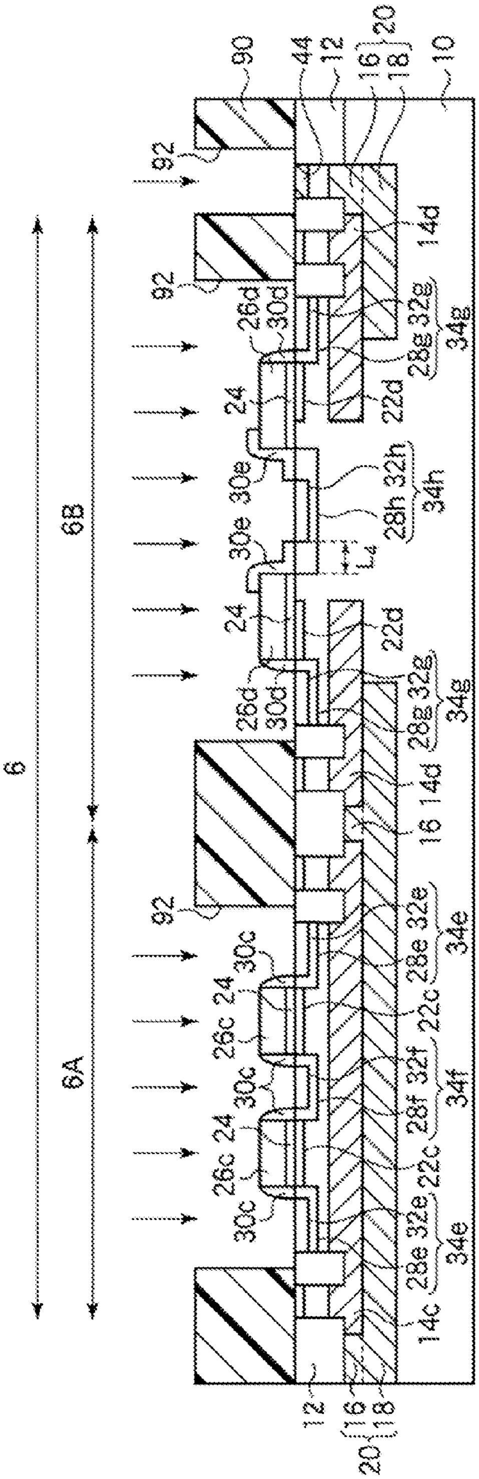
Figure 14A:
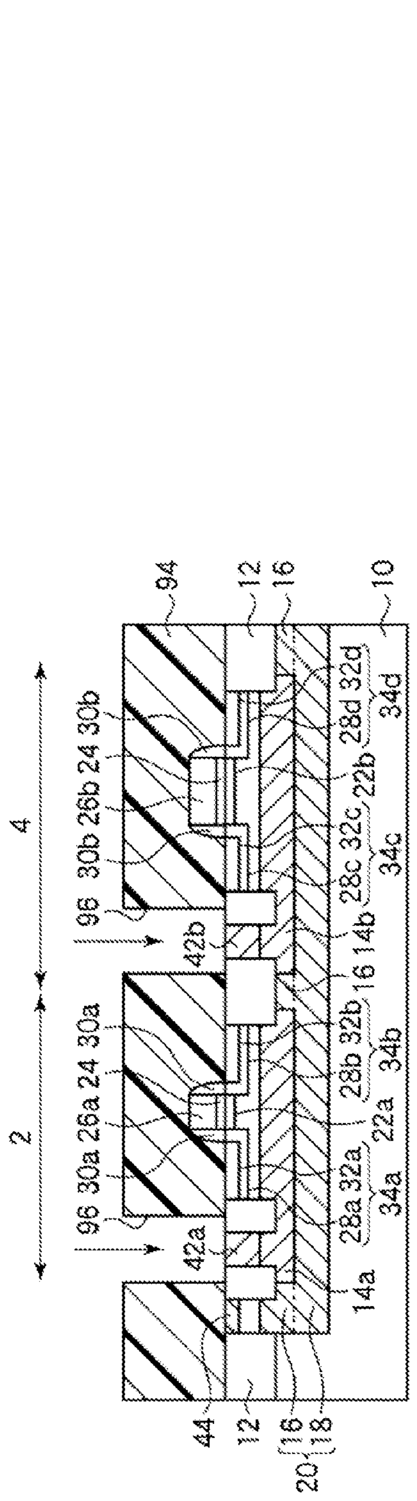
Figure 14B:
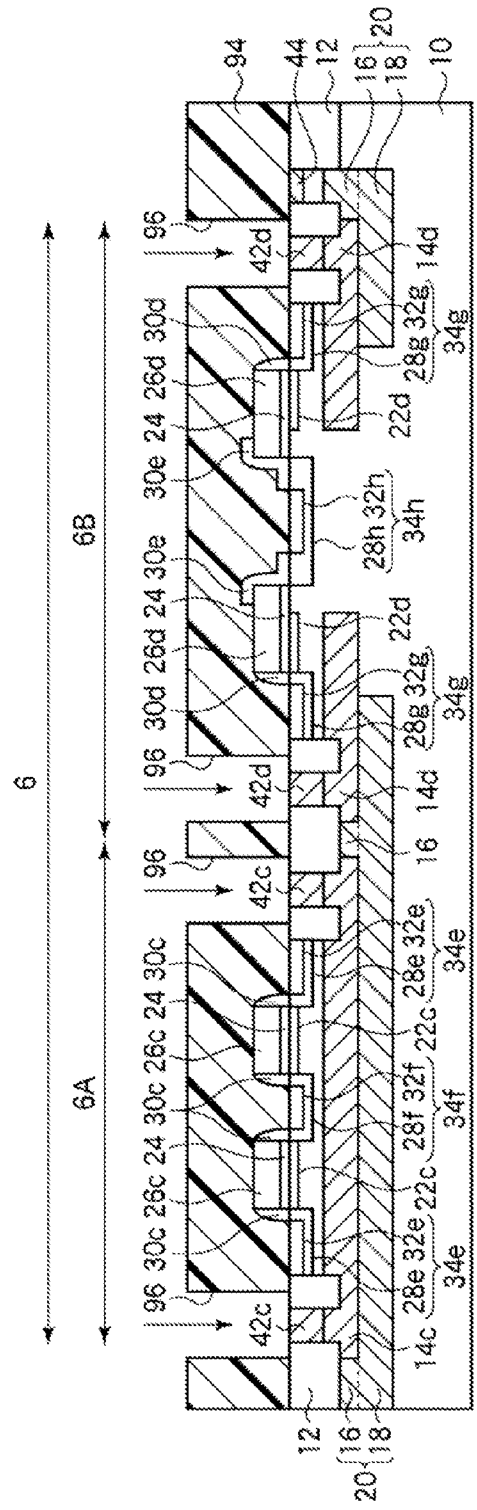
Figure 15A:
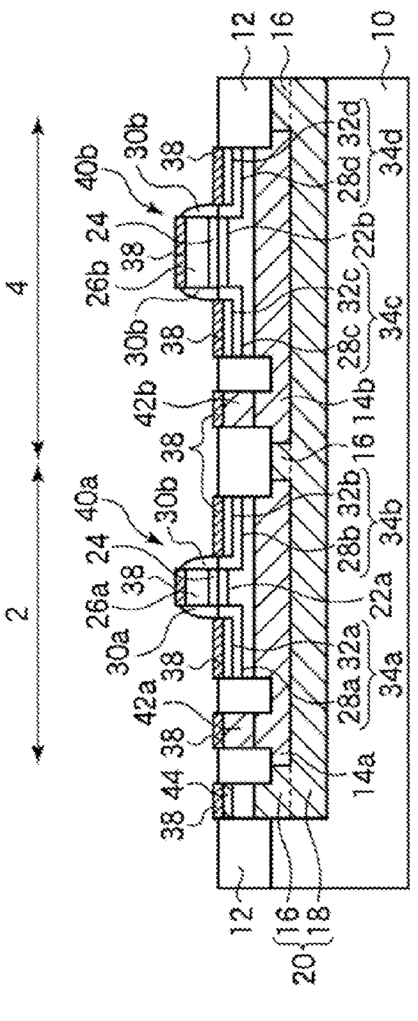
Figure 15B:
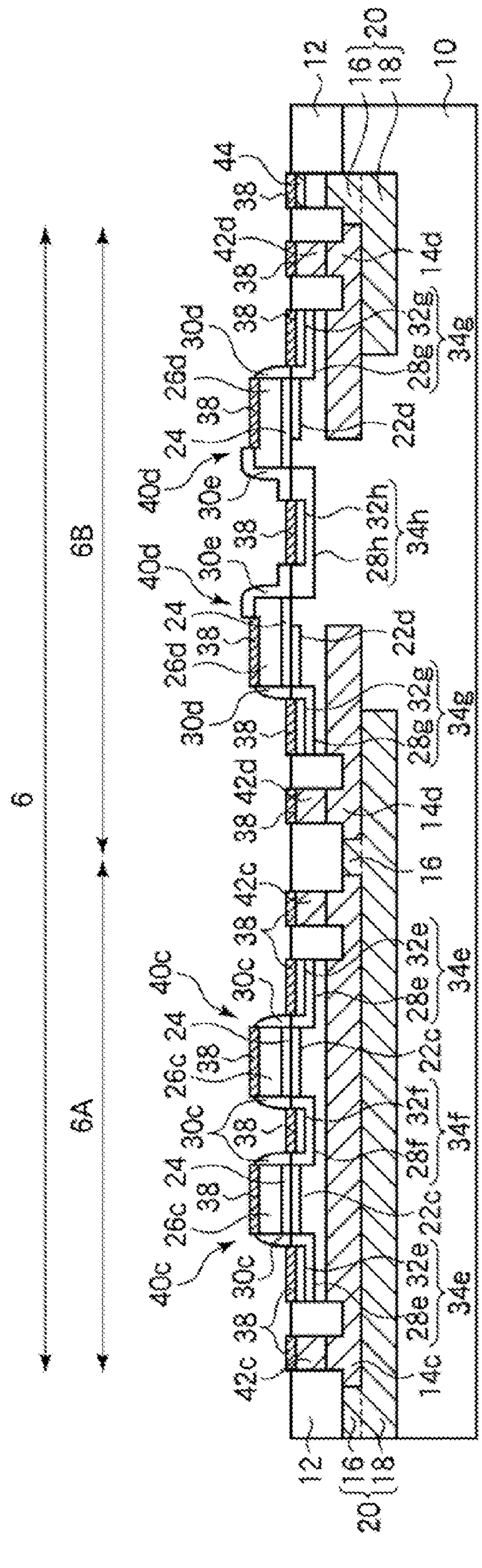

Next, the polysilicon film is subjected to patterning using the photolithographic technique, thereby forming polysilicon gate electrodes 26*a* to 26*d* (see FIGS. 9A and 9B)

Next, a photoresist film 80 is formed on the entire surface, for example, by the spin coat method.

Next, the photoresist film 80 is subjected to patterning using the photolithographic technique. Thus, an opening portion 82 for exposing each of the input/output transistor formation region 4, previous stage transistor formation region 6A, and high-withstand-voltage transistor formation region 6B is formed on the photoresist film 80 (see FIGS. 10A and 10B).

Next, N-type dopant impurities are introduced into the semiconductor substrate 10, for example, by the ion-implantation technique with the photoresist film 80 as a mask, thereby forming the N-type low-concentration diffusion layers (extension regions) 28*c* to 28*h*. As for the N-type dopant impurities, P is employed, for example. Let us say that the acceleration energy is, for example, 30 keV or so, and the doze amount is, for example, $1\times10^{13}$ $cm^{-2}$ or so. In this way, the N-type low-concentration diffusion layers 28*c* to 28*h* are formed.

Subsequently, the photoresist film 80 is peeled off, for example, by ashing.

Next, a photoresist film 84 is formed on the entire surface, for example, by the spin coat method.

Next, the photoresist film 84 is subjected to patterning using the photolithographic technique. Thus, an opening portion 86 for exposing the core transistor formation region 2 is formed on the photoresist film 84 (see FIGS. 11A and 11B).

Next, N-type dopant impurities are introduced into the semiconductor substrate 10, for example, by the ion-implantation technique with the photoresist film 84 as a mask, thereby forming the N-type low-concentration diffusion layers 28*a* and 28*b*. As for the N-type dopant impurities, As (arsenic) is employed, for example. Let us say that the acceleration energy is, for example, 5 keV or so, and the doze amount is, for example, $1\times10^{14}$ to $2\times10^{14}$ $cm^{-2}$ or so. In this way, the N-type low-concentration diffusion layers 28*a* and 28*b* are formed.

Subsequently, the photoresist film 84 is peeled off, for example, by ashing.

Next, a silicon oxide film of, for example, film thickness 100 nm is formed on the entire surface, for example, by the CVD method.

Next, a photoresist film 88 is formed on the entire surface, for example, by the spin coat method.

Next, the photoresist film 88 is subjected to patterning using the photolithographic technique. Thus, the photoresist film 88 for forming the spacer 30*e* is formed (see FIGS. 12A and 12B).

Next, the silicon oxide film is subject to etching with the photoresist film 88 as a mask. Thus, the side wall insulating films 30*a* to 30*c* of the silicon oxide film are formed on the side wall portions of the gate electrodes 26*a* to 26*c*. Also, the side wall insulating film 30*d* of the silicon oxide film is formed on the side wall portion on the low-concentration source region 28*g* side of the gate electrode 26*d*. The spacer 30*e* of the silicon oxide film is formed on a portion including the side wall on the low-concentration drain region 28*h* side of the gate electrode 26*d*. The spacer 30*e* serves as a mask (injection block) for preventing injection of dopant impurities at the time of forming the high-concentration drain region 32*h*. Also, the spacer 30*e* serves as a mask (silicide block) for preventing being subjected to silicide at the time of forming the silicide film 38. Accordingly, the spacer 30*e* is formed so as to cover not only the side wall portion of the gate electrode 26*d* but also a portion of the low-concentration drain region 28*h*. Let us say that distance $L_4$ between the gate electrode 26*d*, and the edge portion of the spacer 30*e* is 180 nm or so, for example.

Next, a photoresist film 90 is formed on the entire surface, for example, by the spin coat method.

Next, the photoresist film 90 is subjected to patterning using the photolithographic technique. Thus, an opening portion 92 for exposing each of the core transistor formation region 2, input/output transistor formation region 4, previous stage transistor formation region 6A, high-withstand-voltage transistor formation region 6B, and N-type contact region (well tap region) 44 is formed on the photoresist film 90 (see FIGS. 13A and 13B).

Next, N-type dopant impurities are introduced into the semiconductor substrate 10, for example, by the ion-implantation technique with the photoresist film 90 as a mask, thereby forming the N-type high-concentration diffusion layers 32*a* to 32*h* and N-type contact region 44. As for the N-type dopant impurities, P is employed, for example. Let us say that the acceleration energy is, for example, 8 to 10 keV or so, and the doze amount is, for example, $5\times10^{15}$ to $8\times10^{15}$ $cm^{-2}$ or so. In this way, the N-type high-concentration diffusion layers 32*a* to 32*h* and N-type contact region 44 are formed. Source/drain diffusion layers 34*a* to 34*h* having an extension source/drain configuration or LDD configuration are formed by the low-concentration diffusion layers 28*a* to 28*h* and high-concentration diffusion layers 32*a* to 32*h*. The N-type contact region 44 is electrically connected to the N-type well 20 by thermal processing or the like, which will be performed in a later process.

Subsequently, the photoresist film 90 is peeled off, for example, by ashing.

Next, a photoresist film 94 is formed on the entire surface, for example, by the spin coat method.

Next, the photoresist film 94 is subjected to patterning using the photolithographic technique. Thus, an opening portion 96 for exposing each of the P-type contact regions (well tap regions) 42*a* to 42*d* is formed on the photoresist film 94 (see FIGS. 14A and 14B).

Next, P-type dopant impurities are introduced into the semiconductor substrate 10, for example, by the ion-implantation technique with the photoresist film 94 as a mask, thereby forming the P-type contact regions 42*a* to 42*d*. As for the P-type dopant impurities, B is employed, for example. Let us say that the acceleration energy is, for example, 4 to 10 keV or so, and the doze amount is, for example, $4\times10^{15}$ to $6\times10^{15}$ $cm^{-2}$ or so. In this way, the P-type contact regions 42*a* to 42*d* are formed.

Subsequently, the photoresist film 94 is peeled off, for example, by ashing.

Next, a refractory metal film which is a cobalt film or nickel film of, for example, film thickness 20 to 50 nm is formed on the entire surface.

Next, a silicon atom within the semiconductor substrate 10 and a metal atom within the refractory metal film are caused to react, and also a silicon atom within the gate electrodes 26*a* to 26*d* and a metal atom within the refractory metal film are caused to react, by performing thermal processing. Subsequently, an unreacted refractory medal film is removed. In this way, the silicide film 38 of, for example, cobalt silicide or nickel silicide is formed on each of the source/drain diffusion layers 34*a* to 34*h*, gate electrodes 26*a* to 26*d*, and contact regions 42*a* to 42*d* and 44 (see FIGS. 15A and 15B).

Figures 16A, 16B:
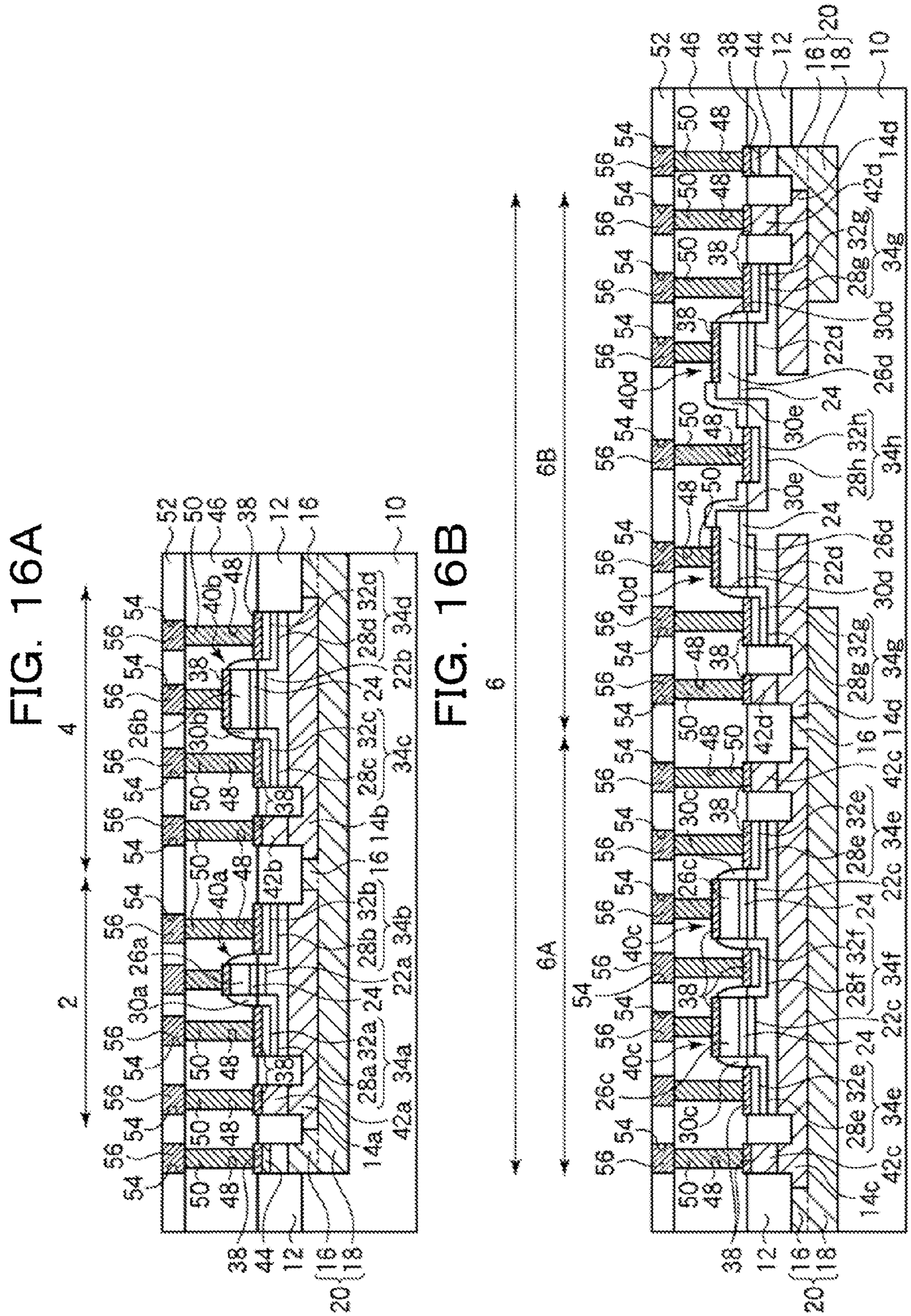

Next, an inter-layer insulating film 46 which is a silicon oxide film of, for example, film thickness 400 nm is formed on the entire surface, for example, by the CVD method (see FIGS. 16A and 16B).

A contact hole 48 which reaches each of the silicide films 38 is formed in the inter-layer insulating film 46 using the photolithographic technique.

Next, a barrier film (not illustrated in the drawing) is formed by sequentially layering a Ti film with film thickness of 10 to 20 nm, and a TiN film with film thickness of 10 to 20 nm on the entire surface, for example, by the spattering method.

Next, a tungsten film of, for example, film thickness 300 nm is formed, for example, by the CVD method.

Next, the tungsten film is polished until the surface of the inter-layer insulating film 46 is exposed, for example, by the CMP (Chemical Mechanical Polishing) method. Thus, for example, the conductor plug 50 of tungsten is embedded in the contact hole 48.

Next, an inter-layer insulating film 52 which is a silicon oxide film of, for example, film thickness 600 nm is formed on the entire surface, for example, by the CVD method.

Next, a groove 54 for embedding a wiring 56 is formed in the inter-layer insulating film 52 using the photolithographic technique.

Next, the wiring 56 of, for example, Cu (copper) is embedded in the groove 54 by the electrolytic plating method.

In this way, the semiconductor device according to the present embodiment is manufactured.

As described above, with the present embodiment, the channel dope layer 22*d* and so forth are formed so as to be separated from the region where dopant impurities for forming the low-concentration drain region 28*h* are introduced, thereby moderating the impurity profile on the drain side of the high-withstand-voltage transistor 40*d*. Therefore, with the present embodiment, there is no need to perform a process for forming the low-concentration drain region 28*h* separately from a process for forming other low-concentration source/drain regions 28*a* to 28*g*. That is to say, there is no need to form a photoresist film for forming the low-concentration drain region 28*h* separately from a photoresist film for forming other low-concentration source/drain regions 28*a* to 28*g*. Therefore, according to the present embodiment, the high-withstand-voltage transistor 26*d* may be obtained while realizing simplification of the manufacturing processes.

(Evaluation Results)

Next, the evaluation results of the semiconductor device according to the present embodiment will be described with reference to FIGS. 17 to 19.

Figure 17:
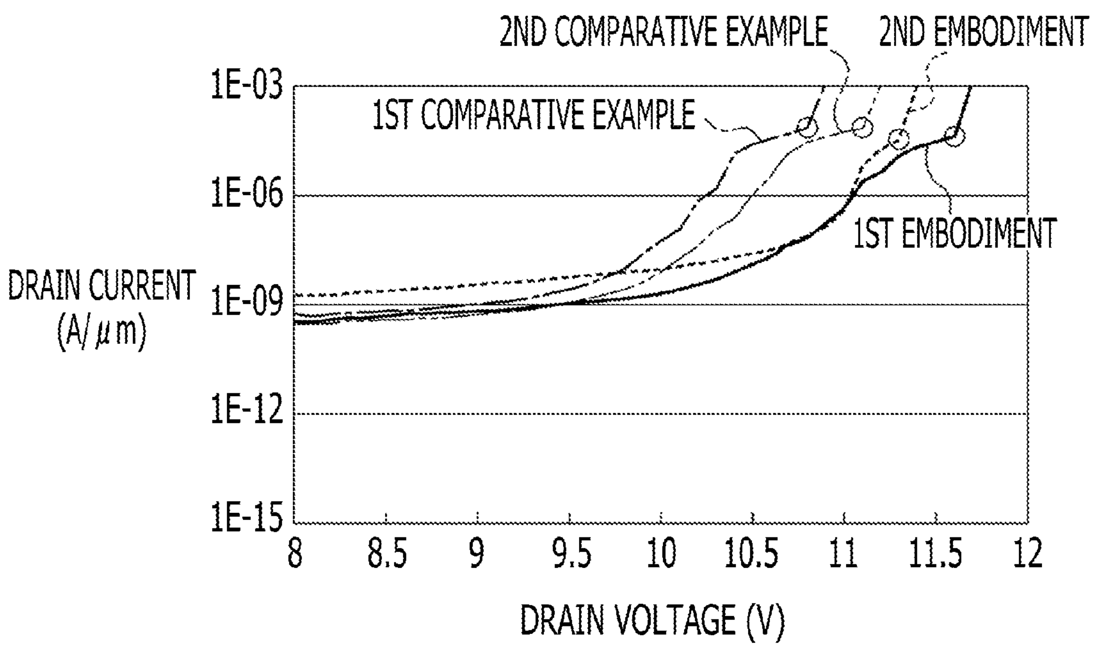
FIG. 17 is a graph illustrating the withstand voltage of a transistor.

FIG. 17 is a graph illustrating the withstand voltage of a transistor. The horizontal axis in FIG. 17 illustrates drain voltage, and the vertical axis in FIG. 17 illustrates drain current. The data in FIG. 17 was measured by setting the source voltage and gate voltage to 0V, and gradually increasing the drain voltage. A portion where the drain current rapidly increased is illustrated by surrounding this with a circle mark. The drain voltage at the time of the drain current rapidly increasing is drain current at the time of the transistor being destroyed.

A solid line in FIG. 17 illustrates a case of a first embodiment, i.e., a case of the high-withstand-voltage transistor 40*d* of the semiconductor device according to the present embodiment.

A dashed-dotted line in FIG. 17 illustrates a case of a first comparative example, i.e., a case of the transistor 40*c* formed on the previous stage of the power amplifier circuit of the semiconductor device according to the present embodiment.

Figure 18:
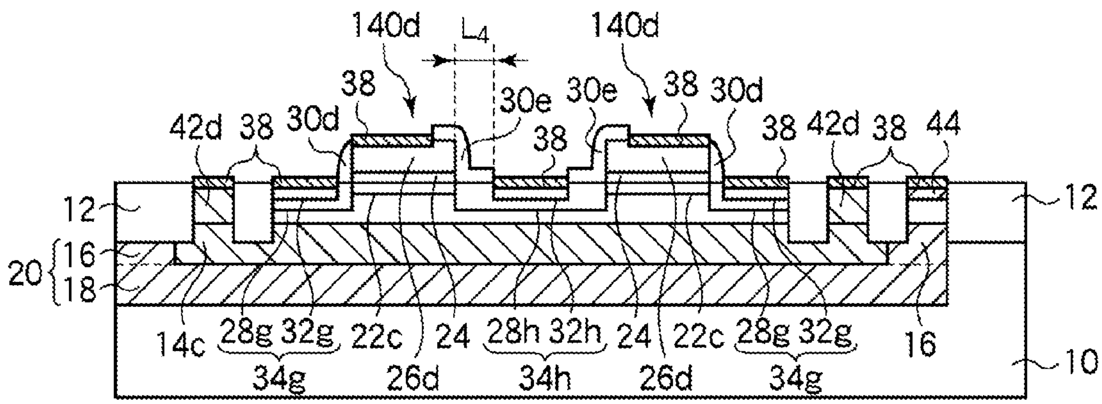
FIG. 18 is a cross-sectional view illustrating a transistor according to a second comparative example.

A dashed-two dotted line in FIG. 17 illustrates a case of a second comparative example, i.e., a case of the transistor 140*d* illustrated in FIG. 18.

FIG. 18 is a cross-sectional view illustrating the transistor according to the second comparative example. The transistor 140*d* according to the second comparative example differs from the high-withstand-voltage transistor 40*d* in that the channel dope layer 22*c* is formed by introducing dopant impurities to the entirety of a chip region. With the transistor 140*d* according to the second comparative example, the channel dope layer 22*c* abuts on the low-concentration drain region 28*c*. With the transistor 140*d* according to the second comparative example, in the same way as with the high-withstand-voltage transistor 40*d*, the distance $L_4$ between the gate electrode 26*d* and the high-concentration drain region 32*h* is set relatively great to 180 nm.

As may be understood from FIG. 17, with the first embodiment, i.e., with the high-withstand-voltage transistor 40*d* of the semiconductor device according to the present embodiment, withstand voltage is extremely high as compared to the first and second comparative examples.

Therefore, it may be found that the high-withstand-voltage transistor 40*d* having sufficiently high withstand voltage is obtained according to the present embodiment.

Figure 19:
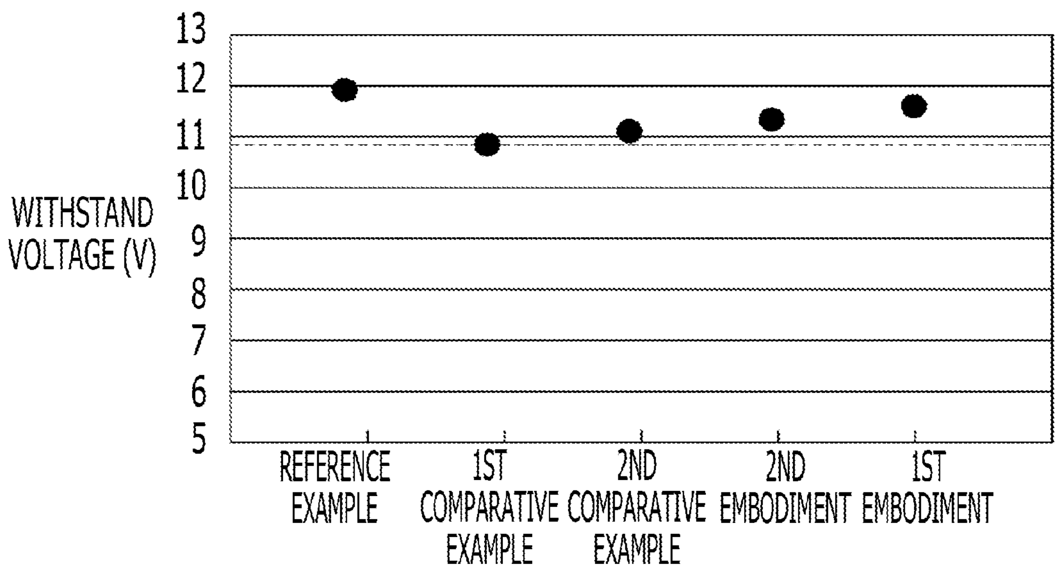
FIG. 19 is a graph illustrating comparison results of the withstand voltage of the transistor.
Figure 57A:
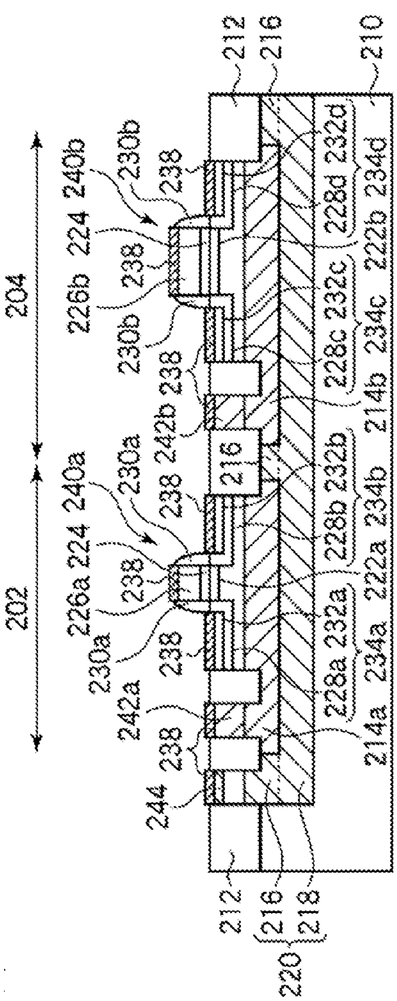
Figure 57B:
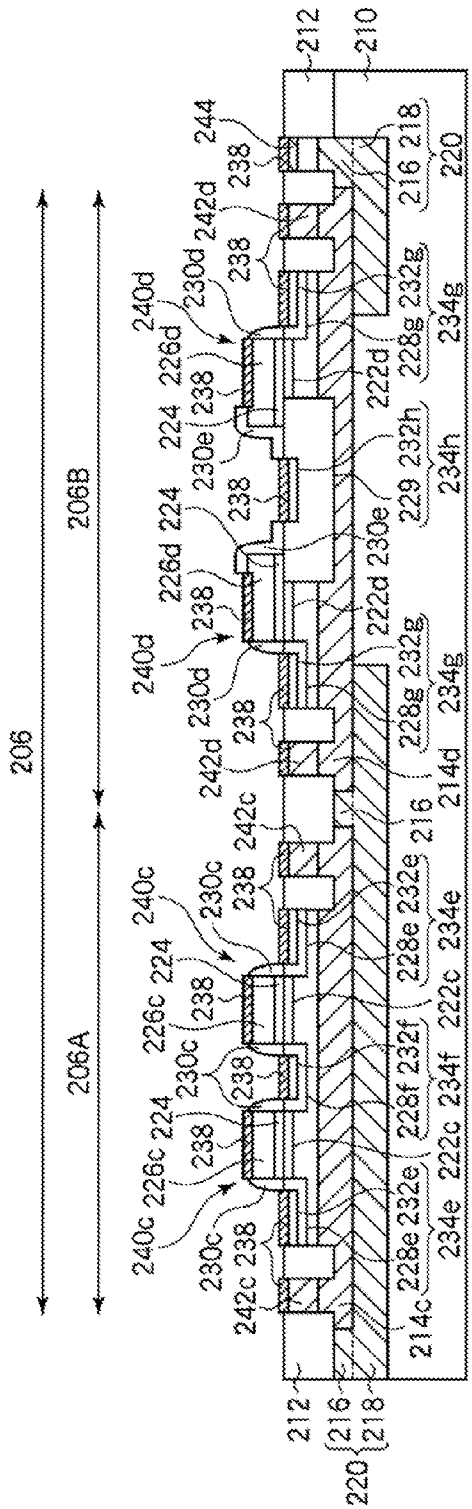

FIG. 19 is a graph illustrating the comparison results of the withstand voltage of a transistor. A reference example in FIG. 19 illustrates a case of the high-withstand-voltage transistor 240*d* of a semiconductor device according to a reference example illustrated in FIGS. 57A and 57B (FIG. 57). A first comparative example in FIG. 19 illustrates a case of the transistor 40*c* formed on the previous stage of the power amplifier circuit of the semiconductor device according to the present embodiment. A second comparative example in FIG. 19 illustrates a case of the transistor 140*d* illustrated in FIG. 18. A first embodiment in FIG. 19 illustrates a case of the high-withstand-voltage transistor 40*d* of the semiconductor device according to the present embodiment. A short dashed line in FIG. 19 illustrates an example of withstand voltage required of the transistor on the final stage of the power amplifier circuit.

As may be understood from FIG. 19, with the first embodiment, withstand voltage is extremely high as compared to the first and second comparative examples. The withstand voltage of the high-withstand-voltage transistor 40*d* of the first embodiment is lower than the withstand voltage of the high-withstand-voltage transistor 240*d* according to the reference example, but there is a sufficient margin as to the withstand voltage requested of the transistor on the final stage of the power amplifier circuit, and accordingly, there is no special problem.

(Modification (Part 1))

Figure 20A:
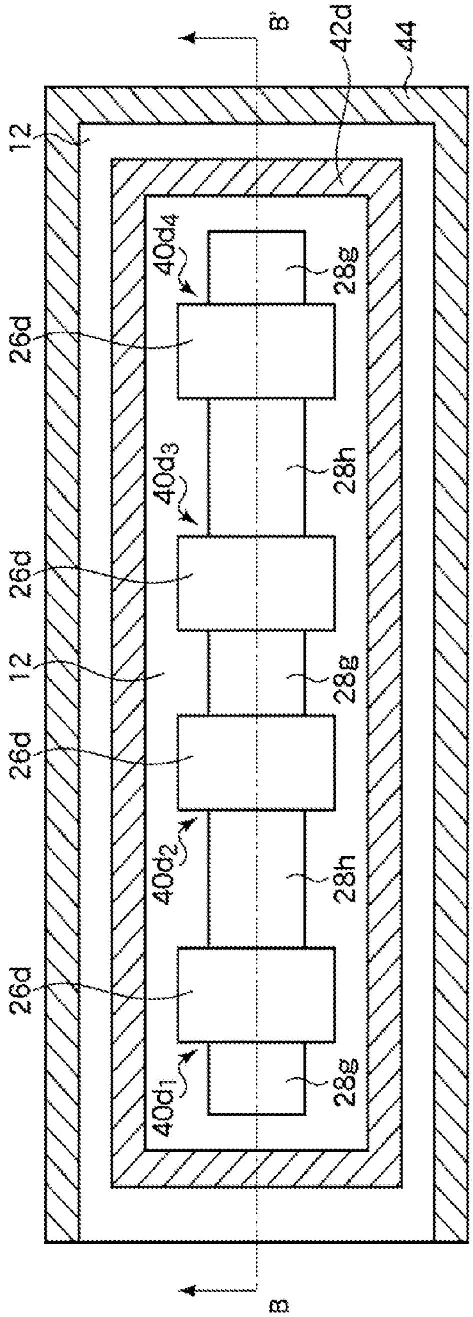
FIGS. 20A and 20B are a plane view and a cross-sectional view illustrating a semiconductor device according to a modification (Part 1) of the first embodiment, respectively.
Figure 20B:
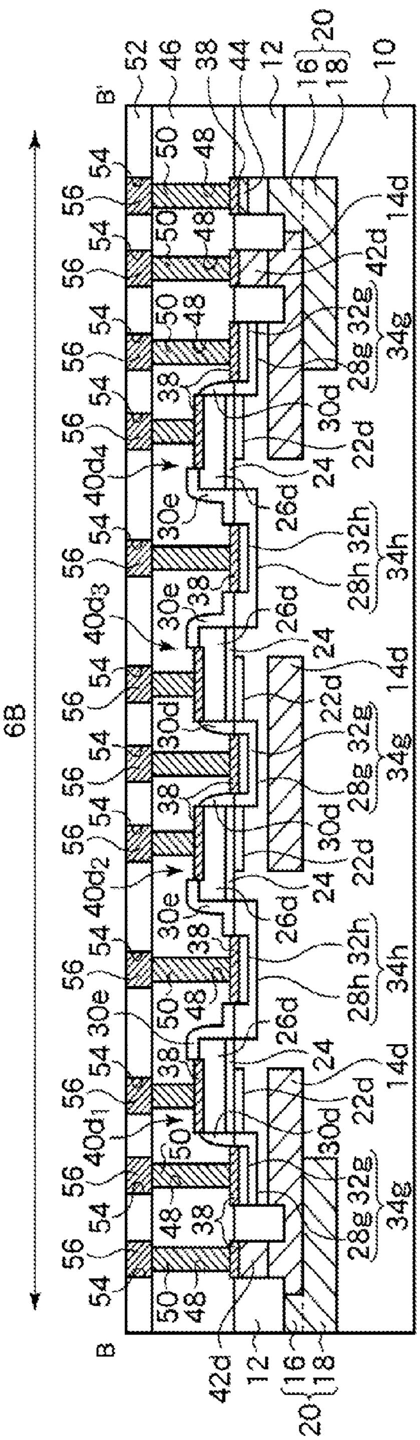

Next, description will be made regarding a semiconductor device according a modification (Part 1) of the present embodiment, with reference to FIGS. 20A and 20B. FIGS. 20A and 20B are a plane view and a cross-sectional view illustrating the semiconductor device according to the present modification. FIG. 20A is a plane view, and FIG. 20B is a cross-sectional view. FIG. 20B corresponds to a B-B' line cross-section in FIG. 20A.

As illustrated in FIGS. 20A and 20B, the source diffusion layers 34*g* and drain diffusion layers 34*h* of four high-withstand-voltage transistors 40*d*$_1$ to 40*d*$_4$ are alternately disposed.

The drain diffusion layer 34*h* of the high-withstand-voltage transistor 40*d*$_1$, and the drain diffusion layer 34*h* of the high-withstand-voltage transistor 40*d*$_2$ are formed by the common drain diffusion layer 34*h*.

The drain diffusion layer 34*h* of the high-withstand-voltage transistor 40*d*$_3$, and the drain diffusion layer 34*h* of the high-withstand-voltage transistor 40*d*$_4$ are formed by the common drain diffusion layer 34*h*.

The source diffusion layer 34*g* of the high-withstand-voltage transistor 40*d*$_2$, and the source diffusion layer 34*g* of the high-withstand-voltage transistor 40*d*$_3$ are formed by the common source diffusion layer 34*g*.

With the present modification, no N-type well 20 is formed under the high-withstand-voltage transistors 40*d*$_2$ and 40*d*$_3$.

The contact region (well tap region) 42*d* for applying prescribed bias voltage to the P-type well 42*d* is formed so as to surround a region where the high-withstand-voltage transistors 40*d*$_1$ to 40*d*$_4$ are formed.

Also, the contact region (well tap region) 44 for applying prescribed bias voltage to the N-type well 40 is formed so as to surround the contact region 42*d*.

In this way, the multiple high-withstand-voltage transistors 40*d*$_1$ to 40*d*$_4$ may be connected by alternately disposing the source diffusion layer 34*g* and the drain diffusion layer 34*h*.

(Modification (Part 2))

Figure 21A:
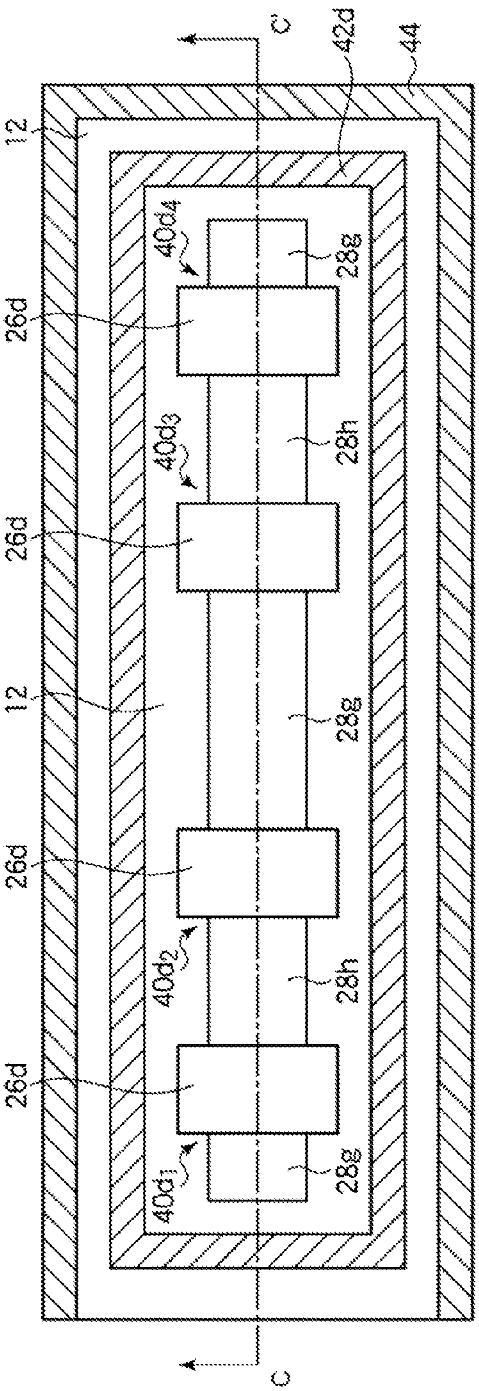
FIGS. 21A and 21B are a plane view and a cross-sectional view illustrating a semiconductor device according to a modification (Part 2) of the first embodiment, respectively.
Figure 21B:
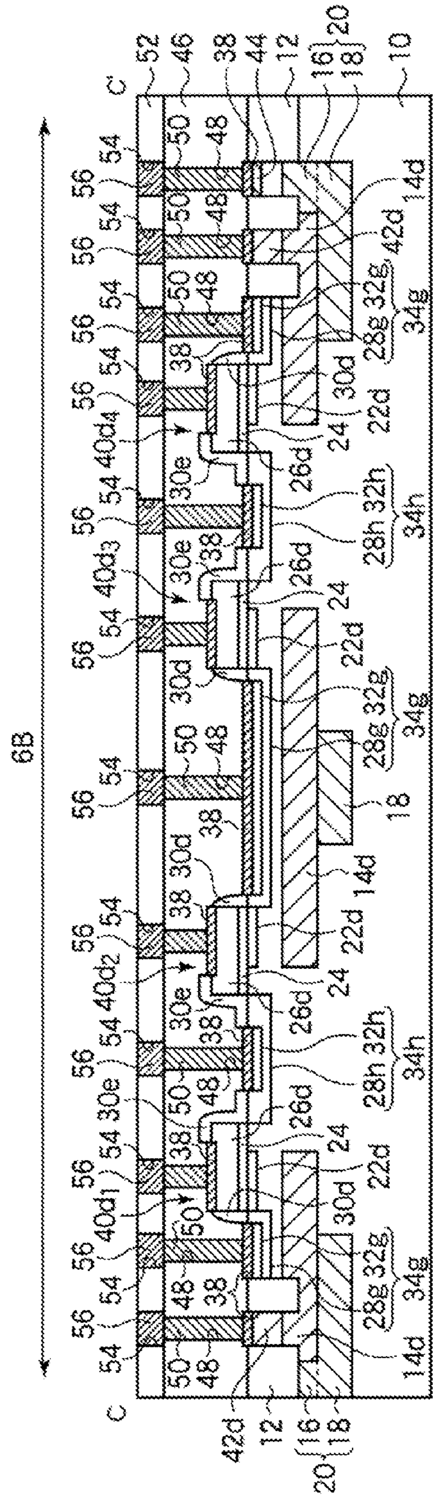

Next, description will be made regarding a semiconductor device according a modification (Part 2) of the present embodiment, with reference to FIGS. 21A and 21B. FIGS. 21A and 21B are a plane view and a cross-sectional view illustrating the semiconductor device according to the present modification. FIG. 21A is a plane view, and FIG. 21B is a cross-sectional view. FIG. 21B corresponds to a C-C' line cross-section in FIG. 21A.

As illustrated in FIGS. 21A and 21B, the source diffusion layers 34*g* and drain diffusion layers 34*h* of four high-withstand-voltage transistors 40*d*$_1$ to 40*d*$_4$ are alternately disposed.

With the present modification, the distance between the gate electrode 26*d* of the high-withstand-voltage transistor 40*d*$_2$, and the gate electrode 26*d* of the high-withstand-voltage transistor 40*d*$_3$ is set relatively great. Therefore, the length of the common source diffusion layer 28*g* of the high-withstand-voltage transistors 40*d*$_2$ and 40*d*$_3$ is relatively great. Therefore, with the present modification, the N-type embedded diffusion layer 18 may be formed under the common source diffusion layer 28*g* of the high-withstand-voltage transistors 40*d*$_2$ and 40*d*$_3$.

With the present modification, the N-type embedded diffusion layer 18 is formed under the common source diffusion layer 28*g* of the high-withstand-voltage transistors 40*d*$_2$ and 40*d*$_3$, and accordingly, noise caused from the high-withstand-voltage transistors 40*d*$_1$ to 40*d*$_4$ may be isolated in a more effective manner.

(Modification (Part 3))

Figure 22A:
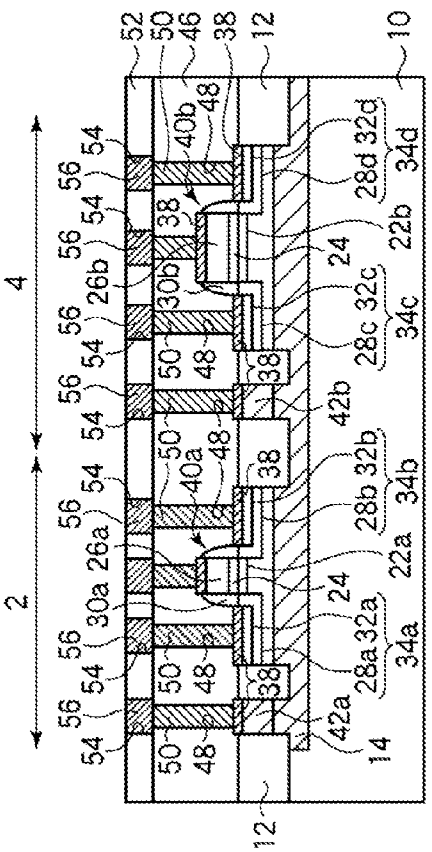
FIGS. 22A and 22B are cross-sectional views illustrating a semiconductor device according to a modification (Part 3) of the first embodiment.
Figure 22B:
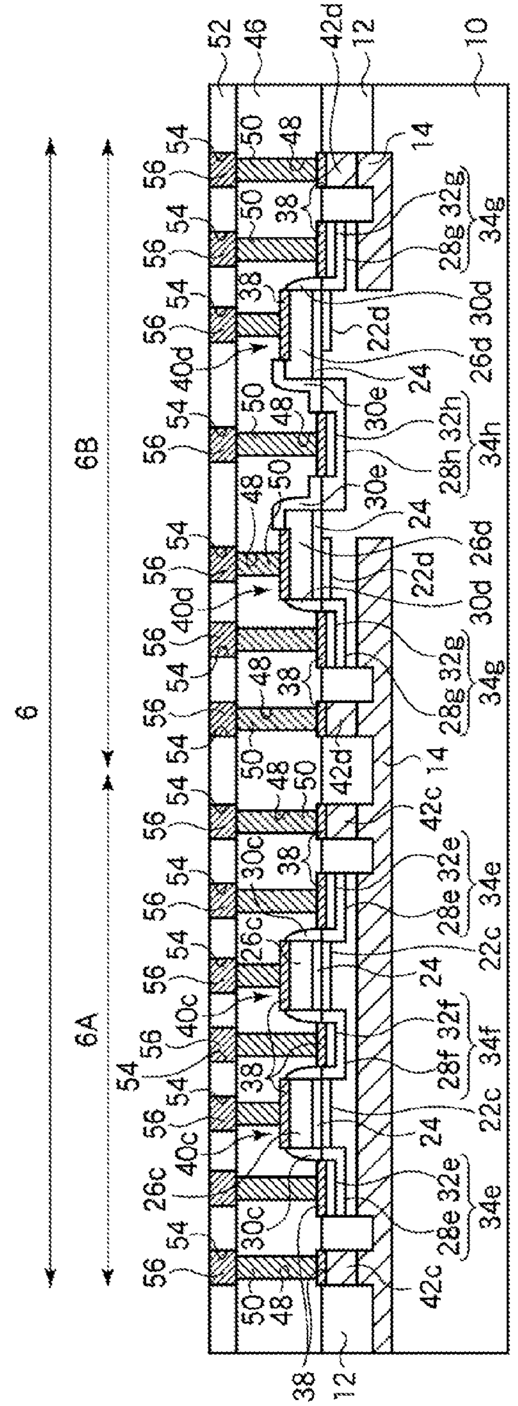

Next, description will be made regarding a semiconductor device according a modification (Part 3) of the present embodiment, with reference to FIGS. 22A and 22B. FIGS. 22A and 22B are cross-sectional views illustrating the semiconductor device according to the present modification.

The semiconductor device according to the present modification has principal features in that no N-type well 20 (see FIGS. 1A and 1B) is formed.

As illustrated in FIGS. 22A and 22B, with the present modification, no N-type well 20 is formed so as to surround the P-type well 14.

In this way, the N-type well 20 may not be formed.

However, it is desirable from a viewpoint of preventing noise caused at the high-withstand-voltage transistor 40*d* from having an adverse affect on the circuits of other regions to form the N-type well 20.

(Modification (Part 4))

Figure 23A:
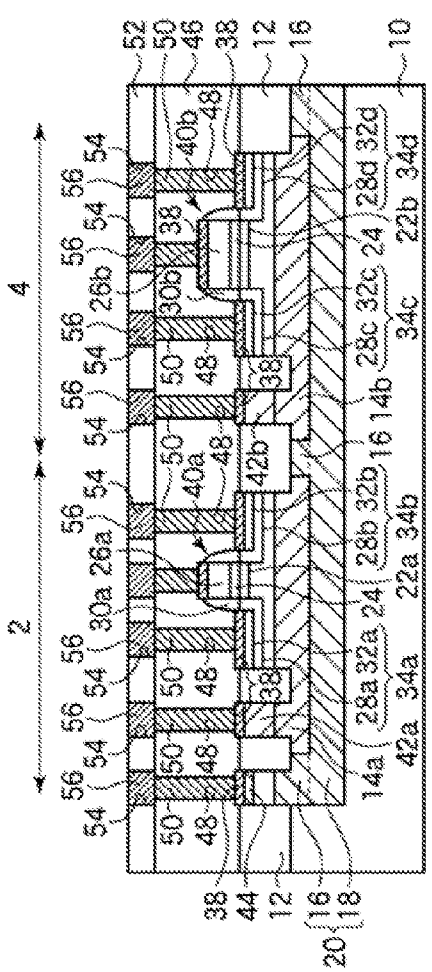
FIGS. 23A and 23B are cross-sectional views illustrating a semiconductor device according to a modification (Part 4) of the first embodiment.
Figure 23B:
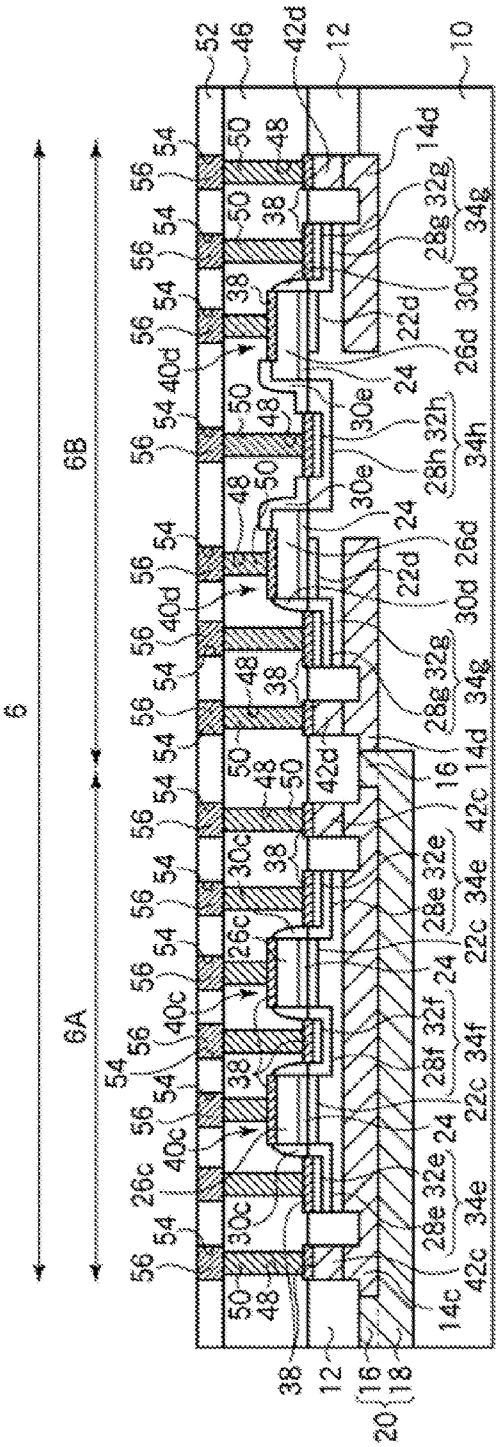

Next, description will be made regarding a semiconductor device according a modification (Part 4) of the present embodiment, with reference to FIGS. 23A and 23B. FIGS. 23A and 23B are cross-sectional views illustrating the semiconductor device according to the present modification.

The semiconductor device according to the present modification has principal features in that no N-type well 20 is formed in the high-withstand-voltage transistor formation region 6B.

As illustrated in FIGS. 23A and 23B, the N-type well 20 is formed in regions other than the high-withstand-voltage transistor formation region 6B, which have a triple well configuration. On the other hand, no N-type well 20 is formed in the high-withstand-voltage transistor formation region 6B.

The regions other than the high-withstand-voltage transistor formation region 6B have a triple well configuration, and accordingly, with the regions other than the high-withstand-voltage transistor formation region 6B, noise is isolated by such a triple well.

Even when no N-type well 20 is formed in the high-withstand-voltage transistor formation region 6B, noise caused at the high-withstand-voltage transistor 40*d* may be prevented from having an adverse affect on the regions other than the high-withstand-voltage transistor formation region 6B to some extent.

(Modification (Part 5))

Figure 24A:
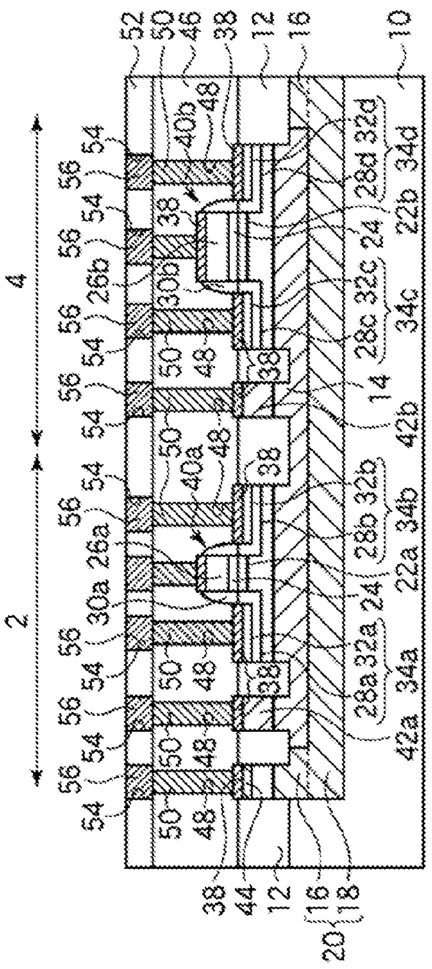
FIGS. 24A and 24B are cross-sectional views illustrating a semiconductor device according to a modification (Part 5) of the first embodiment.
Figure 24B:
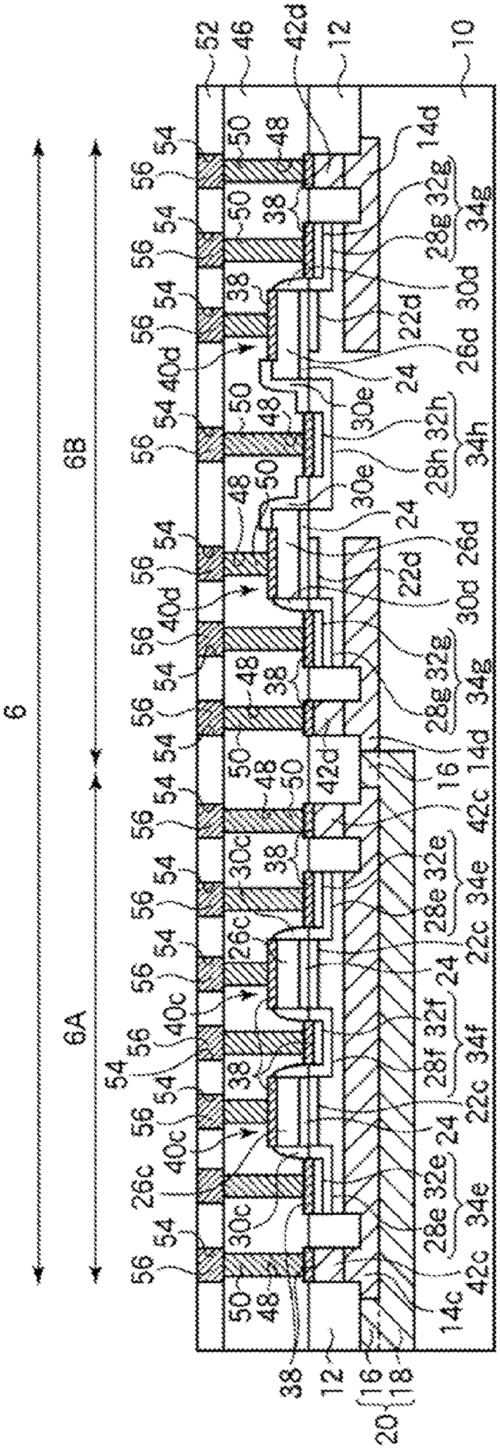

Next, description will be made regarding a semiconductor device according a modification (Part 5) of the present embodiment, with reference to FIGS. 24A and 24B. FIGS. 24A and 24B are cross-sectional views illustrating the semiconductor device according to the present modification.

The semiconductor device according to the present modification has principal features in that the P-type well 14 of the core transistor formation region 2, and the P-type well 14 of the input/output transistor formation region 4 are formed by the common P-type well 14.

As illustrated in FIGS. 24A and 24B, the P-type well 14 of the core transistor formation region 2, and the P-type well 14 of the input/output transistor formation region 4 are formed by the common P-type well 14.

With the present modification, the P-type well 14 of the core transistor formation region 2, and the P-type well 14 of the input/output transistor formation region 4 are formed by the common P-type well 14, and accordingly, one of the contact regions 42*a* and 42*b* may be omitted. Therefore, according to the present modification, space used for the core transistor formation region 2 and the input/output transistor formation region 4 may be reduced, which contributes to integration of the semiconductor device.

(Modification (Part 6))

Figure 25A:
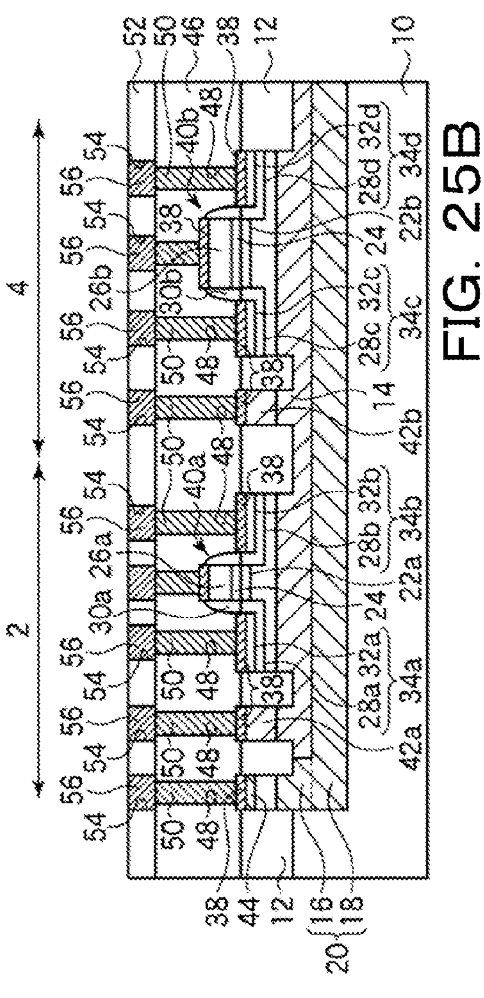
FIGS. 25A and 25B are cross-sectional views illustrating a semiconductor device according to a modification (Part 6) of the first embodiment.
Figure 25B:
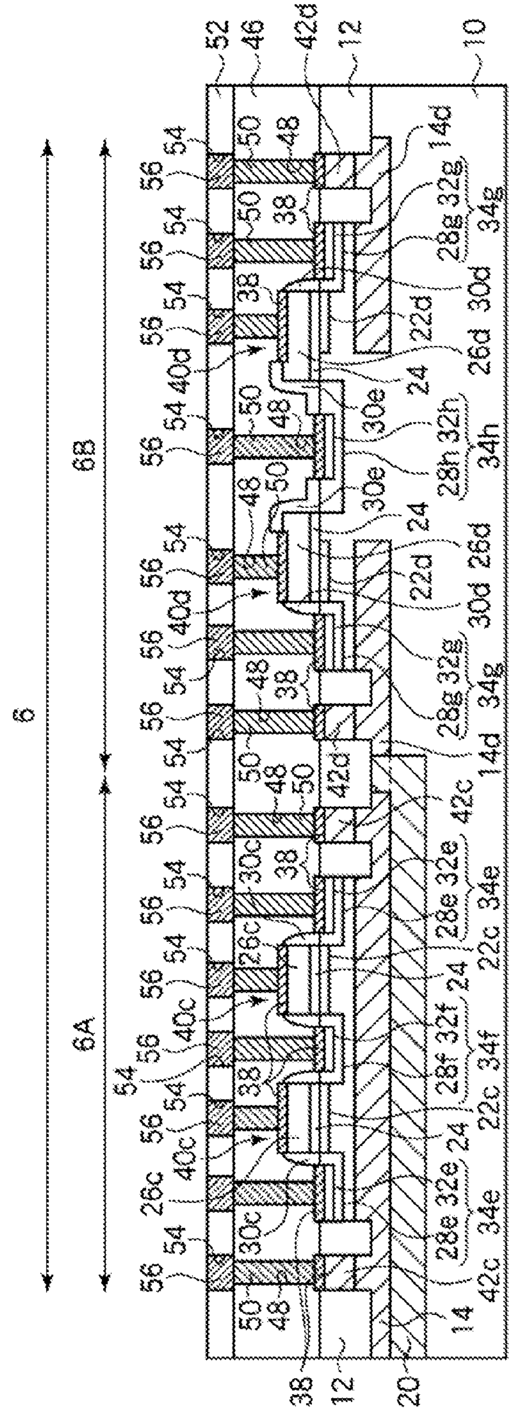

Next, description will be made regarding a semiconductor device according a modification (Part 6) of the present embodiment, with reference to FIGS. 25A and 25B. FIGS. 25A and 25B are cross-sectional views illustrating the semiconductor device according to the present modification.

The semiconductor device according to the present modification has principal features in that the P-type well 14 of the core transistor formation region 2, the P-type well 14 of the input/output transistor formation region 4, and the P-type well 14 of the previous stage transistor formation region 6A are formed by the common P-type well 14.

As illustrated in FIGS. 25A and 25B, the P-type well 14 of the core transistor formation region 2, the P-type well 14 of the input/output transistor formation region 4, and the P-type well 14 of the previous stage transistor formation region 6A are formed by the common P-type well 14.

With the present modification, there is no need to separately provide the contact regions 42*a*, 42*b*, and 42*c*, and the common contact region may be employed, and accordingly, space used for the contact regions 42*a* to 42*c* may be reduced. Therefore, according to the present modification, space used for the core transistor formation region 2, input/output transistor formation region 4, and previous stage transistor formation region 6A may be reduced, which contributes to integration of the semiconductor device.

(Modification (Part 7))

Figure 26A:
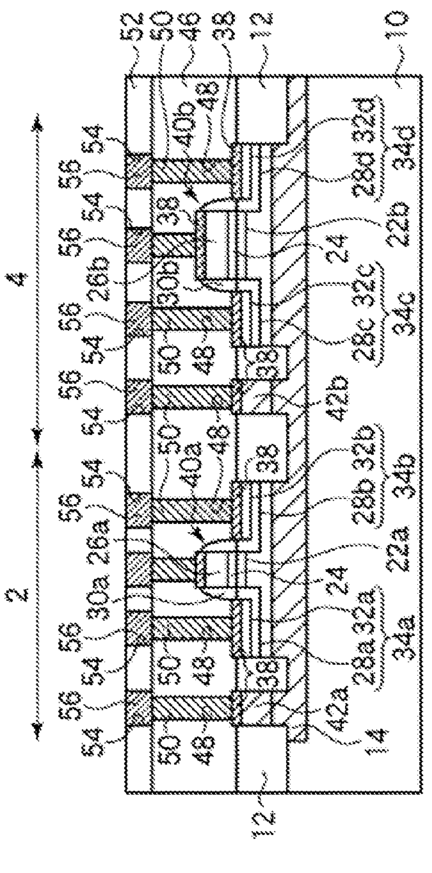
FIGS. 26A and 26B are cross-sectional views illustrating a semiconductor device according to a modification (Part 7) of the first embodiment.
Figure 26B:
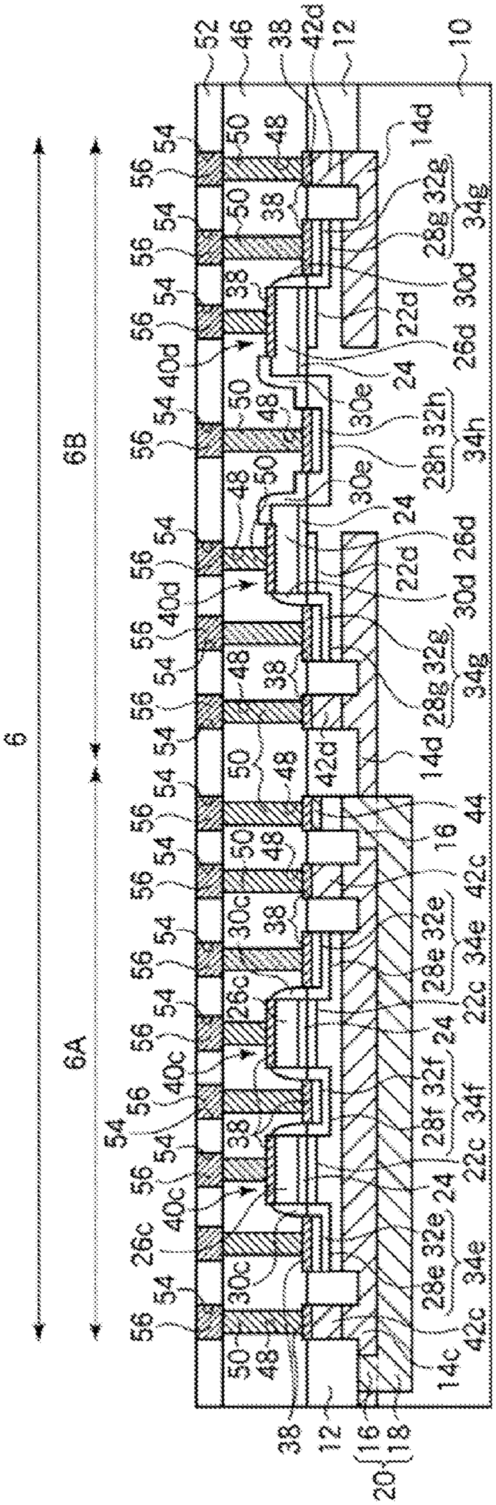

Next, description will be made regarding a semiconductor device according a modification (Part 7) of the present embodiment, with reference to FIGS. 26A and 26B. FIGS. 26A and 26B are cross-sectional views illustrating the semiconductor device according to the present modification.

The semiconductor device according to the present modification has principal features in that the N-type well 20 is formed in the previous stage transistor formation region 6A, and no N-type well 20 is formed in regions other than the previous stage transistor formation region 6A.

As illustrated in FIGS. 26A and 26B, the N-type well 20 is formed in the previous stage transistor formation region 6A, which has a triple well configuration. On the other hand, no N-type well 20 is formed in the core transistor formation region 2, input/output transistor formation region 4, and high-withstand-voltage transistor formation region 6B.

With the present modification, the previous stage transistor formation region 6A has a triple well configuration, and accordingly, noise caused at the high-withstand-voltage transistor 30*d* may be prevented from having an adverse affect on the previous stage of the power amplifier circuit. With the present modification, there is no need to provide space used for the N-type well 20 and the N-type contact region 44 in regions other than the previous stage transistor formation region 6A, which contributes to integration.

In this way, an arrangement may be made wherein the N-type well 20 is formed in the previous stage transistor region 6A, but no N-type well 20 is formed in regions other than the previous stage transistor region 6A.

(Modification (Part 8))

Figure 27A:
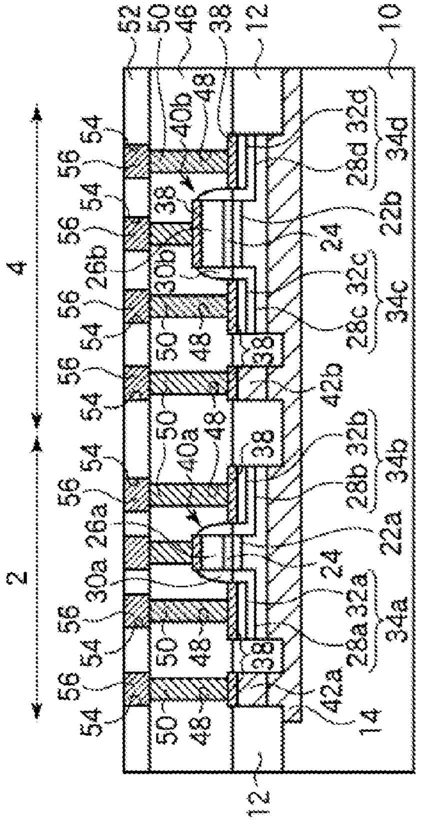
FIGS. 27A and 27B are cross-sectional views illustrating a semiconductor device according to a modification (Part 8) of the first embodiment.
Figure 27B:
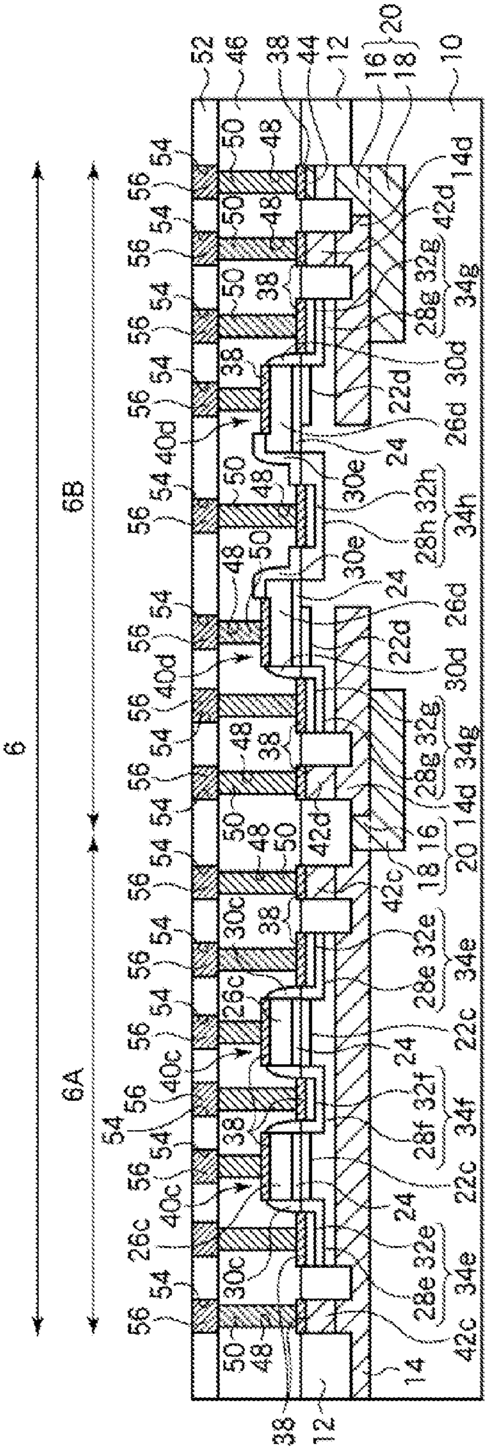

Next, description will be made regarding a semiconductor device according a modification (Part 8) of the present embodiment, with reference to FIGS. 27A and 27B. FIGS. 27A and 27B are cross-sectional views illustrating the semiconductor device according to the present modification.

The semiconductor device according to the present modification has principal features in that the N-type well 20 is formed in the high-withstand-voltage transistor formation region 6B, and no N-type well 20 is formed in regions other than the high-withstand-voltage transistor formation region 6B.

As illustrated in FIGS. 27A and 27B, the N-type well 20 is formed in the high-withstand-voltage transistor formation region 6B. On the other hand, no N-type well 20 is formed in the core transistor formation region 2, input/output transistor formation region 4, and previous stage transistor formation region 6A.

With the present modification, the N-type well 20 is formed in the high-withstand-voltage transistor formation region 6B, and accordingly, noise caused at the high-withstand-voltage transistor 30*d* may be prevented from having an adverse affect on the circuits of other regions. With the present modification, there is no need to provide space used for the N-type well 20 and the N-type contact region 44 in regions other than the high-withstand-voltage transistor formation region 6B, which contributes to integration.

In this way, an arrangement may be made wherein the N-type well 20 is formed in the high-withstand-voltage transistor region 6B, but no N-type well 20 is formed in regions other than the high-withstand-voltage transistor formation region 6B.

(Modification (Part 9))

Figure 28A:
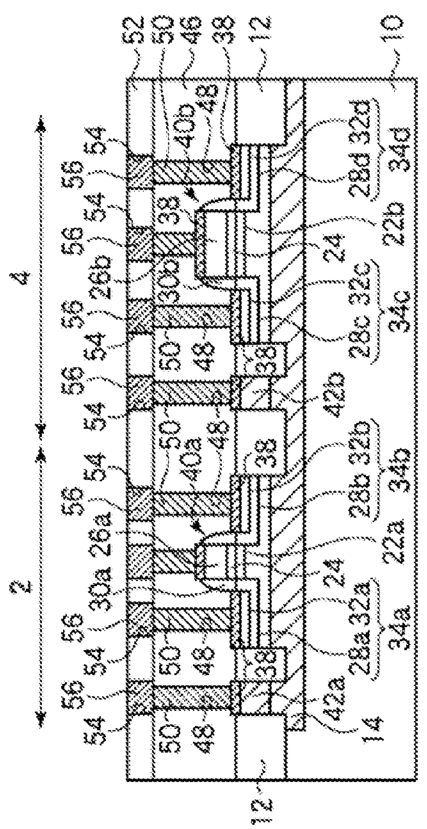
FIGS. 28A and 28B are cross-sectional views illustrating a semiconductor device according to a modification (Part 9) of the first embodiment.
Figure 28B:
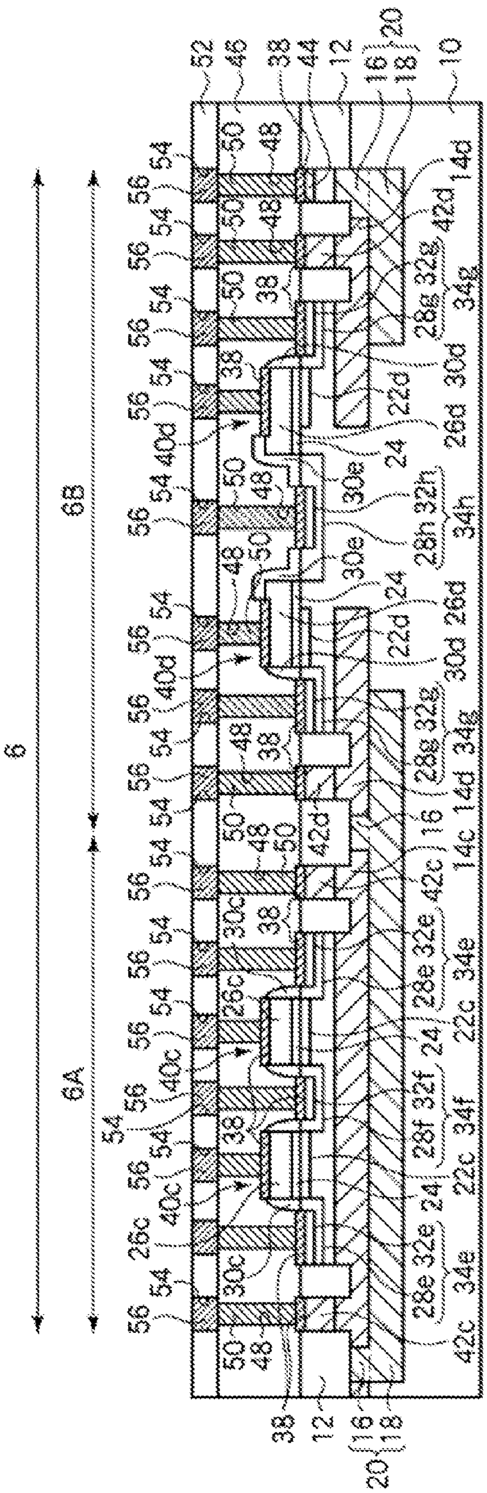

Next, description will be made regarding a semiconductor device according a modification (Part 9) of the present embodiment, with reference to FIGS. 28A and 28B. FIGS. 28A and 28B are cross-sectional views illustrating the semiconductor device according to the present modification.

The semiconductor device according to the present modification has principal features in that the N-type well 20 is formed in the power amplifier circuit formation region 6, and no N-type well 20 is formed in regions other than the power amplifier circuit formation region 6.

As illustrated in FIGS. 28A and 28B, the N-type well 20 is formed not only in the power amplifier circuit formation region 6 but also in the previous state transistor formation region 6A. On the other hand, no N-type well 20 is formed in the core transistor formation region 2, and input/output transistor formation region 4.

With the present modification, the N-type well 20 is formed not only in the high-withstand-voltage transistor formation region 6B but also in the previous stage transistor formation region 6A, and accordingly, noise caused at the high-withstand-voltage transistor 30*d* may be prevented from having an adverse affect on the previous stage of the power amplifier circuit. With the present modification, there is no need to provide space used for the N-type well 20 and the N-type contact region 44 in regions other than the power amplifier circuit formation region 6, which contributes to integration.

In this way, an arrangement may be made wherein the N-type well 20 is formed in the power amplifier circuit formation region 6, but no N-type well 20 is formed in regions other than the power amplifier circuit formation region 6.

(Modification (Part 10))

Figure 29A:
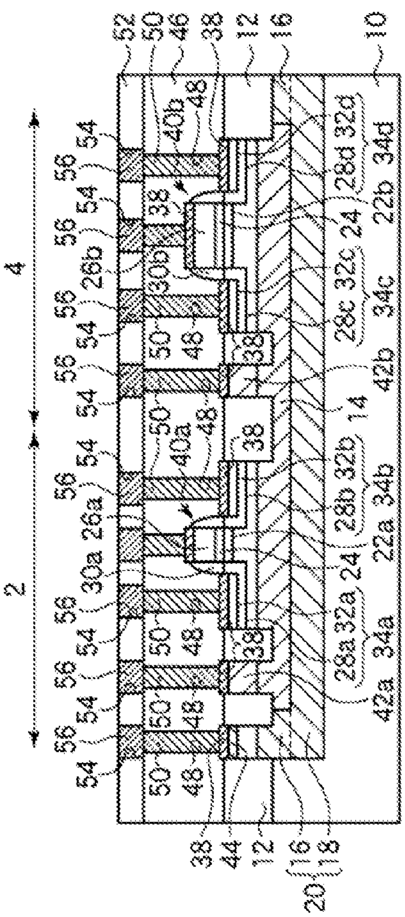
FIGS. 29A and 29B are cross-sectional views illustrating a semiconductor device according to a modification (Part 10) of the first embodiment.
Figure 29B:
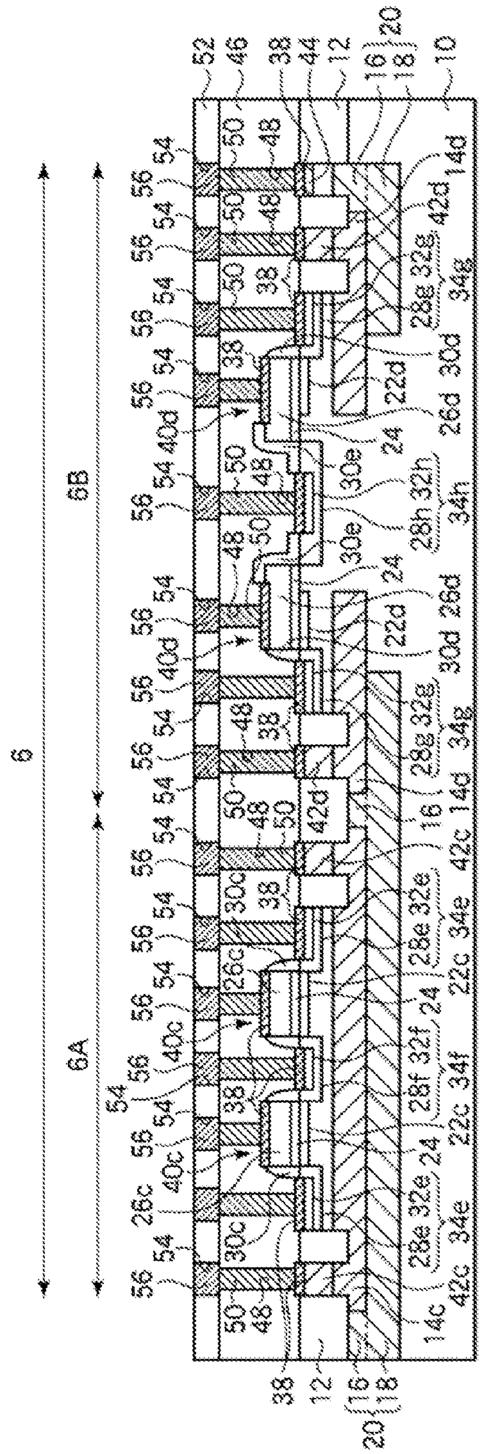

Next, description will be made regarding a semiconductor device according a modification (Part 10) of the present embodiment, with reference to FIGS. 29A and 29B. FIGS. 29A and 29B are cross-sectional views illustrating the semiconductor device according to the present modification.

The semiconductor device according to the present modification has principal features in that the N-type well 20 is formed in any of the regions 2, 4, and 6, and the P-type wells 14 of the core transistor formation region 2 and the input/output transistor formation region 4 are formed by the common P-type well 14.

As illustrated in FIGS. 29A and 29B, the N-type well 20 is formed in any of the core transistor formation region 2, input/output transistor formation region 4, and power amplifier circuit formation region 6.

The P-type well 14 of the core transistor formation region 2, and the P-type well 14 of the input/output transistor formation region 4 are formed by the common P-type well 14.

With the present modification, the P-type well 14 of the core transistor formation region 2, and the P-type well 14 of the input/output transistor formation region 4 are formed by the common P-type well 14, and accordingly, one of the contact regions 42*a* and 42*b* may be omitted. Therefore, according to the present modification, space used for the core transistor formation region 2 and the input/output transistor formation region 4 may be reduced, which contributes to integration of the semiconductor device.

(Modification (Part 11))

Figure 30A:
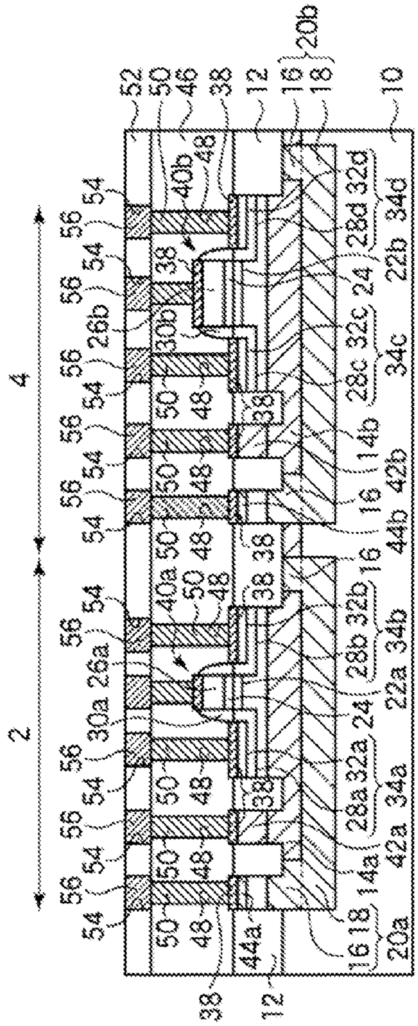
FIGS. 30A and 30B are cross-sectional views illustrating a semiconductor device according to a modification (Part 11) of the first embodiment.
Figure 30B:
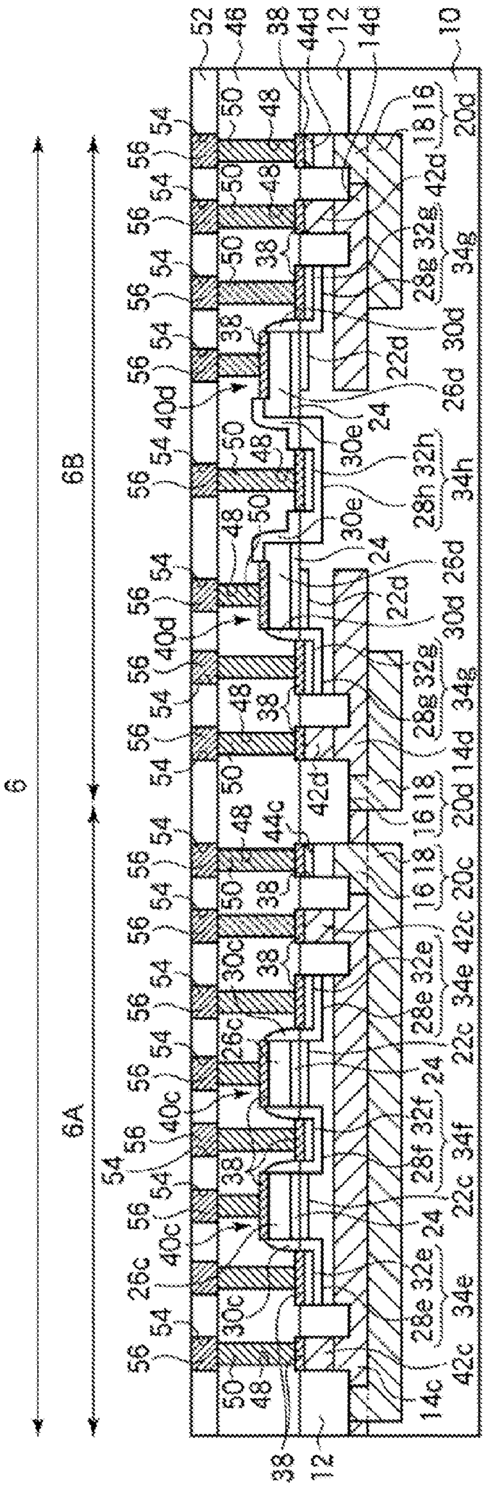

Next, description will be made regarding a semiconductor device according a modification (Part 11) of the present embodiment, with reference to FIGS. 30A and 30B. FIGS. 30A and 30B are cross-sectional views illustrating the semiconductor device according to the present modification.

The semiconductor device according to the present modification has principal features in that N-type wells 20*a* to 20*d* of the core transistor formation region 2, input/output transistor formation region 4, previous stage transistor formation region 6A, and high-withstand-voltage transistor formation region 6B are mutually separated.

As illustrated in FIGS. 30A and 30B, the N-type well 20*a* is formed in the core transistor formation region 2. A contact region 44*a* is connected to the N-type well 20*a*.

The N-type well 20*b* is formed in the input/output transistor formation region 4. A contact region 44*b* is connected to the N-type well 20*b*.

The N-type well 20*c* is formed in the previous stage transistor formation region 6A. A contact region 44*c* is connected to the N-type well 20*c*.

The N-type well 20*d* is formed in the high-withstand-voltage transistor formation region 6B. A contact region 44*d* is connected to the N-type well 20*d*.

The N-type wells 20*a* to 20*d* of the core transistor formation region 2, input/output transistor formation region 4, previous stage transistor formation region 6A, and high-withstand-voltage transistor formation region 6B are mutually separated.

In this way, the N-type wells 20*a* to 20*d* of the core transistor formation region 2, input/output transistor formation region 4, previous stage transistor formation region 6A, and high-withstand-voltage transistor formation region 6B may mutually be separated.

(Modification (Part 12))

Figure 31A:
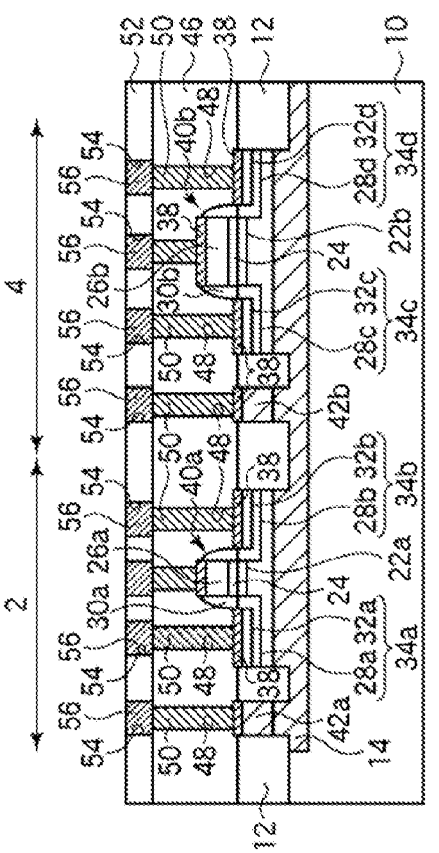
FIGS. 31A and 31B are cross-sectional views illustrating a semiconductor device according to a modification (Part 12) of the first embodiment.
Figure 31B:
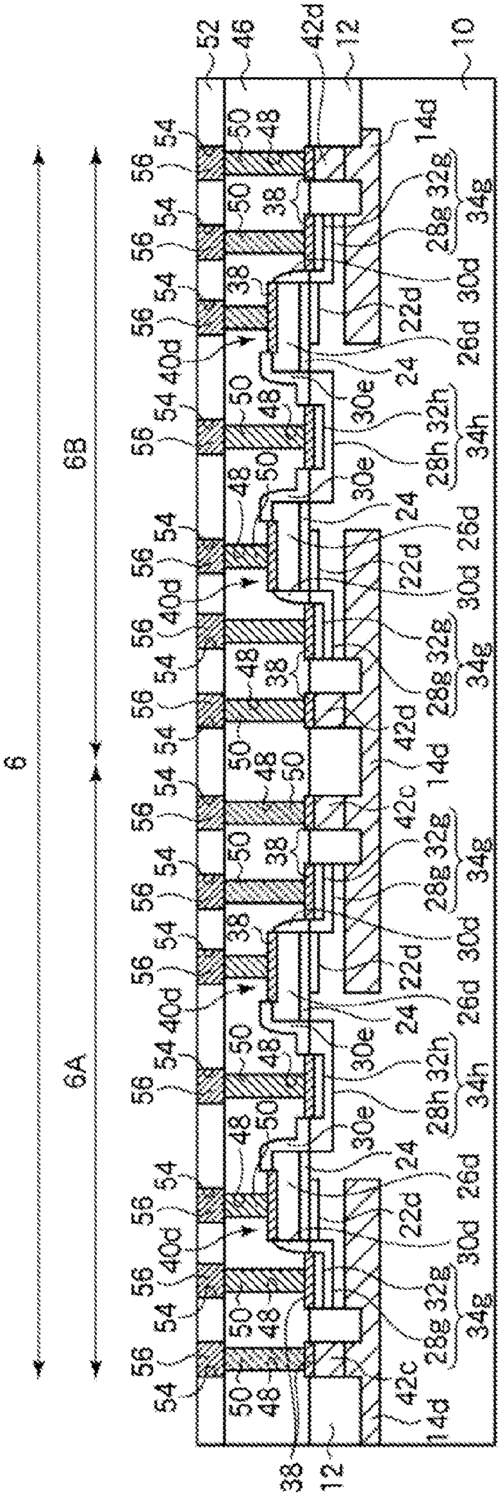

Next, description will be made regarding a semiconductor device according a modification (Part 12) of the present embodiment, with reference to FIGS. 31A and 31B. FIGS. 31A and 31B are cross-sectional views illustrating the semiconductor device according to the present modification.

The semiconductor device according to the present modification has principal features in that the high-withstand-voltage transistor 40*d* is also formed in the previous stage transistor formation region 6A.

As illustrated in FIGS. 31A and 31B, the high-withstand-voltage transistor 40*d* is formed in the previous stage transistor formation region 6A. With the previous stage transistor formation region 6A, the P-type well 14 is formed so as to be separated from the region where the low-concentration drain region 28*h* is formed. Also, with the previous stage transistor formation region 6A, the channel dope layer 22*d* is formed so as to be separated from the region where the low-concentration drain region 28*h* is formed.

In this way, with the previous stage transistor formation region 6A as well, the high-withstand-voltage transistor 40*d* may be formed. In the event that high voltage may also be applied to other than the final stage of the power amplifier circuit, the high-withstand-voltage transistor 40*d* has to be used for portions other than the final stage as appropriate like the present modification.

(Modification (Part 13))

Figure 32A:
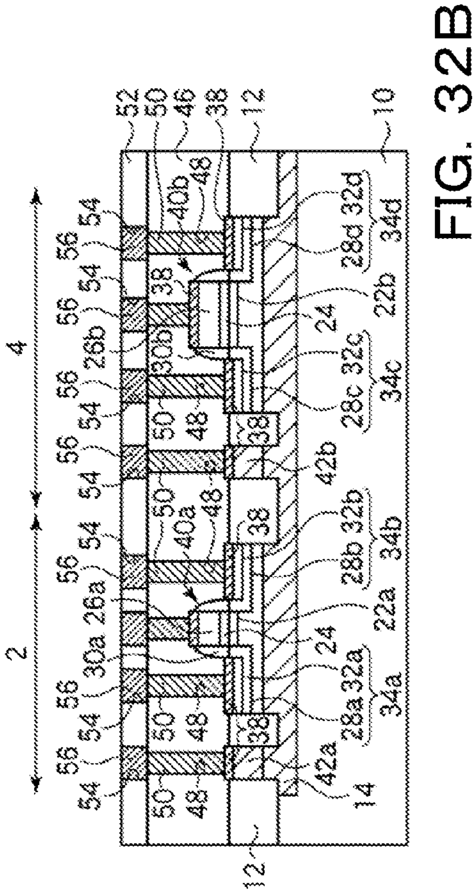
FIGS. 32A and 32B are cross-sectional views illustrating a semiconductor device according to a modification (Part 13) of the first embodiment.
Figure 32B:
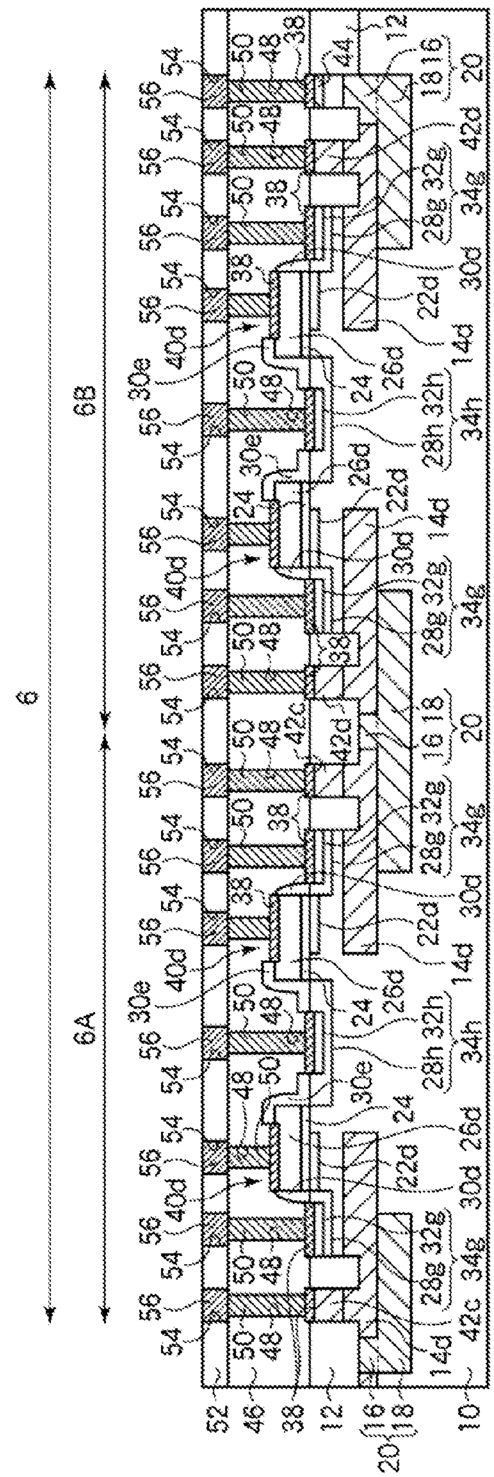

Next, description will be made regarding a semiconductor device according a modification (Part 13) of the present embodiment, with reference to FIGS. 32A and 32B. FIGS. 32A and 32B are cross-sectional views illustrating the semiconductor device according to the present modification.

The semiconductor device according to the present modification has principal features in that the N-type well 20 is formed in the power amplifier circuit formation region 6.

As illustrated in FIGS. 32A and 32B, the N-type well 20 is formed in the power amplifier circuit formation region 6. On the other hand, no N-type well 20 is formed in the core transistor formation region 2 and input/output transistor formation region 4.

According to the present modification, the N-type well 20 is formed in the power amplifier circuit formation region 6, and accordingly, noise caused at the high-withstand-voltage transistor 40*d* may be prevented from having adverse affect on the core transistor formation region 2 and input/output transistor formation region 4.

(Modification (Part 14))

Figure 33A:
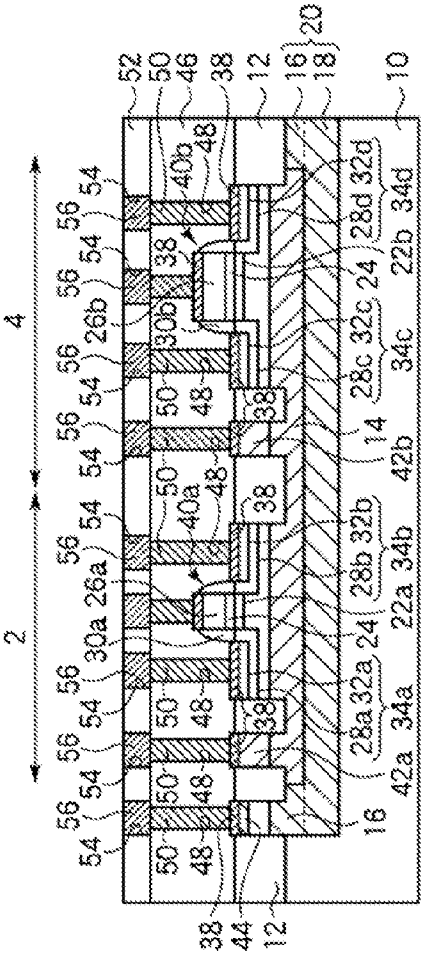
FIGS. 33A and 33B are cross-sectional views illustrating a semiconductor device according to a modification (Part 14) of the first embodiment.
Figure 33B:
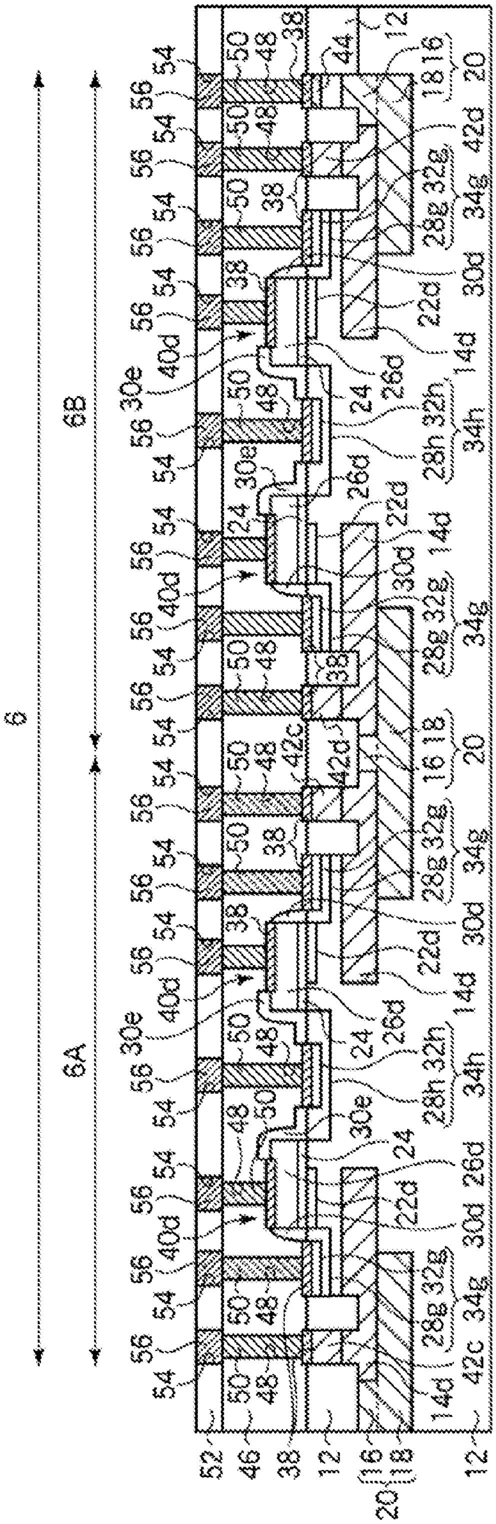

Next, description will be made regarding a semiconductor device according a modification (Part 14) of the present embodiment, with reference to FIGS. 33A and 33B. FIGS. 33A and 33B are cross-sectional views illustrating the semiconductor device according to the present modification.

The semiconductor device according to the present modification has principal features in that the N-type well 20 is formed in any of the regions 2, 4, and 6, and the P-type wells 14 of the core transistor formation region 2 and the input/output transistor formation region 4 are formed by the common P-type well 14.

As illustrated in FIGS. 33A and 33B, the N-type well 20 is formed in the core transistor formation region 2, input/output transistor formation region 4, and power amplifier circuit formation region 6.

The P-type well 14 of the core transistor formation region 2, and the P-type well 14 of the input/output transistor formation region 4 are formed by the common P-type well 14.

According to the present modification, the N-type well 20 is formed in any of the core transistor formation region 2, input/output transistor formation region 4, and power amplifier circuit formation region 6, and accordingly, noise caused at the high-withstand-voltage transistor 40*d* may be prevented from having adverse affect on the core transistor formation region 2 and input/output transistor formation region 4.

Also, according to the present modification, the P-type wells 14 of the core transistor formation region 2 and input/output transistor formation region 4 are formed by the common P-type well 14, and accordingly, one of the contact regions 42*a* and 42*b* may be omitted. Therefore, according to the present modification, space used for the core transistor formation region 2 and input/output transistor formation region 4 may be reduced, which contributes to integration of the semiconductor device.

(Modification (Part 15))

Figure 34A:
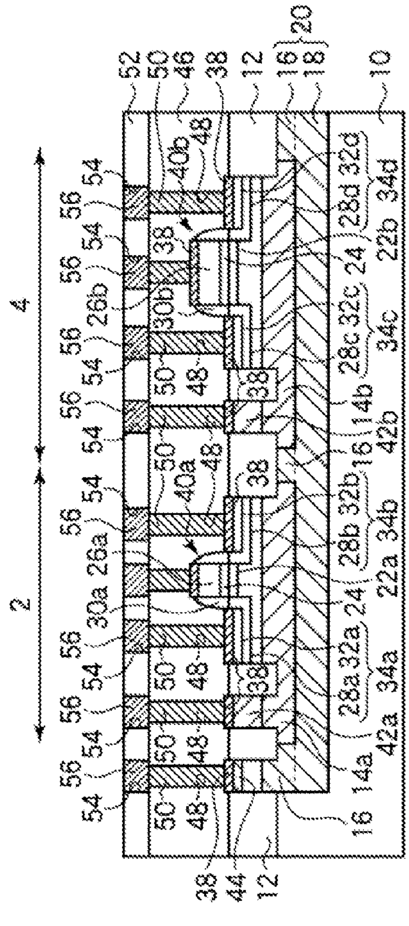
FIGS. 34A and 34B are cross-sectional views illustrating a semiconductor device according to a modification (Part 15) of the first embodiment.
Figure 34B:
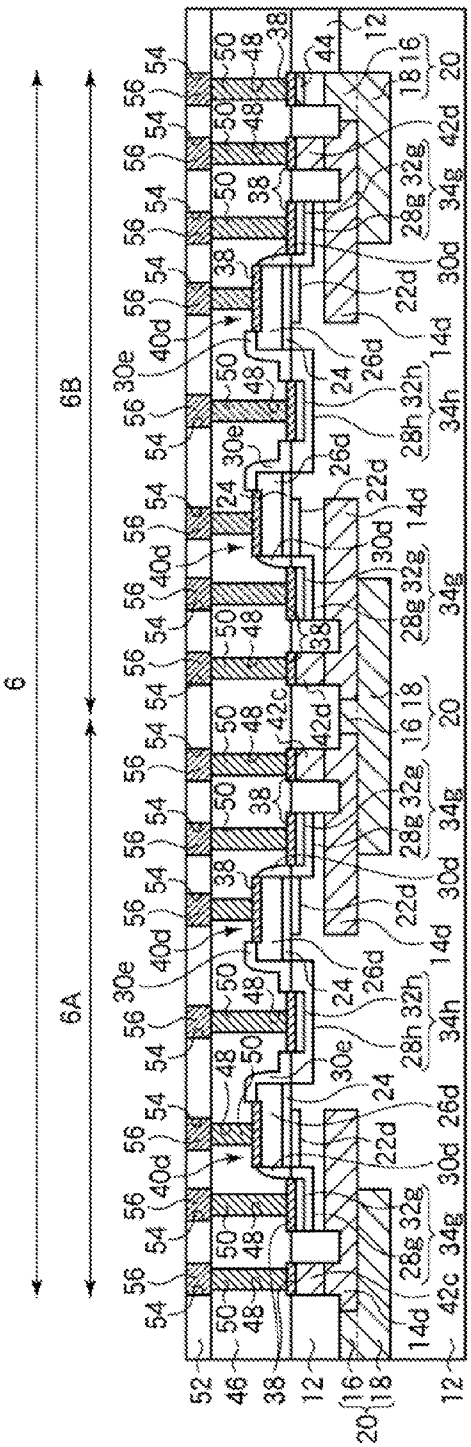

Next, description will be made regarding a semiconductor device according a modification (Part 15) of the present embodiment, with reference to FIGS. 34A and 34B. FIGS. 34A and 34B are cross-sectional views illustrating the semiconductor device according to the present modification.

The semiconductor device according to the present modification has principal features in that P-type wells 14*a*, 14*b*, and 14*d* of the core transistor formation region 2, input/output transistor formation region 4, previous stage transistor formation region 6A, and high-withstand-voltage transistor formation region 6B are mutually separated.

As illustrated in FIGS. 34A and 34B, the P-type well 14*a* is formed in the core transistor formation region 2. The P-type well 14*b* is formed in the input/output transistor formation region 4. The P-type well 14*d* is formed in the previous stage transistor formation region 6A. The P-type well 14*d* is formed in the high-withstand-voltage transistor formation region 6B.

The P-type wells 14*a*, 14*b*, and 14*d* of the core transistor formation region 2, input/output transistor formation region 4, previous stage transistor formation region 6A, and high-withstand-voltage transistor formation region 6B are mutually separated.

In this way, the P-type wells 14*a*, 14*b*, and 14*d* of the core transistor formation region 2, input/output transistor formation region 4, previous stage transistor formation region 6A, and high-withstand-voltage transistor formation region 6B may mutually be separated.

(Modification (Part 16))

Figure 35A:
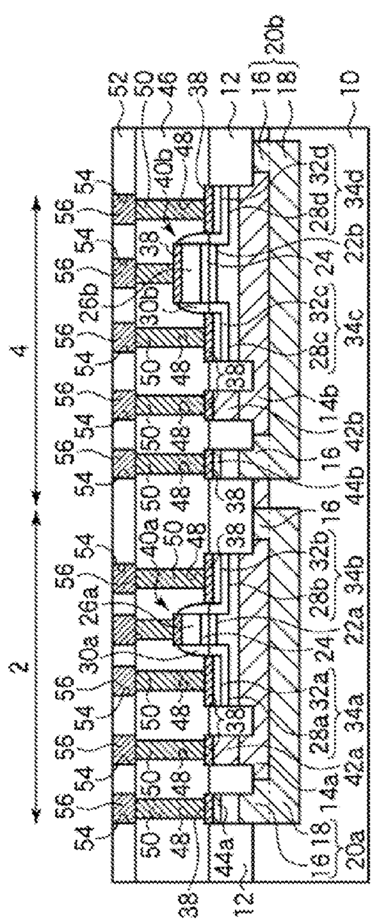
FIGS. 35A and 35B are cross-sectional views illustrating a semiconductor device according to a modification (Part 16) of the first embodiment.
Figure 35B:
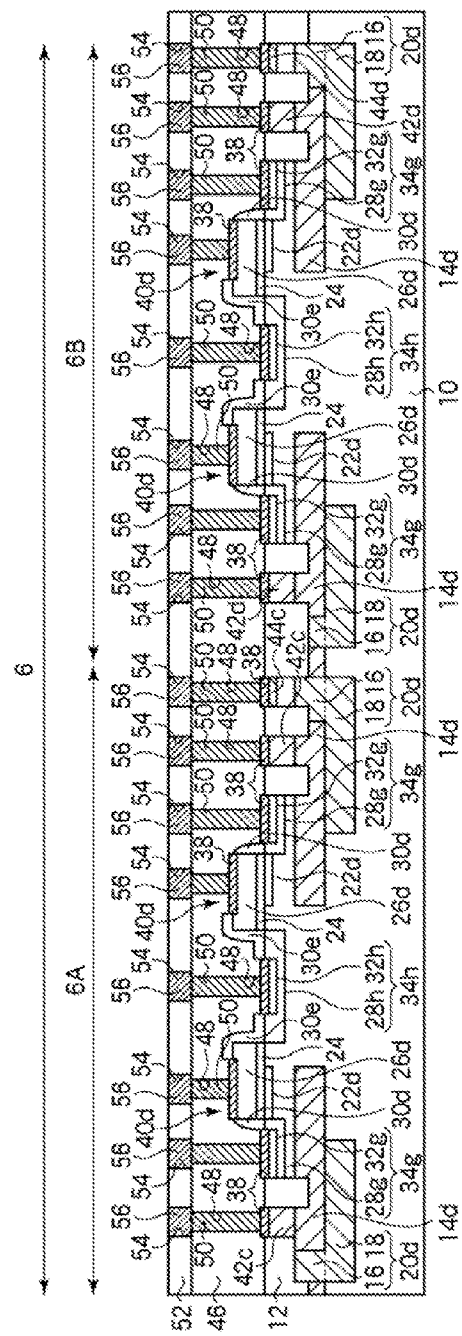

Next, description will be made regarding a semiconductor device according a modification (Part 16) of the present embodiment, with reference to FIGS. 35A and 35B. FIGS. 35A and 35B are cross-sectional views illustrating the semiconductor device according to the present modification.

The semiconductor device according to the present modification has principal features in that N-type wells 20*a*, 20*b*, and 20*d* of the core transistor formation region 2, input/output transistor formation region 4, previous stage transistor formation region 6A, and high-withstand-voltage transistor formation region 6B are mutually separated.

As illustrated in FIGS. 35A and 35B, the N-type well 20*a* is formed in the core transistor formation region 2. The contact region 44*a* is connected to the N-type well 20*a*.

The N-type well 20*b* is formed in the input/output transistor formation region 4. The contact region 44*b* is connected to the N-type well 20*b*.

The N-type well 20*d* is formed in the previous stage transistor formation region 6A. The contact region 44*c* is connected to the N-type well 20*d*.

The N-type well 20*d* is formed in the high-withstand-voltage transistor formation region 6B. The contact region 44*d* is connected to the N-type well 20*d*.

The N-type wells 20*a*, 20*b*, and 20*d* of the core transistor formation region 2, input/output transistor formation region 4, previous stage transistor formation region 6A, and high-withstand-voltage transistor formation region 6B are mutually separated.

In this way, the N-type wells 20*a*, 20*b*, and 20*d* of the core transistor formation region 2, input/output transistor formation region 4, previous stage transistor formation region 6A, and high-withstand-voltage transistor formation region 6B may mutually be separated.

Second Embodiment

A semiconductor device according to a second embodiment, and a manufacturing method thereof will be described with reference to FIGS. 36A to 40. The same components as with the semiconductor device and manufacturing method thereof according to the first embodiment illustrated in FIGS. 1A to 35B are denoted with the same reference numerals, and description thereof will be omitted or simplified.

(Semiconductor Device)

Figure 36A:
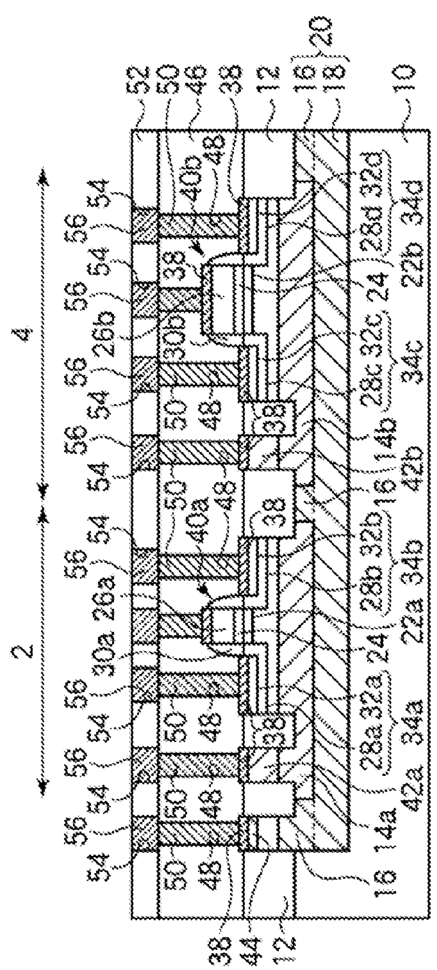
FIGS. 36A and 36B are cross-sectional views illustrating a semiconductor device according to a second embodiment.
Figure 36B:
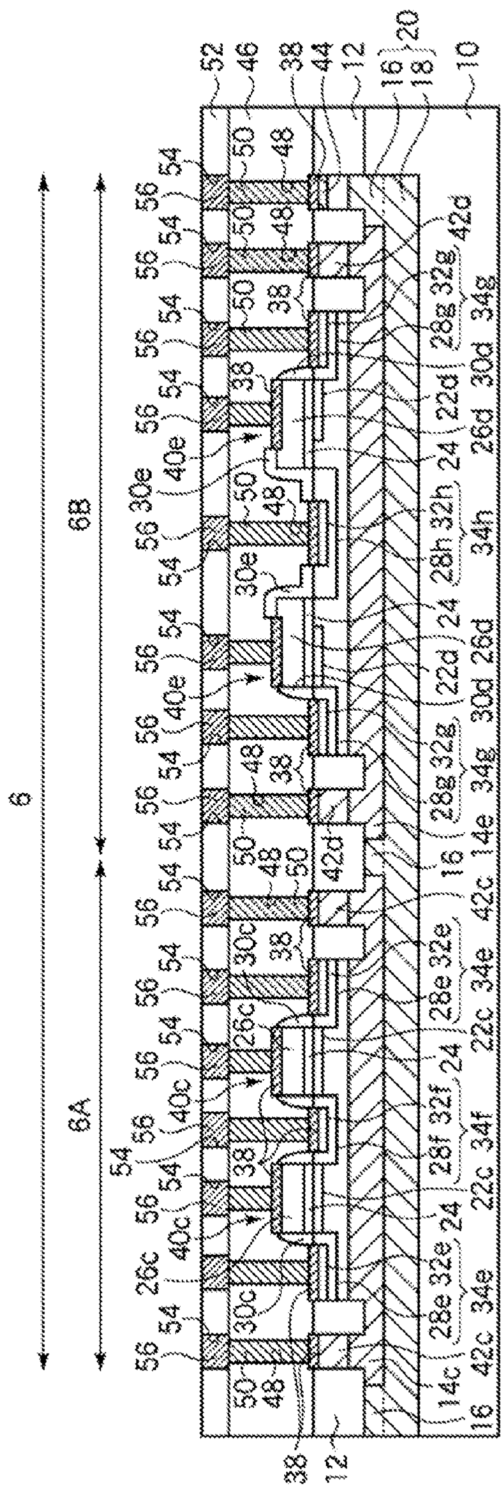
Figure 37A:
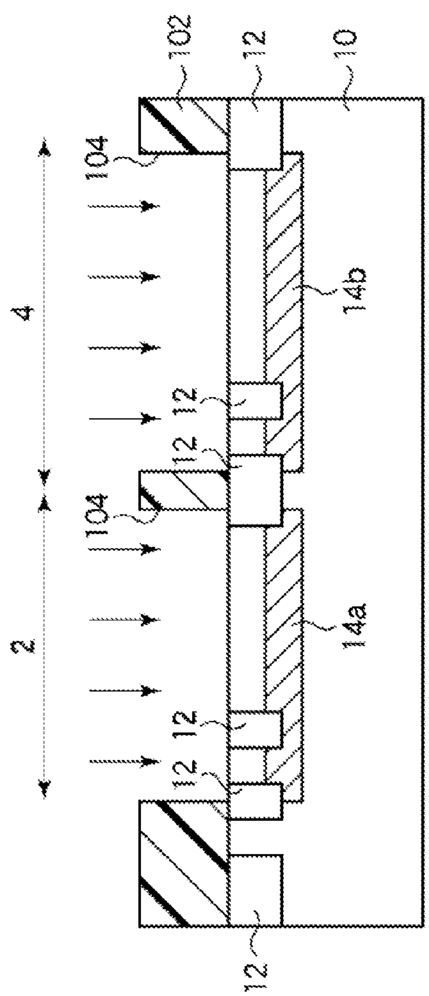
FIGS. 37A to 39B are process cross-sectional views illustrating a manufacturing method of the semiconductor device according to the second embodiment.
Figure 37B:
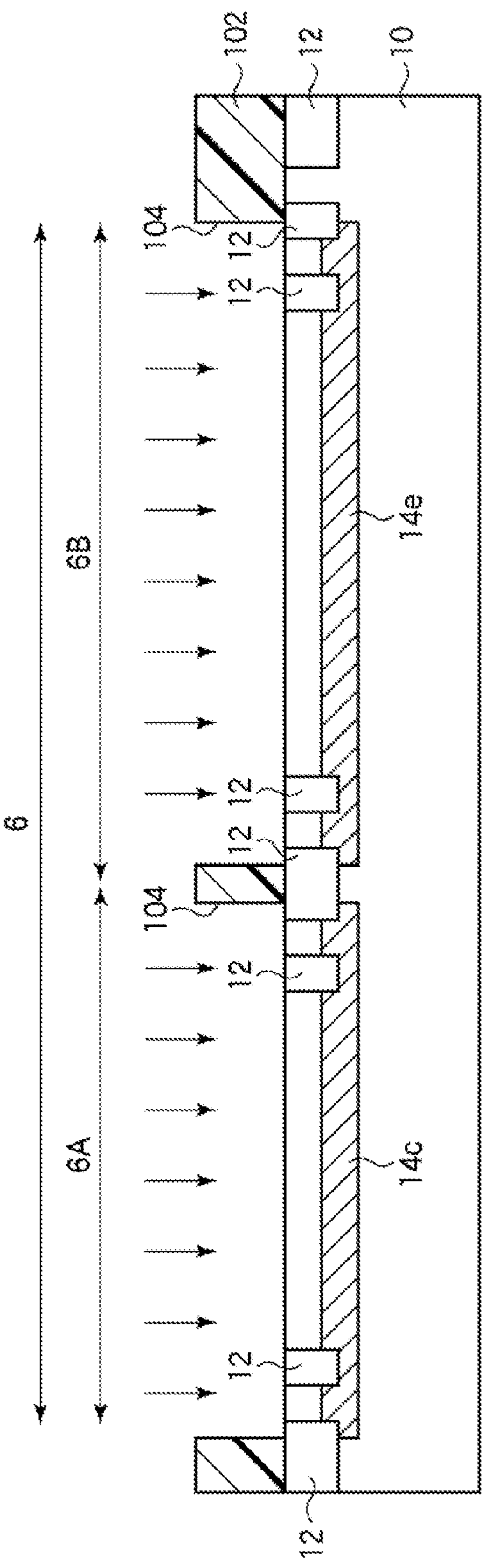
Figure 38A:
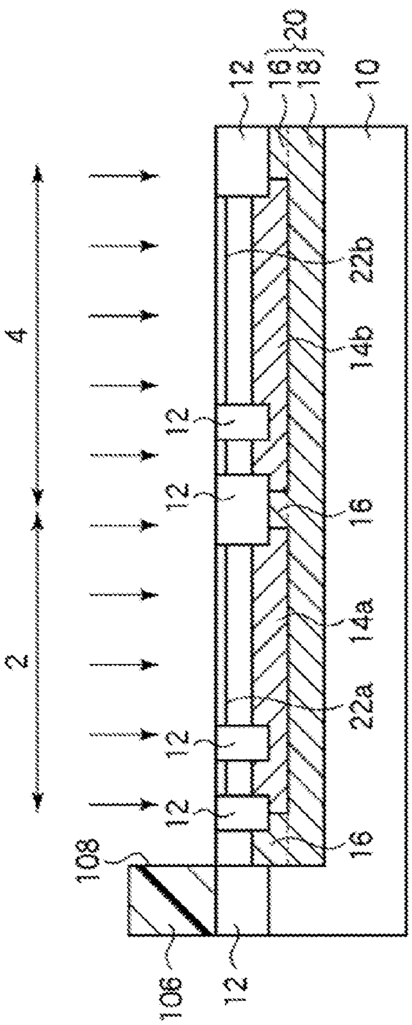
Figure 38B:
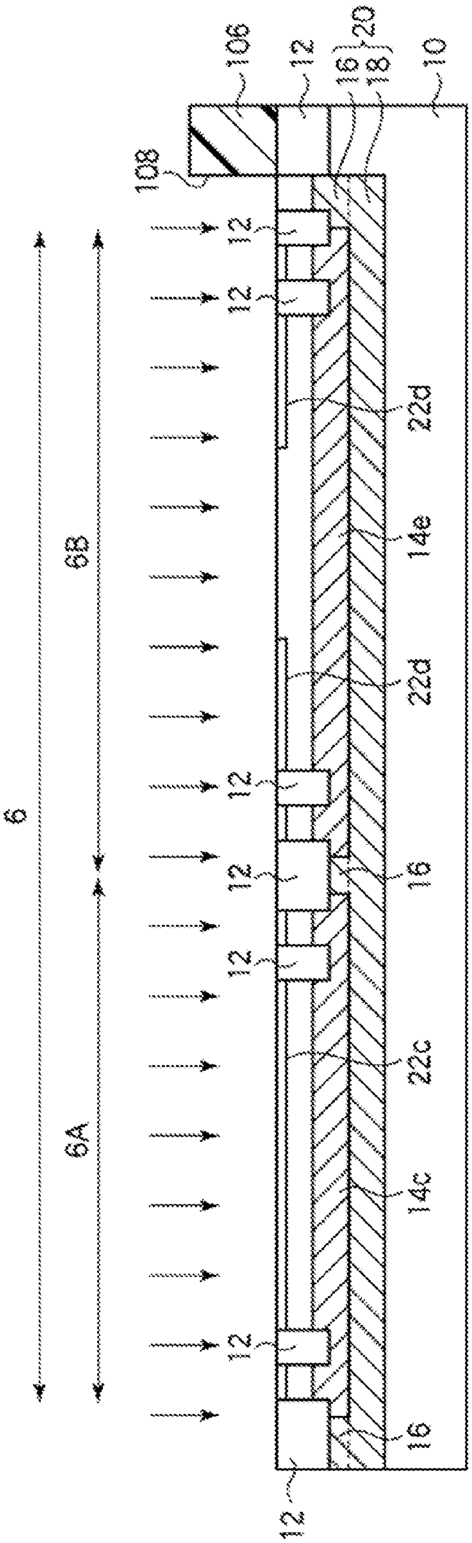

First, description will be made regarding the semiconductor device according to the present embodiment with reference to FIGS. 36A and 36B. FIGS. 36A and 36B are cross-sectional views illustrating the semiconductor device according to the present embodiment.

The semiconductor device according to the present embodiment has principal features in that the P-type well 14*e* of the high-withstand-voltage transistor formation region 6B is not separated from the region where the low-concentration drain region 28*h* is formed.

The P-type well 14*e* of the high-withstand-voltage transistor formation region 6B is formed by dopant impurities being introduced to the entire chip region. With the present embodiment, the P-type well 14*e* formed in the high-withstand-voltage transistor formation region 6B is not separated from the region where the low-concentration drain region 28*h* is formed. That is to say, the region where dopant impurities for forming the low-concentration drain region 28*h* are introduced, and the region where dopant impurities for forming the P-type well 14*e* are introduced, are not mutually separated. In other words, the low-concentration drain region 28*h* and the P-type well 14*e* are not mutually separated on design data or reticle.

The N-type well 20 of the high-withstand-voltage transistor formation region 6B is formed so as to surround the P-type well 14*e*. The P-type well 14*e* is electrically separated from the semiconductor substrate 10 by the N-type well 20. That is to say, with the present embodiment, the high-withstand-voltage transistor formation region 6B also has a triple well configuration.

The channel dope layer 22*d* is formed so as to be separated from the region where the low-concentration drain region 28*h* is formed. Specifically, the region where dopant impurities for forming the channel dope layer 22*d* are introduced, and the region where dopant impurities for forming the low-concentration drain region 28*h* are introduced, are mutually separated. In other words, the low-concentration drain region 28*h* and the channel dope layer 22*d* are mutually separated on design data and on reticle. Thus, a moderate impurity profile is obtained between the channel dope layer 22*d* and the low-concentration drain region 28*h*.

Like the present embodiment, the P-type well 14*e* of the high-withstand-voltage transistor formation region 6B may not be separated from the region where the low-concentration drain region 28*h* is formed. The moderate impurity profile is obtained between the channel dope layer 22*d* and the low-concentration drain region 28*h*, and accordingly, with the present embodiment as well, a certain level of high withstand voltage may be secured.

Also, according to the present embodiment, any of the regions 2, 4, and 6 has a triple well configuration, whereby noise caused at the high-withstand-voltage transistor 40*e* may sufficiently be prevented from having an adverse affect on the circuits of other regions.

(Semiconductor Device Manufacturing Method)

Next, a semiconductor device manufacturing method according to the present embodiment will be described with reference to FIGS. 37A and 37B, FIGS. 38A and 38B, and FIGS. 39A and 39B. FIGS. 37A to 39B are process cross-sectional views illustrating the semiconductor device manufacturing method according to the present embodiment.

First, the process wherein the chip separation region 12 is formed is the same with the semiconductor device manufacturing method according the first embodiment described above with reference to FIGS. 3A and 3B, and accordingly, description thereof will be omitted.

Next, a photoresist film 102 is formed on the entire surface, for example, by the spin coat method.

Next, the photoresist film 102 is subjected to patterning using the photolithographic technique. Thus, an opening portion 104 for forming the P-type wells 14*a*, 14*b*, 14*c*, and 14*e* is formed on the photoresist film 102 (see FIGS. 37A and 37B).

Next, P-type dopant impurities are introduced into the semiconductor substrate 10, for example, by the ion-implantation technique with the photoresist film 102 as a mask, thereby forming the P-type wells 14*a* to 14*d*. As for the P-type dopant impurities, B is employed, for example. Let us say that the acceleration energy is, for example, 100 to 200 keV, and the doze amount is, for example, $2\times10^{13}$ to $5\times10^{13}$ $cm^{-2}$ or so.

Subsequently, the photoresist film 102 is peeled off, for example, by ashing.

Subsequently, from the process wherein the photoresist film 64 is formed to the process wherein the channel dope layers 22*a* to 22*d* are formed are the same as with the semiconductor device manufacturing method according to the first embodiment described above with reference to FIGS. 5 to 7, and accordingly, description thereof will be omitted.

Next, a photoresist film 106 is formed on the entire surface, for example, by the spin coat method.

Next, the photoresist film 106 is subjected to patterning using the photolithographic technique. Thus, an opening portion 108 for forming the N-type embedded diffusion layer 18 is formed on the photoresist film 106 (see FIGS. 38A and 38B).

Next, N-type dopant impurities are introduced into the semiconductor substrate 10, for example, by the ion-implantation technique with the photoresist film 106 as a mask, thereby forming the N-type embedded diffusion layer 18. As for the N-type dopant impurities, P is employed, for example. Let us say that the acceleration energy is, for example, 600 to 700 keV, and the doze amount is, for example, $1\times10^{13}$ to $3\times10^{13}$ $cm^{-2}$ or so. In this way, the N-type embedded diffusion layer 18 is formed. The N-type embedded diffusion layer 18 and the N-type diffusion layer 16 are mutually connected. The N-type well 20 is formed by the N-type diffusion layer 16 and the N-type embedded diffusion layer 18.

Subsequently, the photoresist film 106 is peeled off, for example, by ashing.

The semiconductor device manufacturing method after this is the same as the semiconductor device manufacturing method according to the first embodiment described above with reference to FIGS. 9A to 16B, and accordingly, description thereof will be omitted.

Figure 39A:
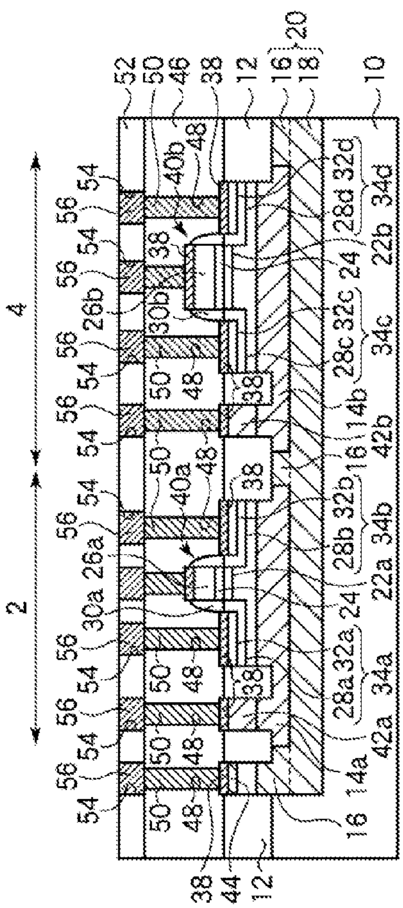
Figure 39B:
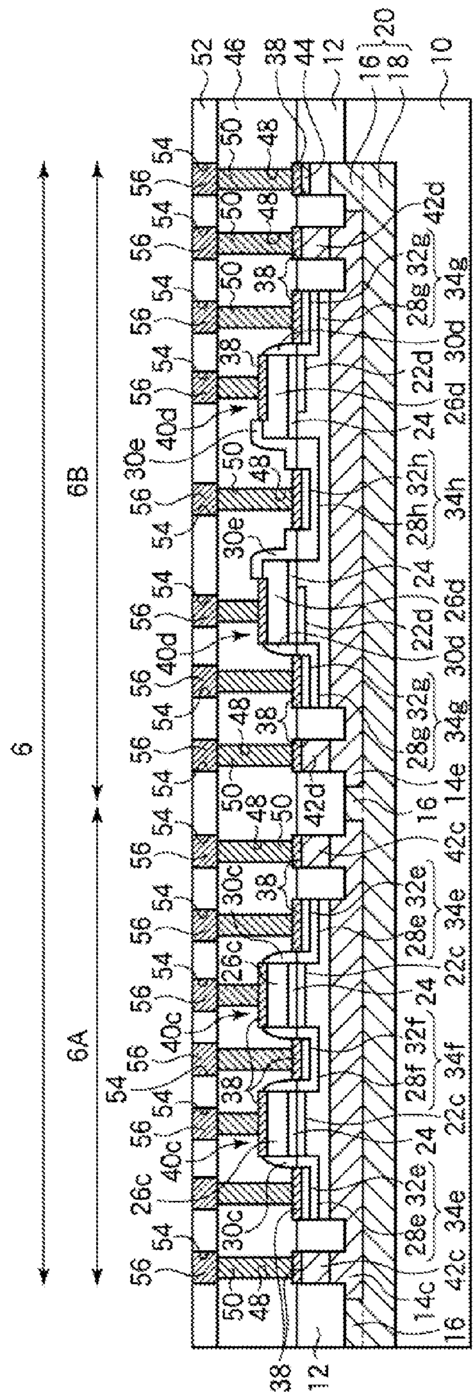

In this way, the semiconductor device according to the present embodiment is manufactured (see FIGS. 39A and 39B).

(Evaluation Results)

Next, the evaluation results of the semiconductor device according to the present embodiment will be described with reference to FIGS. 17, 19, and 40.

A short dashed line in FIG. 17 illustrates a case of a second embodiment, i.e., a case of the high-withstand-voltage transistor 40*e* of the semiconductor device according to the present embodiment.

As may be understood from FIG. 17, with the second embodiment, i.e., with the high-withstand-voltage transistor 40*e* of the semiconductor device according to the present embodiment, withstand voltage is sufficiently high as compared to the first and second comparative examples.

Therefore, it may be found that the high-withstand-voltage transistor 40*e* having sufficiently high withstand voltage is obtained according to the present embodiment.

The second embodiment in FIG. 19 illustrates a case of the high-withstand-voltage transistor 40*e* of the semiconductor device according to the present embodiment.

As may be understood from FIG. 19, with the second embodiment, withstand voltage is sufficiently high as compared to the first and second comparative examples. The withstand voltage of the high-withstand-voltage transistor 40*d* of the second embodiment is lower than the withstand voltage transistors 240*d* and 40*d* according to the reference example and first embodiment, but there is a sufficient margin as to the withstand voltage requested of the transistor on the final stage of the power amplifier circuit, and accordingly, there is no special problem.

Figure 40:
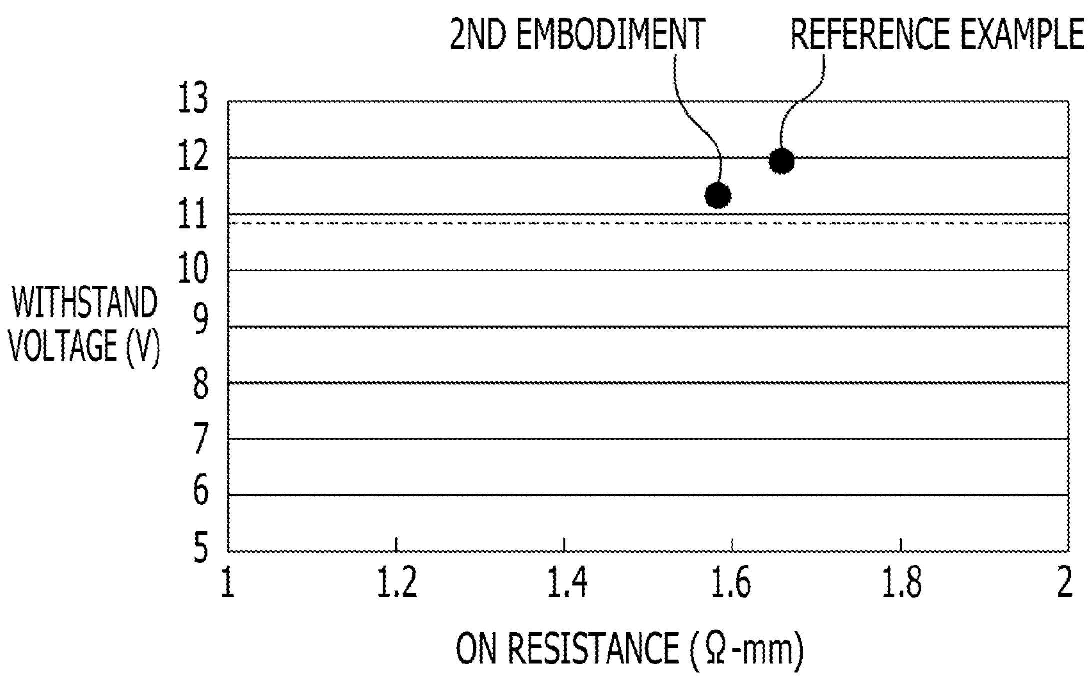
FIG. 40 is a graph illustrating the on-resistance and withstand voltage of a high-withstand-voltage transistor.

FIG. 40 is a graph illustrating the on-resistance and withstand voltage of a high-withstand-voltage transistor. The horizontal axis in FIG. 40 illustrates on-resistance, and the vertical axis in FIG. 40 illustrates withstand voltage. The source voltage was set to 0 V, the drain voltage was set to 0.1 V, and the gate voltage was set to 3.3 V at the time of measuring on-resistance. A short dashed line in FIG. 40 illustrates an example of withstand voltage required of the transistor on the final stage of the power amplifier circuit.

The second embodiment in FIG. 40 illustrates a case of the high-withstand-voltage transistor 40*e* of the semiconductor device according to the present embodiment. The reference example in FIG. 40 illustrates a case of the high-withstand-voltage transistor 240*d* of the semiconductor device according to the reference example illustrated in FIGS. 57A and 57B.

As may be understood from FIG. 40, with the second embodiment, on-resistance is lower than a case of the reference example.

Therefore, according to the present embodiment, it is found that the high-withstand-voltage transistor 40*e* having excellent electrical property wherein on-resistance is low is obtained.

Third Embodiment

A semiconductor device according to a third embodiment, and a manufacturing method thereof will be described with reference to FIGS. 41A to 43B. The same components as with the semiconductor devices and manufacturing methods thereof according to the first and second embodiments illustrated in FIGS. 1A to 40 are denoted with the same reference numerals, and description thereof will be omitted or simplified.

(Semiconductor Device)

Figure 41A:
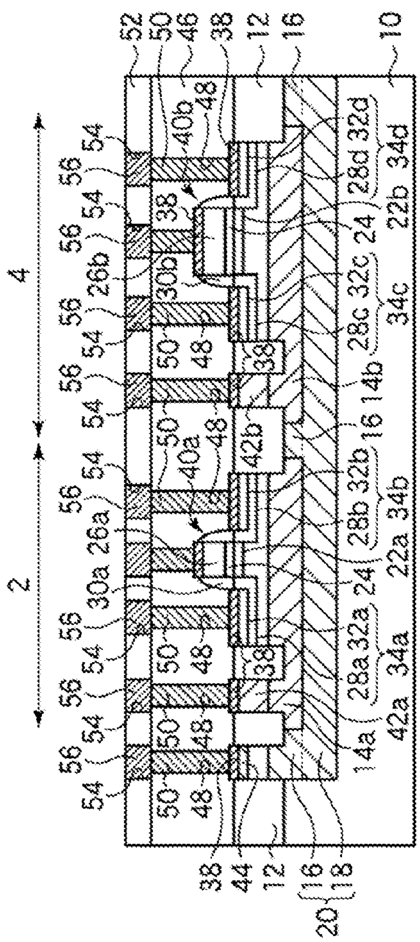
FIGS. 41A and 41B are cross-sectional views illustrating a semiconductor device according to a third embodiment.
Figure 41B:
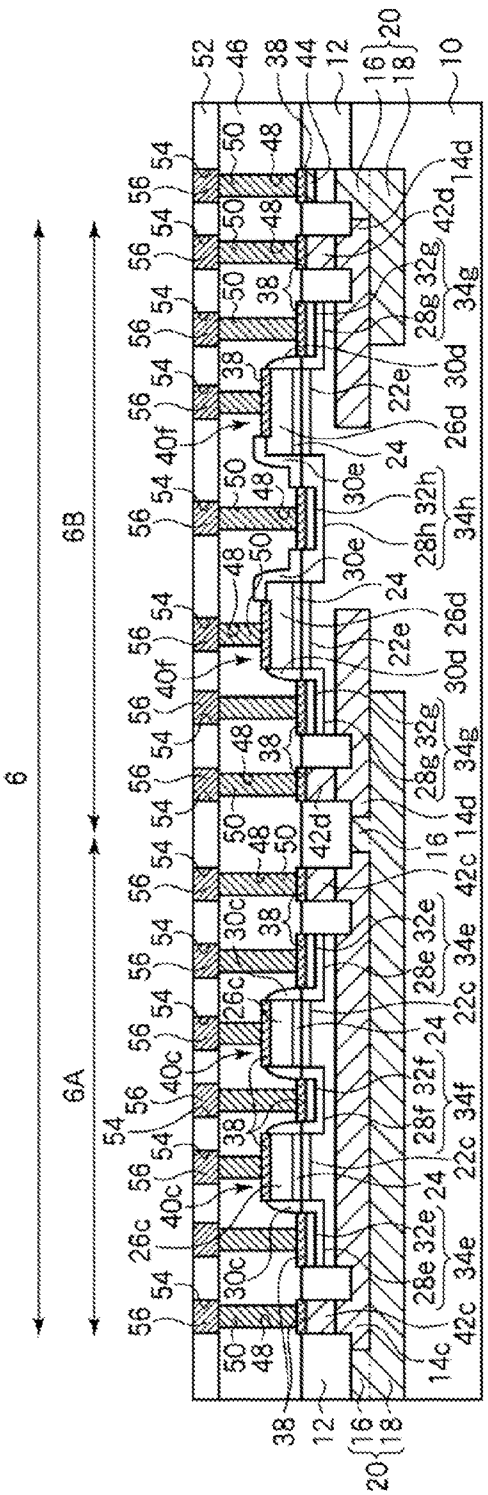

First, description will be made regarding the semiconductor device according to the present embodiment with reference to FIGS. 41A and 41B. FIGS. 41A and 41B are cross-sectional views illustrating the semiconductor device according to the present embodiment.

The semiconductor device according to the present embodiment has principal features in that the channel dope layer 22*e* of the high-withstand-voltage transistor formation region 6B is not separated from the region where the low-concentration drain region 28*h* is formed.

With the present embodiment, the channel dope layer 22*e* of the high-withstand-voltage transistor formation region 6B is formed by dopant impurities being introduced to the entire chip region. With the present embodiment, the channel dope layer 22*e* formed in the high-withstand-voltage transistor formation region 6B is not separated from the region where the low-concentration drain region 28*h* is formed. That is to say, the region where dopant impurities for forming the low-concentration drain region 28*h* are introduced, and the region where dopant impurities for forming the channel dope layer 22*e* are introduced, are not mutually separated. In other words, the low-concentration drain region 28*h* and the channel dope layer 22*e* are not mutually separated on design data or on reticle.

The N-type well 14*d* is formed so as to be separated from the region where the low-concentration drain region 28*h* is formed. Therefore, a moderate impurity profile is obtained between the N-type well 14*d* and the low-concentration drain region 28*h*.

Like the present embodiment, the channel dope layer 22*e* of the high-withstand-voltage transistor formation region 6B may not be separated from the region where the low-concentration drain region 28*h* is formed. The moderate impurity profile is obtained between the P-type well 14*e* and the low-concentration drain region 28*h*, and accordingly, with the present embodiment as well, a certain level of high withstand voltage may be secured.

(Semiconductor Device Manufacturing Method)

Figure 42A:
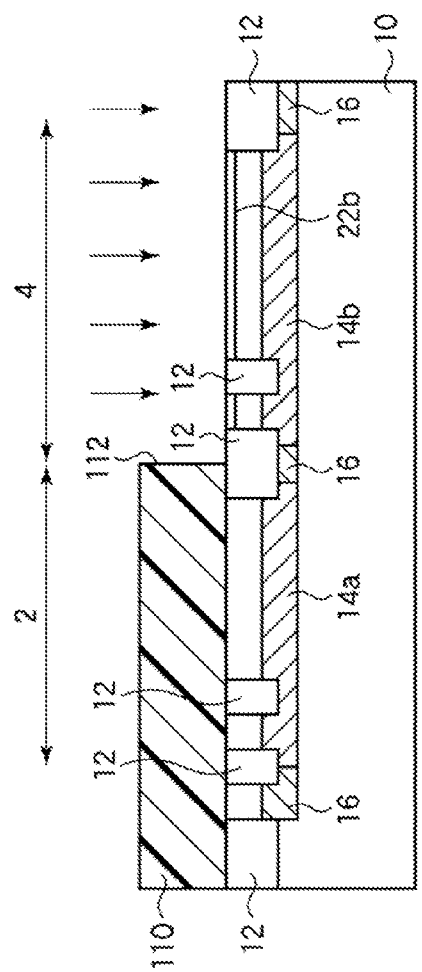
FIGS. 42A to 43B are process cross-sectional views illustrating a manufacturing method of the semiconductor device according to the third embodiment.
Figure 42B:
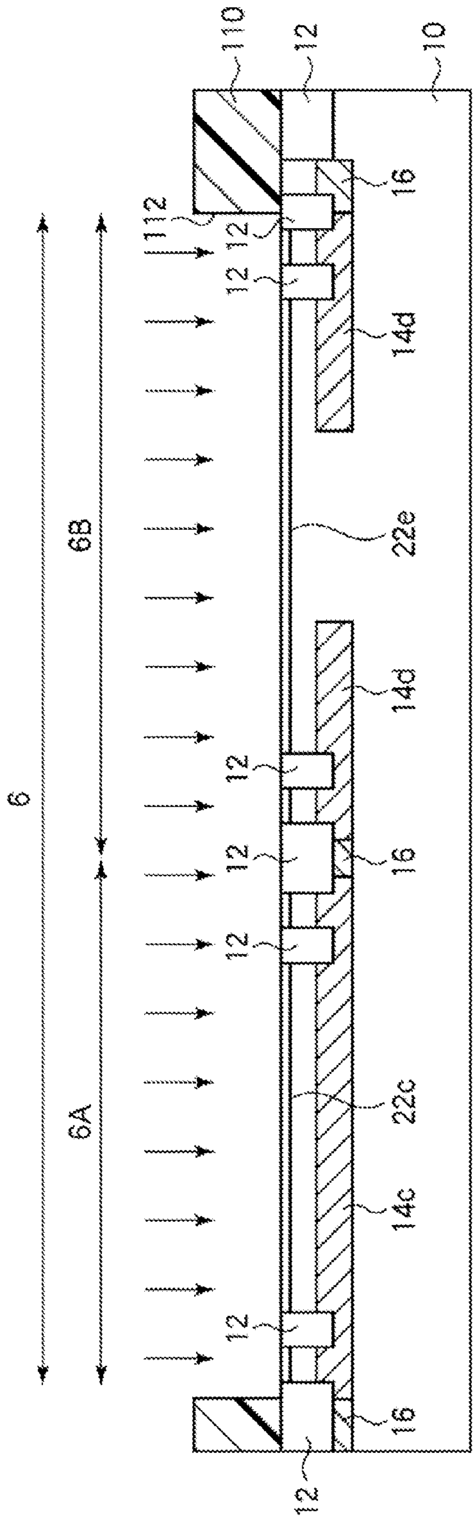
Figure 43A:
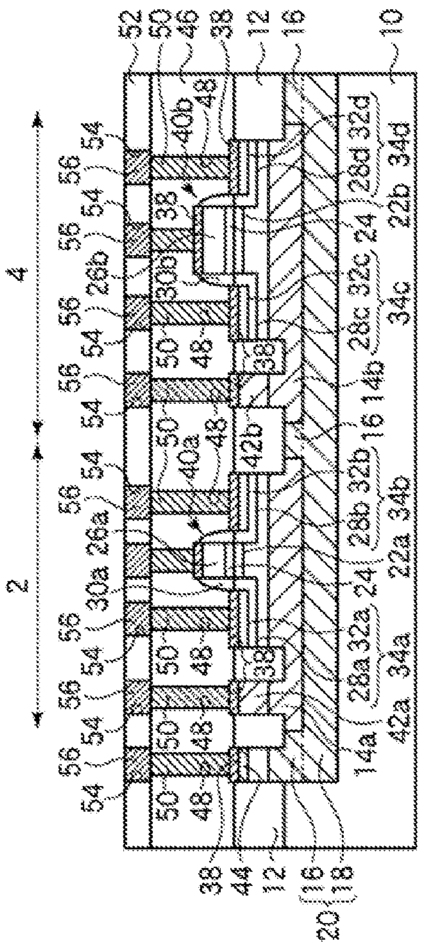
Figure 43B:
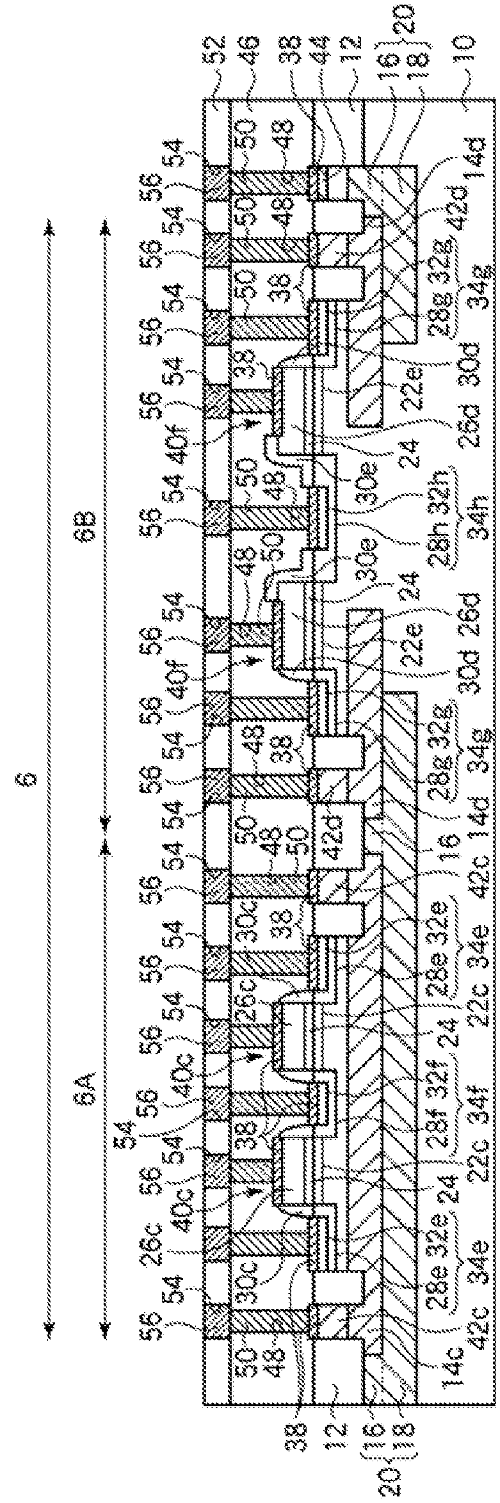

Next, a semiconductor device manufacturing method according to the present embodiment will be described with reference to FIGS. 42A and 42B, and FIGS. 43A and 43B. FIGS. 42 and 43 are process cross-sectional views illustrating the semiconductor device manufacturing method according to the present embodiment.

First, from the process wherein the chip separation region 12 is formed to the process wherein the N-type diffusion layer 16 is formed are the same with the semiconductor device manufacturing method according the first embodiment described above with reference to FIGS. 3A to 5B, and accordingly, description thereof will be omitted.

Next, a photoresist film 110 is formed on the entire surface, for example, by the spin coat method.

Next, the photoresist film 110 is subjected to patterning using the photolithographic technique. Thus, an opening portion 112 for forming the channel dope layers 22*b*, 22*c*, and 22*e* is formed on the photoresist film 110 (see FIGS. 42A and 42B). The channel dope layer 22*a* of the core transistor formation region 2 is separately formed, so the photoresist film 110 is formed so as to cover the core transistor formation region 2.

Next, P-type dopant impurities are introduced into the semiconductor substrate 10, for example, by the ion-implantation technique with the photoresist film 110 as a mask, thereby forming the channel dope layers 22*b*, 22*c*, and 22*e*. As for the P-type dopant impurities, B is employed, for example. Let us say that the acceleration energy is, for example, 30 to 40 keV, and the doze amount is, for example, $3\times10^{12}$ to $6\times10^{12}$ $cm^{-2}$ or so. In this way, the channel dope layers 22*b*, 22*c*, and 22*e* are formed. The channel dope layer 22*b* is formed in the entire chip region in the input/output transistor formation region 4. The channel dope layer 22*c* is formed in the entire chip region in the previous stage transistor formation region 6A. The channel dope layer 22*e* is formed in the entire chip region in the high-withstand-voltage transistor formation region 6B.

Subsequently, the photoresist film 110 is peeled off, for example, by ashing.

The semiconductor device manufacturing method after this is the same as the semiconductor device manufacturing method according to the first embodiment described above with reference to FIGS. 7A to 16B, and accordingly, description thereof will be omitted.

In this way, the semiconductor device according to the present embodiment is manufactured (see FIGS. 43A and 43B).

Modified Embodiments

Various modifications may be made regardless of the above embodiments.

For example, with the above embodiments, a case has been described as an example wherein the high-withstand-voltage transistors 40*d* to 40*f* are used for the final stage of the power amplifier circuit, but the locations where the high-withstand-voltage transistors **40*d* to 40*f* are used are not restricted to the final stage of the power amplifier circuit. The high-withstand-voltage transistors 40*d* to 40*f* may be used for a portion other than the final stage of the power amplifier circuit. Also, the above high-withstand-voltage transistors 40*d* to 40*f*** may be used for various circuits other than the power amplifier circuit.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that various changes, substitutions, and alterations could be made hereto without departing from the spirit and scope of the invention.

What is claimed is:

1. A semiconductor device manufacturing method comprising:

forming a channel dope layer having a first electric conductive-type inside of a semiconductor substrate, the channel dope layer being formed in a region except for a drain impurity region where dopant impurities for forming a low-concentration drain region are introduced, and the channel dope layer being separated from the drain impurity region;

forming a gate electrode on the semiconductor substrate via a gate insulating film;

forming a low-concentration source region inside of the semiconductor substrate on a first side of the gate electrode, and forming a low-concentration drain region in the drain impurity region of the semiconductor substrate on a second side of the gate electrode, by introducing second electric conductive dopant impurities inside of the semiconductor substrate with the gate electrode as a mask;

forming a first spacer on a side wall portion on the first side of the gate electrode, and forming a second spacer at least on a side wall portion on a second side of the gate electrode;

forming a high-concentration source region having higher impurity concentration than the low-concentration source region inside of the semiconductor substrate on the first side of the gate electrode so as to be separated from the gate electrode by a first distance, and forming a high-concentration drain region having higher impurity concentration than the low-concentration drain region inside of the semiconductor substrate on the second side of the gate electrode so as to be separated from the gate electrode by a second distance greater than the first distance, by introducing second electric conductive dopant impurities inside of the semiconductor substrate with the gate electrode, the first spacer, and the second spacer as masks; and forming a first well having a first electric conductive-type so as to be separated from the drain impurity region.

2. A semiconductor device manufacturing method comprising:

forming a first well having a first electric conductive-type inside of a semiconductor substrate, with the first well being formed in a region except for a drain impurity region where dopant impurities for forming a low-concentration drain region are introduced, and the first well being separated from the drain impurity region;

forming a channel dope layer having a first electric conductive-type inside of the semiconductor substrate;

forming a gate electrode on the semiconductor substrate via a gate insulating film;

forming a low-concentration source region inside of the semiconductor substrate on a first side of the gate electrode, and forming a low-concentration drain region in the drain impurity region of the semiconductor substrate on a second side of the gate electrode, by introducing second electric conductive dopant impurities inside of the semiconductor substrate with the gate electrode as a mask;

forming a first spacer on a side wall portion on the first side of the gate electrode, and forming a second spacer at least on a side wall portion on the second side of the gate electrode; and forming a high-concentration source region having higher impurity concentration than the low-concentration source region inside of the semiconductor substrate on the first side of the gate electrode so as to be separated from the side wall on the first side of the gate electrode by a first distance, and forming a high-concentration drain region having higher impurity concentration than the low-concentration drain region inside of the semiconductor substrate on the second side of the gate electrode so as to be separated from the side wall on the second side of the gate electrode by a second distance greater than the first distance, by introducing second electric conductive dopant impurities inside of the semiconductor substrate with the gate electrode as a mask.

3. The semiconductor device manufacturing method according to claim 2, further comprising:

forming a impurity layer having a second electric conductive-type which surrounds the first well; and embedding a second well having a second electric conductive-type connected to the impurity layer, on the lower side of the first well, which forms the second well so as to increase the distance between the drain impurity region and the second well so as to be greater than the distance between the drain impurity region and the first well.

4. A semiconductor device manufacturing method for forming a first transistor inside of a first region of a semiconductor substrate, and forming a second transistor having lower withstand voltage than the first transistor inside of a second region different from the first region of the semiconductor substrate, comprising:

forming a first channel dope layer having a first electric conductive-type inside of the first region, and also forming a second channel dope layer having a first electric conductive-type inside of the second region, with the first channel dope layer being formed in a region except for a drain impurity region where dopant impurities for forming a low-concentration drain region are introduced, and the first channel dope layer being formed so as to be separated from the drain impurity region;

forming a first gate electrode of the first transistor, and a second gate electrode of the second transistor on the semiconductor substrate via a gate insulating film;

forming a first low-concentration source region of the first transistor inside of the semiconductor substrate on a first side of the first gate electrode, forming a first low-concentration drain region of the first transistor in the drain impurity region of the semiconductor substrate on a second side of the first gate electrode so as to be separated from the drain impurity region, forming a second low-concentration source region of the second transistor inside of the semiconductor substrate on a first side of the second gate electrode, and forming a second low-concentration drain region of the second transistor inside of the semiconductor substrate on a second side of the second gate electrode, by introducing second electric conductive dopant impurities inside of the semiconductor substrate with the first gate electrode and the second gate electrode as masks;

forming a first spacer on a side wall portion on the first side of the first gate electrode, forming a second spacer at least on a side wall portion on the second side of the first gate electrode, forming a third spacer on a side wall portion on the first side of the second gate electrode, and forming a fourth spacer on a side wall portion on the second side of the second gate electrode; and forming a first high-concentration source region having higher impurity concentration than the first low-concentration source region inside of the semiconductor substrate on the first side of the first gate electrode so as to be separated from the first gate electrode by a first distance, forming a first high-concentration drain region having higher impurity concentration than the first low-concentration drain region inside of the semiconductor substrate on the second side of the first gate electrode so as to be separated from the first gate electrode with a second distance greater than the first distance, forming a second high-concentration source region having higher impurity concentration than the second low-concentration source region inside of the semiconductor substrate on the first side of the second gate electrode, and forming a second high-concentration drain region having higher impurity concentration than the second low-concentration drain region inside of the semiconductor substrate on the second side of the second gate electrode, by introducing second electric conductive dopant impurities inside of the semiconductor substrate with the first gate electrode, the second gate electrode, the first spacer, the second spacer, the third spacer, and the fourth spacer as masks.

5. The semiconductor device manufacturing method according to claim 4, further comprising:

forming a first well having a first electric conductive-type inside of the first region so as to be separated from the drain impurity region, and also forming a second well having a first electric conductive-type inside of the second region.

6. A semiconductor device manufacturing method for forming a first transistor inside of a first region of a semiconductor substrate, and forming a second transistor having lower withstand voltage than the first transistor inside of a second region different from the first region of the semiconductor substrate, comprising:

forming a first well having a first electric conductive-type inside of the first region, and also forming a second well having a first electric conductive-type inside of the second region, with the first well being formed in a region except for a drain impurity region where dopant impurities for forming a low-concentration drain region of the first transistor are introduced, and the first well being formed so as to be separated from the drain impurity region; forming a first channel dope layer having a first electric conductive-type inside of the first region, and also forming a second channel dope layer having a first electric conductive-type inside of the second region;

forming a first gate electrode of the first transistor, and a second gate electrode of the second transistor on the semiconductor substrate via a gate insulating film;

forming a first low-concentration source region of the first transistor inside of the semiconductor substrate on a first side of the first gate electrode, forming the first low-concentration drain region of the first transistor in the drain impurity region of the semiconductor substrate on a second side of the first gate electrode, forming a second low-concentration source region of the second transistor inside of the semiconductor substrate on a first side of the second gate electrode, and forming a second low-concentration drain region of the second transistor inside of the semiconductor substrate on a second side of the second gate electrode, by introducing second electric conductive dopant impurities inside of the semiconductor substrate with the first gate electrode and the second gate electrode as masks;

forming a first spacer on a side wall portion on the first side of the first gate electrode, forming a second spacer on at least a side wall portion on the second side of the first gate electrode, forming a third spacer on a side wall portion on the first side of the second gate electrode, and forming a fourth spacer on a side wall portion on the second side of the second gate electrode; and forming a first high-concentration source region having higher impurity concentration than the first low-concentration source region inside of the semiconductor substrate on the first side of the first gate electrode so as to be separated from the first gate electrode by a first distance, forming a first high-concentration drain region having higher impurity concentration than the first low-concentration drain region, inside of the semiconductor substrate on the second side of the first gate electrode so as to be separated from the first gate electrode by a second distance greater than the first distance, forming a second high-concentration source region having higher impurity concentration than the second low-concentration source region inside of the semiconductor substrate on the first side of the second gate electrode, and forming a second high-concentration drain region having higher impurity concentration than the second low-concentration drain region inside of the semiconductor substrate on the second side of the second gate electrode, by introducing second electric conductive dopant impurities inside of the semiconductor substrate with the first gate electrode, the second gate electrode, the first spacer, the second spacer, the third spacer, and the fourth spacer as masks.

7. The semiconductor device manufacturing method according to claim 6, further comprising:

forming a impurity layer having a second electric conductive-type which surrounds at least the first well; and embedding a second well having a second electric conductive-type connected to the impurity layer in the lower side of the first well, which forms the second well so that the distance between the drain impurity region and the second well is greater than the distance between the drain impurity region and the first well.

* * * * *